US012564037B2

(12) United States Patent
Liaw

(10) Patent No.: US 12,564,037 B2
(45) Date of Patent: *Feb. 24, 2026

(54) SEMICONDUCTOR DEVICE WITH SOURCE/DRAIN VIA

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/640,636

(22) Filed: Apr. 19, 2024

(65) Prior Publication Data

US 2024/0266282 A1 Aug. 8, 2024

Related U.S. Application Data

(63) Continuation of application No. 17/865,962, filed on Jul. 15, 2022, now Pat. No. 12,021,023, which is a
(Continued)

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76816* (2013.01); *H01L 21/76829* (2013.01);
(Continued)

(58) Field of Classification Search
CPC .......... H01L 23/5228; H01L 21/76805; H01L 23/5226; H01L 27/10885
See application file for complete search history.

(56) References Cited

U.S. PATENT DOCUMENTS 5,739,579 A * 4/1998 Chiang ............... H01L 23/5329
257/E21.585
5,939,788 A * 8/1999 McTeer ............. H01L 23/53238
438/149
(Continued)

*Primary Examiner* — Jacob Y Choi
*Assistant Examiner* — Neil R Prasad
(74) *Attorney, Agent, or Firm* — HAYNES AND BOONE, LLP

(57) ABSTRACT

A device includes semiconductor channel region, source/drain regions, a source/drain contact, a first dielectric layer, a second dielectric layer, and a tungsten via. The source/drain regions are at opposite sides of the semiconductor channel region. The source/drain contact is over one of the source/drain regions. The first dielectric layer is over the source/drain contact. The second dielectric layer is over the first dielectric layer. The tungsten via extends through the first and second dielectric layers to the source/drain contact. The tungsten via includes a first portion over the source/drain contact and a second portion over the first portion. The second portion includes a tungsten sidewall laterally offset from a tungsten sidewall of the first portion, and a tungsten surface interfacing a top surface of the first dielectric layer.

20 Claims, 41 Drawing Sheets

Related U.S. Application Data continuation of application No. 17/725,091, filed on Apr. 20, 2022, now Pat. No. 11,996,360, which is a continuation of application No. 16/940,822, filed on Jul. 28, 2020, now Pat. No. 11,393,750, which is a continuation of application No. 16/101,566, filed on Aug. 13, 2018, now Pat. No. 10,763,208.

(51) Int. Cl.

| | | |
|---|---|---|
| *H01L 23/532* | (2006.01) | |
| *H10D 84/85* | (2025.01) | |
| *H01L 21/311* | (2006.01) | |

(52) U.S. Cl.

CPC ..... *H01L 23/53295* (2013.01); *H10D 84/853* (2025.01); *H01L 21/31111* (2013.01); *H01L 21/31116* (2013.01)

(56) References Cited

U.S. PATENT DOCUMENTS

| | | | | |
|---|---|---|---|---|
| 6,025,259 | A * | 2/2000 | Yu | H01L 21/76813 |
| | | | | 438/668 |
| 6,475,810 | B1 * | 11/2002 | Zhou | H01L 21/31116 |
| | | | | 257/E21.252 |
| 11,996,360 | B2 * | 5/2024 | Liaw | H01L 29/7848 |
| 12,021,023 | B2 * | 6/2024 | Liaw | H01L 23/5226 |
| 2006/0273385 | A1 | 12/2006 | Hshieh | |
| 2007/0085209 | A1 | 4/2007 | Lu et al. | |
| 2013/0141963 | A1 | 6/2013 | Liaw | |
| 2013/0256678 | A1 | 10/2013 | Nishikawa | |
| 2014/0124901 | A1 | 5/2014 | Lee et al. | |
| 2015/0035023 | A1 | 2/2015 | Kim et al. | |
| 2015/0262909 | A1 | 9/2015 | Chen | |
| 2016/0066427 | A1 | 3/2016 | Chiang et al. | |
| 2016/0329343 | A1 | 11/2016 | Pachamuthu et al. | |
| 2016/0365271 | A1 | 12/2016 | Chang et al. | |
| 2017/0330790 | A1 | 11/2017 | He et al. | |
| 2017/0352666 | A1 | 12/2017 | Ahn et al. | |

* cited by examiner

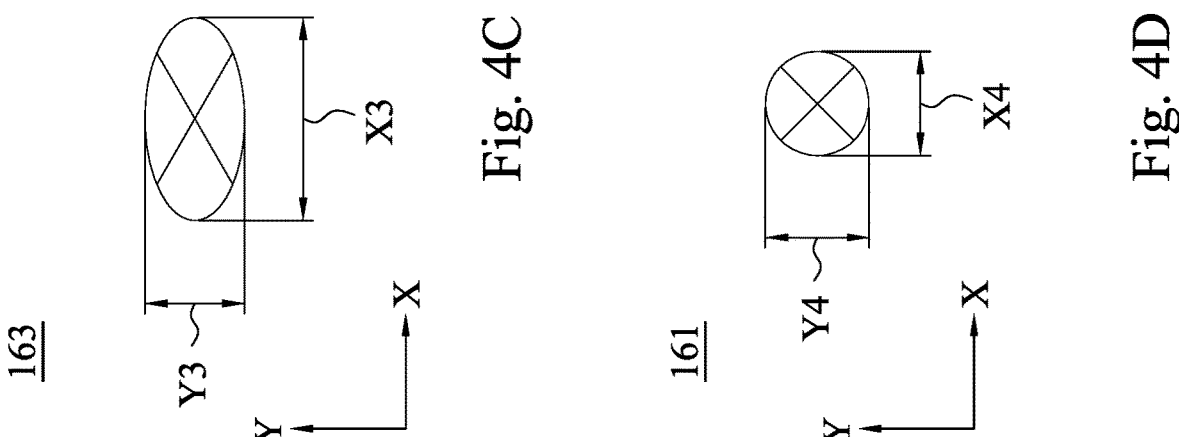
Fig. 4C
Fig. 4D
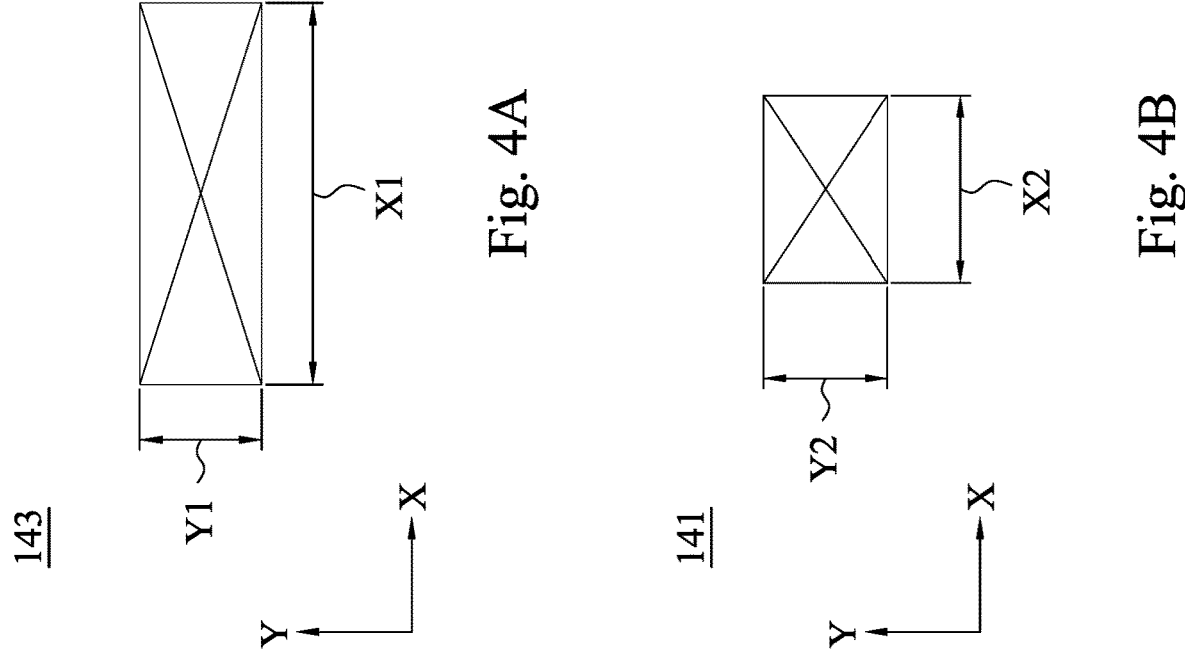
Fig. 4A
Fig. 4B

A-A

100A

SEMICONDUCTOR DEVICE WITH SOURCE/DRAIN VIA

PRIORITY CLAIM AND CROSS-REFERENCE

The present application is a Continuation Application of the U.S. application Ser. No. 17/865,962, filed Jul. 15, 2022, which is a Continuation Application of the U.S. application Ser. No. 17/725,091, filed Apr. 20, 2022, which is a Continuation Application of the U.S. application Ser. No. 16/940,822, filed Jul. 28, 2020, now U.S. Pat. No. 11,393, 750, issued Jul. 19, 2022, which is a Continuation Application of the U.S. application Ser. No. 16/101,566, filed Aug. 13, 2018, now U.S. Pat. No. 10,763,208, issued Sep. 1, 2020, all of which are herein incorporated by reference in their entirety.

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. In some applications in an IC chip, a plurality of SRAM devices are implemented based on different design criteria. For example, at least one SRAM device of the plurality of SRAM devices is designed to have faster data access than all other SRAM device(s) of the plurality of SRAM devices; and at least one SRAM device of the plurality of SRAM devices is designed to occupy less area per stored bit than all other SRAM device(s) of the plurality of SRAM devices.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIGS. 4A, 4B, 4C, and 4D illustrate top views of shape of source/drain contacts and vias in a layout respectively according to some embodiments of the present disclosure.

DETAILED DESCRIPTION

Figure 1:
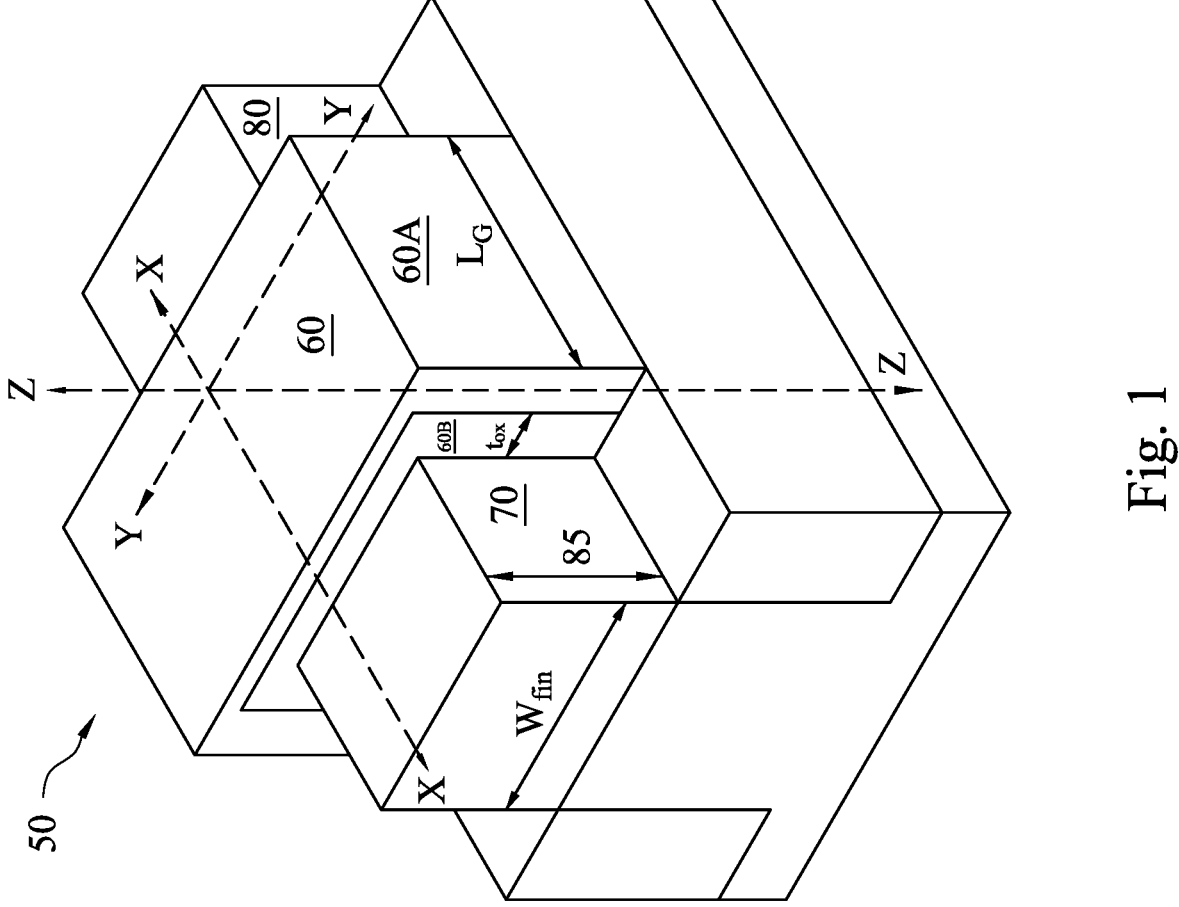
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Embodiments of the present disclosure provide a via structure to achieve low connection resistance, which may be employed in any of a variety of device types. For example, embodiments of the present disclosure may be used to form the via structure suitable for use in planar bulk metal-oxide-semiconductor field-effect transistors (MOS-FETs), multi-gate transistors (planar or vertical) such as Fin Field-effect transistor (FinFET) devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or the like. In addition, embodiments disclosed herein may be employed in the formation of P-type and/or N-type devices.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

LG denotes a length (or width, depending on the perspective) of the gate 60 measured in the X-direction. The gate 60 may include a gate electrode 60A and a gate dielectric layer 60B. The gate dielectric layer 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 2:
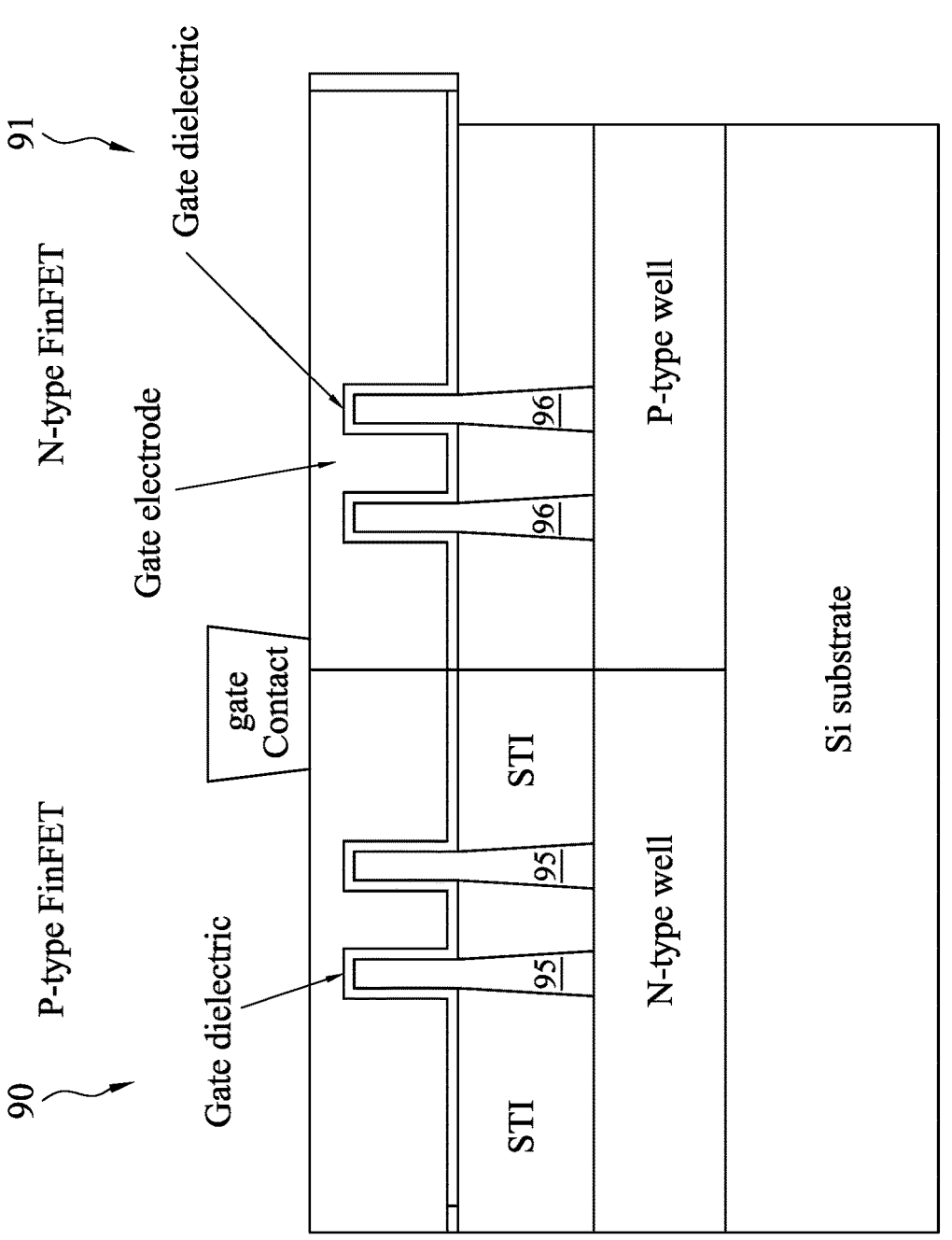
FIG. 2 illustrates a cross-sectional view of FinFET transistors in a CMOS configuration.

FIG. 2 illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have challenges, such as lack of optimization for forming isolation structures that isolate neighboring circuit cells. For example, one or more dielectric dummy gates are formed in fins to isolate neighboring circuit cells. Fabrication of the dielectric dummy gates includes etching openings in the fins, followed by filling the openings with a dielectric material. However, if the fins are formed of silicon germanium (SiGe) material for strain effect enhancement, etching openings in the fins would break up the fins, which in turn would lead to reduced strain. For another example, one or more isolation gates are formed to wrap around fins and applied with a controlled voltage (e.g., Vdd or Vdd) to isolate neighboring circuit cells. Fabrication of the isolation gates is free from etching openings in the fins and thus would prevent the strain loss. However, fabrication of the isolation gates involves an additional gate cut process (e.g. breaking up a continuous isolation gate across the P-type and N-type wells using an etching process) to separate the isolation gate in the N-well from the isolation gate in the P-well, which in turn would frustrate scaling down capability of FinFETs. Therefore, the present disclosure describes one or more FinFET cells that have reduced strain loss in SiGe fins and are fabricated without the additional gate cut process to separate the isolation gate in the N-well from the isolation gate in the P-well, as discussed in more detail below.

Figure 3:
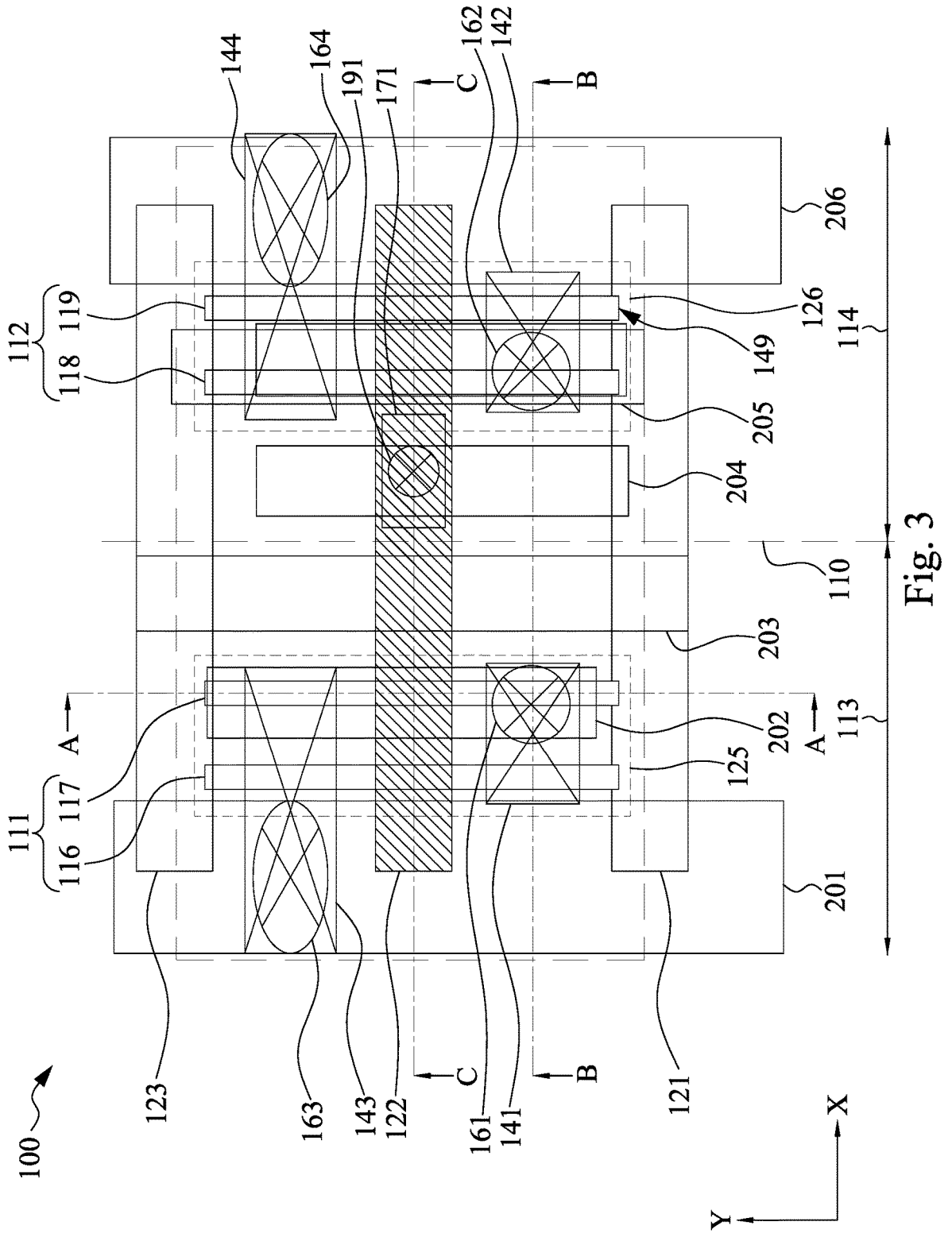
FIG. 3 illustrates a layout of a semiconductor device having a plurality of Fin Field-effect Transistors (FinFETs) in accordance with some embodiments.

FIG. 3 illustrates a top view of a layout according to some embodiments of the present disclosure. A layout 100 includes a plurality of well regions 113 and 114, a plurality of active area regions 111 and 112, a gate electrode 122, a plurality of dummy gate 121 and 123, a gate contact 171, a gate via 191, a plurality of source/drain contacts 141, 142, 143, and 144, a plurality of source/drain vias 161, 162, 163, and 164, and a plurality of conductive lines 201, 202, 203, 204, 205, and 206.

As shown in FIG. 1, the N-type well region 113 and the P-type well region 114 are on opposite side of an imaginary line 110 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 1, the N-type well region 113 is a region for forming p-channel metal-oxide semiconductor (PMOS) transistors, and the P-type well region 114 is a region for forming n-channel metal-oxide semiconductor (NMOS) transistors. The described conductivity of the well regions 113 and 114 herein is an example. Other arrangements are within the scope of various embodiments.

The active area regions 111 and 112 extend along a first direction of the layout 100, e.g., the Y direction. In some embodiments, the active area regions 111 and 112 are also referred to as oxide-definition (OD) regions. Example materials of the active area regions 111 and 112 include, but are not limited to, semiconductor materials doped with various types of p-dopants and/or n-dopants. In some embodiments, the active area regions 111 and 112 include dopants of the same type. In some embodiments, one of the active area regions 111 and 112 includes dopants of a type different from a type of dopants of another one of the active area regions 111 and 112. The active area regions 111 and 112 are isolated from each other by one or more isolation structures as described herein. The active area regions 111 and 112 are within corresponding well regions. For example, the active area region 111 is within a well region 113 which is an n-well region in some embodiments, and the active area region 112 is within a well region 114 which is a p-well region in some embodiments.

Each of the active area regions 111 and 112 includes one or more semiconductor fins to form FinFETs. For example, the active area region 111 includes two semiconductor fins 116 and 117, and the active area region 112 includes two semiconductor fins 118 and 119. The semiconductor fins 116, 117, 118, and 119 are isolated from each other by one or more isolation structures as described herein. Other numbers of fins in each of the active area regions 111 and 112 are within the scope of various embodiments. The described FinFET configuration is an example. Other arrangements are within the scope of various embodiments. For example, in some embodiments, the active area regions 111 and 112 do not include fins and are configured for forming planar MOSFET transistors. In the present embodiments, the semiconductor fins 116 and 117 are formed of a silicon germanium (SiGe) material (for strain effect enhancement), but the semiconductor fins 118 and 119 are formed of a non-germanium-containing semiconductor material, for example Si. The semiconductor fins 116, 117, 118, and 119 are each continuous to prevent strain loss.

The gate electrode 122 extends along a second direction of the layout 100, e.g., the X direction, across the active area regions 111 and 112. The portions of the gate electrode 122 located within the N-type well region 113 form the gates of PMOSFETs, and the portions of the gate electrode 122 located within the P-type well region 114 forms the gates of the NMOSFETs. The gate electrode 122 wraps around the semiconductor fins 116, 117, 118, and 119 in the manner described above with reference to FIG. 1. For example, the gate electrode 122 in the N-type well region 113 wraps around the semiconductor fins 116 and 117, and the gate electrode 122 in the P-type well region 114 wraps around the semiconductor fins 118 and 119.

Example materials of the gate electrode 122 include, but are not limited to, polysilicon and metal. Other materials are within the scope of various embodiments. The gate electrode 122 and the corresponding active area regions 111 and 112 form one or more transistors in the layout 100. For example, in the example configuration in FIG. 1, a transistor 125 is formed by the gate electrode 122 and the active area region 111. One of a drain or a source (referred to herein as "source/drain") of the transistor 125 is defined by a region of the active area region 111 on one side (e.g., the upper side in FIG. 1) of the gate electrode 122. The other source/drain of the transistor 125 is defined by another region of the active area region 111 on the opposite side (e.g., the lower side in FIG. 1) of the gate electrode 122. For another example, a further transistor 126 is formed by the gate electrode 122 and the active area region 112. The gate electrode 122 is coupled to other circuitry of the semiconductor device by corresponding gate contacts. For example, the gate contact 171 is configured on the gate electrode 122 for coupling the gate electrode 122 to other circuitry. The gate contact 171 is between the source/drain contacts 142 and 144. Example materials of the gate contact 171 include Ti, TiN, TaN, Co, Ru, Pt, W, Al, Cu, or any combinations thereof.

The gate via 191 overlaps the gate contact 171. The gate via 191 is between the source/drain vias 162 and 164 and is connected to the conductive line 204. The gate via 191 and the source/drain vias 162 and 164 are arranged in an altering manner in sequence. In some embodiments, the gate via 191 may be in a circle shape viewed from above the gate via 191. For example, the length ratio of longer side to short side of at least one of the gate via 191 is in a range from about 0.8 to about 1.2.

The dielectric dummy gates 121 and 123 extend along the second direction of the layout 100, e.g., the X direction, across the active area regions 111 and 112. The active area regions 111 and 112 terminate in the dielectric dummy gates 121 and 123. In some embodiments, upper ends of the semiconductor fins 116, 117, 118, and 119 overlap the dielectric dummy gate 123, lower ends of the semiconductor fins 116, 117, 118, and 119 overlap an upper region of the dielectric dummy gate 121. For example, the fin 119 terminates at a lower end 149 thereof in the dielectric dummy gate 121. On the other words, in the example configuration in FIG. 3, the ends of the semiconductor fins 116, 117, 118, and 119 are under the dielectric dummy gates 121 and 123. The portions of the dielectric dummy gates 121 and 123 are located within the N-type well region 113, and the portions of the dielectric dummy gates 121 and 123 are located within the P-type well region 114.

According to the various aspects of the present disclosure, a plurality of dielectric dummy gates 121 and 123 are between abutted circuit cells to provide electrical isolation between the abutted circuit cells. The dielectric dummy gates 121 and 123 are each located on a border between two abutted circuit cells. The dielectric dummy gates 121 and 123 include one or more dielectric materials. Example dielectric materials of the dummy gates 121 and 123 include, but are not limited to, oxide-based dielectric materials, such as $SiO_2$, SiON, $Si_3N_4$, SiOCN, the like, or combinations thereof.

Due at least in part to the locations of the dielectric dummy gates 121 and 123 (e.g., the dielectric dummy gates 121 and 123 being located on the circuit cell borders and overlapping ends of the semiconductor fins), the dielectric dummy gates 121 and 123 provide electrical isolation between the abutted circuit cells for the NMOSFET.

The source/drain contacts (providing electrical connectivity to the source/drains of the FinFETs) are also illustrated in the layout of FIG. 3, some examples of which are labeled herein as source contacts 143 and 144 and drain contacts 141 and 142. It is understood that silicide layers may be formed on the source/drain regions, and the source/drain contacts may be formed on the silicide layers. The source contacts 143 and 144 and drain contacts 141 and 142 overlap the corresponding active area regions 111 and 112. For example, the source contact 143 and drain contact 141 overlap the active area region 111, and the source contact 144 and drain contact 143 overlap the active area region 112. The source/drain contacts 141, 142, 143, and 144 are configured to electrically couple the underlying source/drains of the corresponding transistors with each other or with other circuitry of the semiconductor device. Example materials of the source/drain contacts 141, 142, 143, and 144 include Ti, TiN, TaN, Co, Ru, Pt, W, Al, Cu, or any combinations thereof. In some embodiments, the source contacts 143 and 144 are in a slot shape and may be also refer to as in a line shape. For example, the length ratio of longer side to short side of at least one of the source contact 143 and 144 is larger than 3. In some embodiments, the source/drain contacts 141, 142, 143, and 144 are made of material that is substantially the same as the gate contact 171. Alternatively, in some embodiments, the source/drain contacts 141, 142, 143, and 144 are made of a material that is different from the gate contact 171.

In some embodiments, the source vias 163 and 164 overlap and are in contact with the source/drain contacts 143 and 144 respectively and are connected to the conductive line 201 and 206 respectively. The drain vias 161 and 162 overlap and are in contact with the drain contacts 141 and 142 respectively and are connected to the conductive line 202 and 205 respectively. The source vias 163 and 164 are in a slot shape and may be also refer to as in a line shape. For example, the length ratio of longer side to short side of at least one of the source vias 163 and 164 is greater than about 2. In some embodiments, the drain vias 161 and 162 may be in a circle shape viewed from above the drain vias 161 and 162. For example, the length ratio of longer side to short side of at least one of the drain vias 161 and 162 is in a range from about 0.8 to about 1.2. One of the source vias 163 and 164 has a top surface with an area which is larger than that one of the drain vias 161 and 162. One of the source/drain vias 161, 162, 163, and 164 has a top surface with an area which is larger than that of the gate via 191. In other words, one of the source vias 163 and 164 has a first vertical projection projected on the substrate, one of the drain vias 161 and 162 has a second vertical projection projected on the substrate, and a first area of the first vertical projection is larger than a second area of the second vertical projection. In addition, the gate via 191 has a third vertical projection projected on the substrate, and first and second areas of the first and second vertical projections are larger than a third area of the third vertical projection.

In some embodiments, the layout 100 is represented by a plurality of masks generated by one or more processors and/or stored in one or more non-transitory computer-readable media. Other formats for representing the layout 100 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout 100 is presented by at least one first mask corresponding to the active area regions 111 and 112, at least one second mask corresponding to the gate electrodes 122 and the dielectric dummy gates 121 and 123.

The conductive lines 201, 202, 203, 204, 205, and 206 extend along the Y direction of the layout 100. In some embodiments, the conductive lines 201, 202, 203, 204, 205, and 206 are in a first interconnection layer of the layout 100, such as a first metal layer. The conductive lines 201, 202, 205, and 206 overlap and are electrically connected to the source/drain contacts 143, 141, 142, and 144 through the source/drain vias 163, 161, 162, and 164 respectively. The conductive line 204 is electrically connected to the gate contact 171 through the gate via 191 and is between adjacent two of the conductive lines 203 and 205 which are without passing through the gate via 191. Furthermore, the source/drain contact in line shape can help on lithography patterning and improve a critical dimension (CD) thereof. Example materials of the conductive lines 201, 202, 205, and 206 include Cu, Co, Ru, W, Ti, TaN, TiN, or any combinations thereof.

In some embodiments, the layouts as shown in FIG. 3 are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

FIGS. 4A, 4B, 4C, and 4D illustrate top views of shape of the source contact 143, the drain contact 141, the source via 163, and drain via 161 in the layout 100 respectively according to some embodiments of the present disclosure. The details regarding the components in FIGS. 4A-4D may thus be found in the discussion of the embodiment shown in FIG. 1.

In FIG. 4A, a physical source contact 143 is formed in at least one of a dielectric (ILD) layer (such as ILD layers 175 and 176 shown in FIGS. 5A-7B) based on the shape of the source contact 143 in the layout 100. The source contact 143 defines a longitudinal length X1 extended in a direction parallel to the X direction and defines a transversal length Y1 extended in a direction parallel to the Y direction, in which the longitudinal length X1 runs in the direction of a long axis of the source contact 143, the transversal length Y1 runs in the direction of a short axis of the source contact 143, and the longitudinal length X1 is substantially orthogonal to the transversal length Y1. In some embodiments, the shape of the physical source contact 143 is in a shape of an ellipse viewed from above the source contact 143.

In some embodiments, the longitudinal length X1 is parallel to a longitudinal direction of the gate electrode 122. In some embodiments, the direction where the source contact 143 extended is intersected with a lengthwise direction of the semiconductor fin 116, 117, 118, and 119. In some embodiments, the source contact 143 may be in a slot shape viewed from above the source contact 143 and also may be referred to as in a line shape and in a rectangular shape. The longitudinal length X1 is larger than 3 times of the transversal length Y1. In some embodiments, the longitudinal length X1 is larger than 4 times of the transversal length Y1 in the semiconductor device 100A.

In FIG. 4B, a physical drain contact 141 is formed in the dielectric layers 175 and 176 (shown in FIGS. 5A and 6A) based on the shape of the drain contact 141 in the layout 100. The drain contact 141 defines a longitudinal length X2 extended in a direction parallel to the X direction and defines a transversal length Y2 extended in a direction parallel to the Y direction, in which the longitudinal length X2 is substantially orthogonal to the transversal length Y2. In some embodiments, the longitudinal length X2 is parallel to a longitudinal direction of the gate electrode 122. In some embodiments, the longitudinal length X1 is less than 3 times of the transversal length Y2 in the semiconductor device 100A viewed from above the drain contact 141. In some embodiments, the longitudinal length X1 is less than 4 times of the transversal length Y2 in the semiconductor device 100A viewed from above the drain contact 141.

In FIG. 4C, a physical source via 163 is formed in the dielectric layers 175 and 176 (shown in FIGS. 5A and 6A) based on the shape of the source via 163 in the layout 100. The source via 163 defines a longitudinal length X3 extended in a direction parallel to the X direction and defines a transversal length Y3 extended in a direction parallel to the Y direction, in which the longitudinal length X3 runs in the direction of a long axis of the source via 163, the transversal length Y3 runs in the direction of a short axis of the source via 163, and the longitudinal length X3 is substantially orthogonal to the transversal length Y3. In some embodiments, the shape of the source via 163 in the layout 100 is in a shape of an ellipse. In some embodiments, the shape of the physical source via 163 in the dielectric layers 175 and 176 is in a shape of an ellipse viewed from above the source via 163.

In some embodiments, the longitudinal length X3 is parallel to a longitudinal direction of the gate electrode 122. In some embodiments, the direction where the source via 163 extended is intersected with a lengthwise direction of the semiconductor fin 116, 117, 118, and 119. In some embodiments, the source via 163 may be in a slot shape viewed from above the source via 163 and also may be referred to as in a line shape or in a rectangular shape. The longitudinal length X3 is larger than twice of the transversal length Y3.

In FIG. 4D, a physical drain via 161 is formed in the dielectric layers 175 and 176 (shown in FIGS. 5A and 6A) based on the shape of the drain via 161 in the layout 100. The drain via 161 defines a longitudinal length X4 extended in a direction parallel to the X direction and defines a transversal length Y4 extended in a direction parallel to the Y direction viewed from above the drain via 161, in which the longitudinal length X4 is substantially orthogonal to the transversal length Y4. In some embodiments, the longitudinal length X4 is parallel to a longitudinal direction of the gate electrode 122. A ratio of the longitudinal length X4 to the transversal length Y4 is in a range from about 0.8 to about 1.2.

Figure 5A:
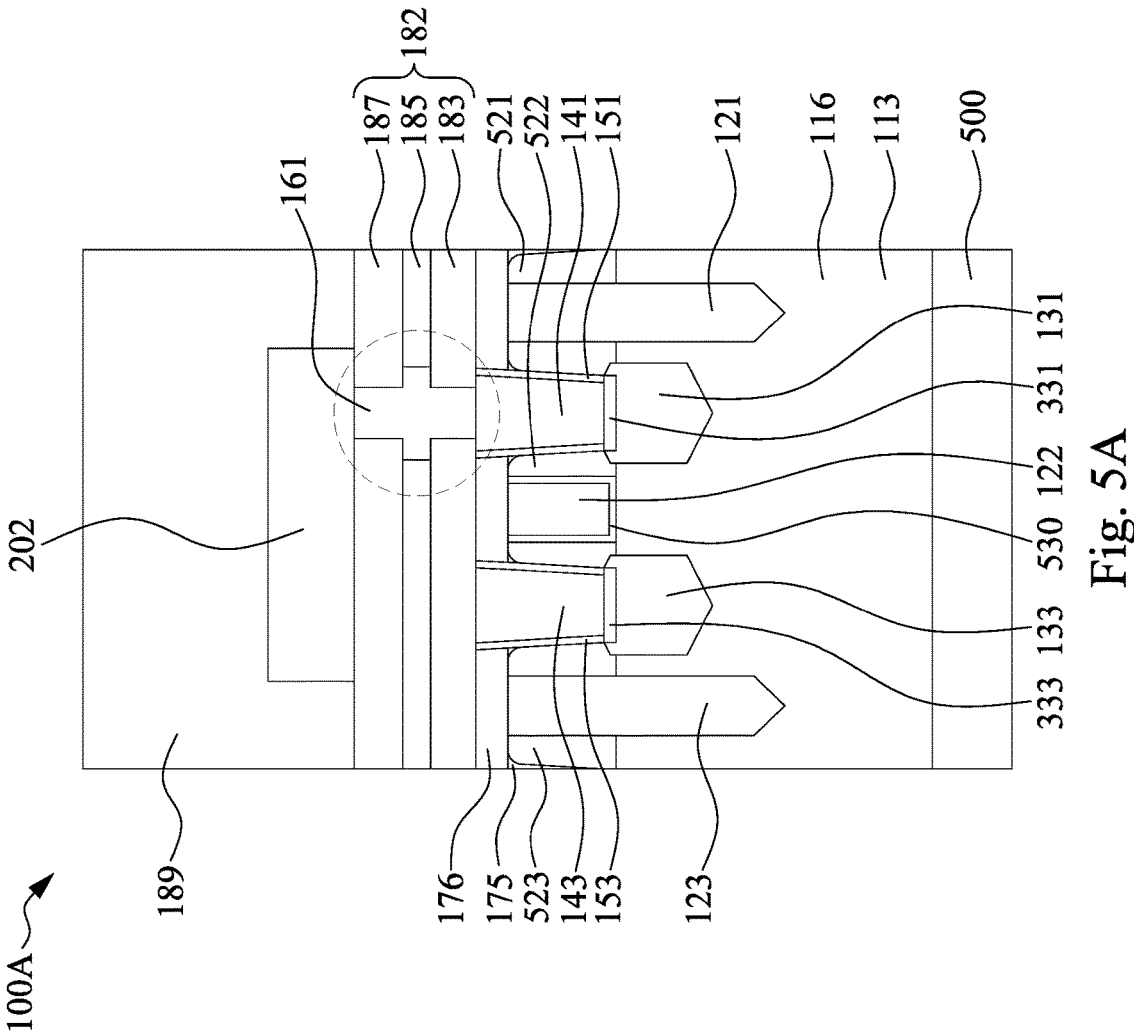
FIG. 5A illustrate a cross-sectional view along line A-A in FIG. 3.
Figure 5B:
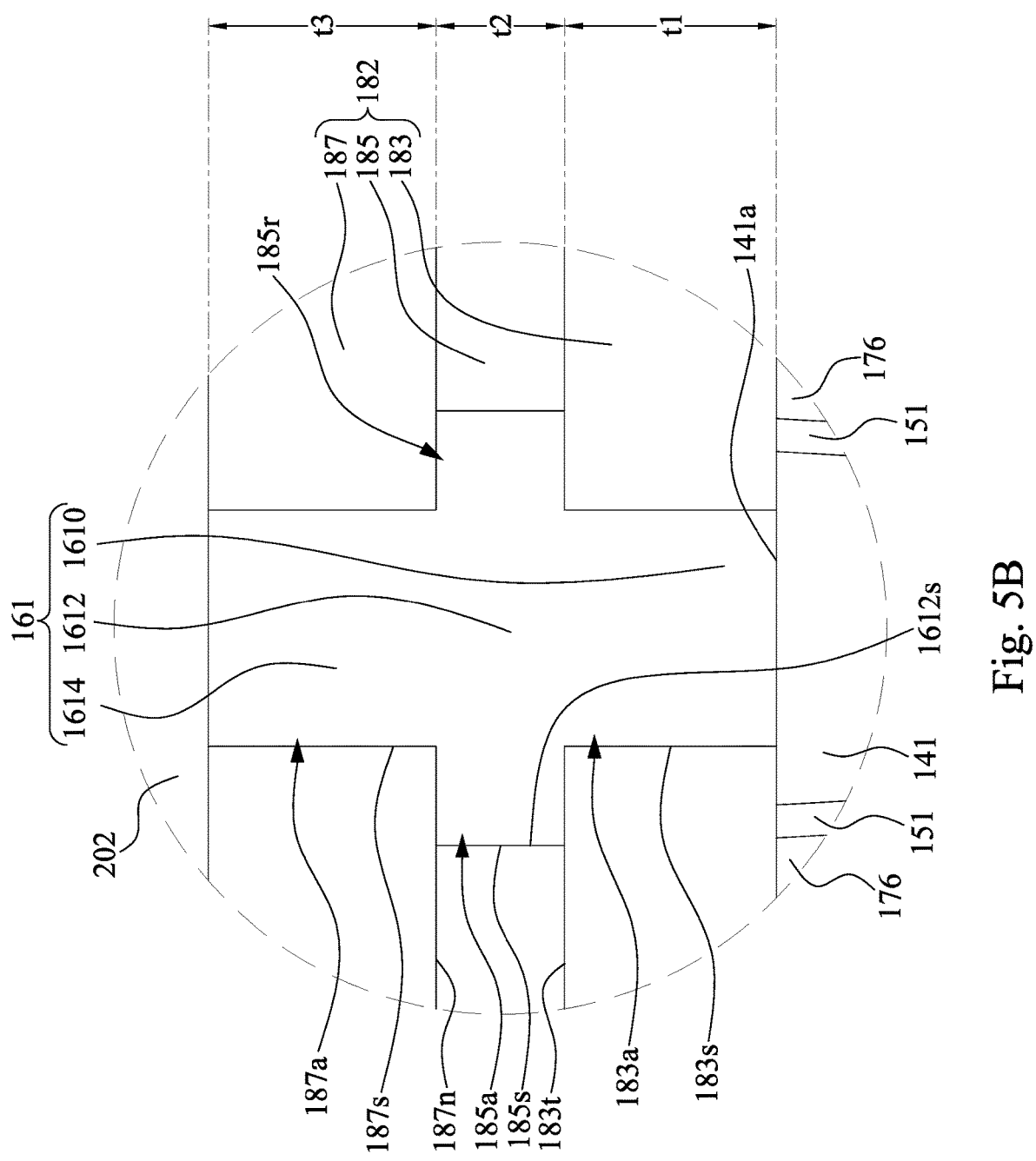
FIG. 5B illustrate a local enlarged view according to FIG. 5A.
Figure 6A:
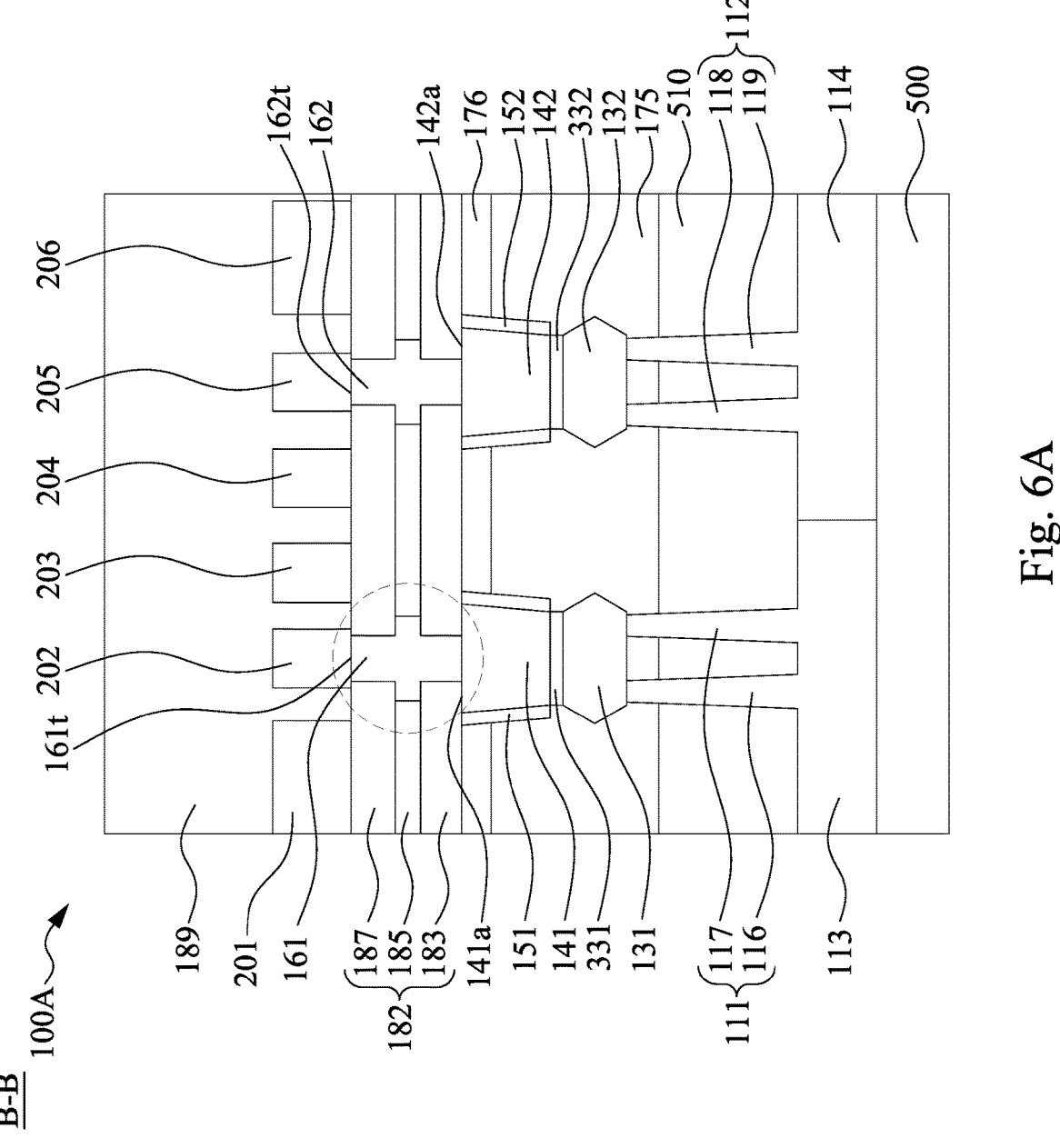
FIG. 6A illustrate a cross-sectional view along line B-B in FIG. 3.
Figure 6B:
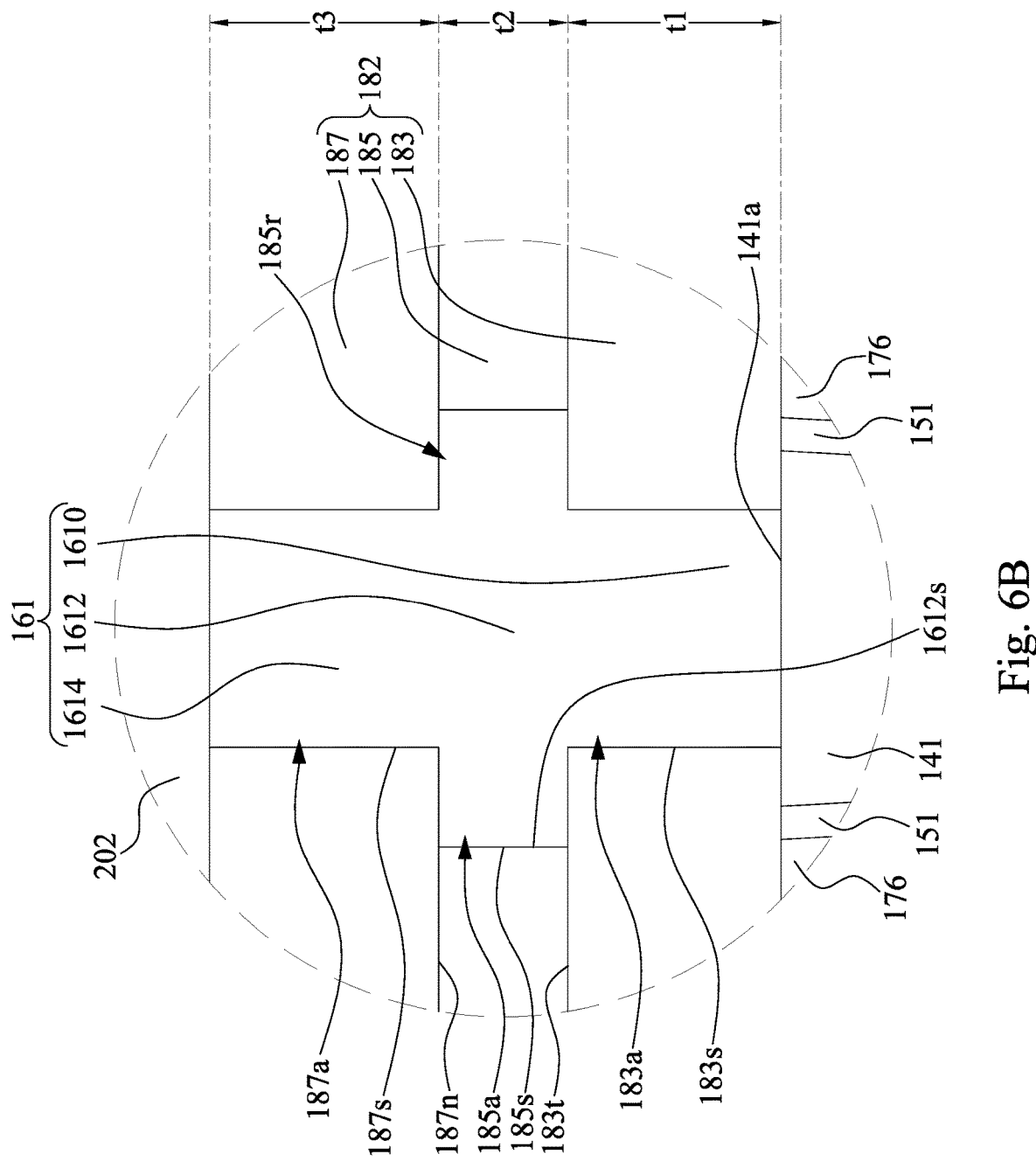
FIG. 6B illustrate a local enlarged view according to FIG. 6A.
Figure 7A:
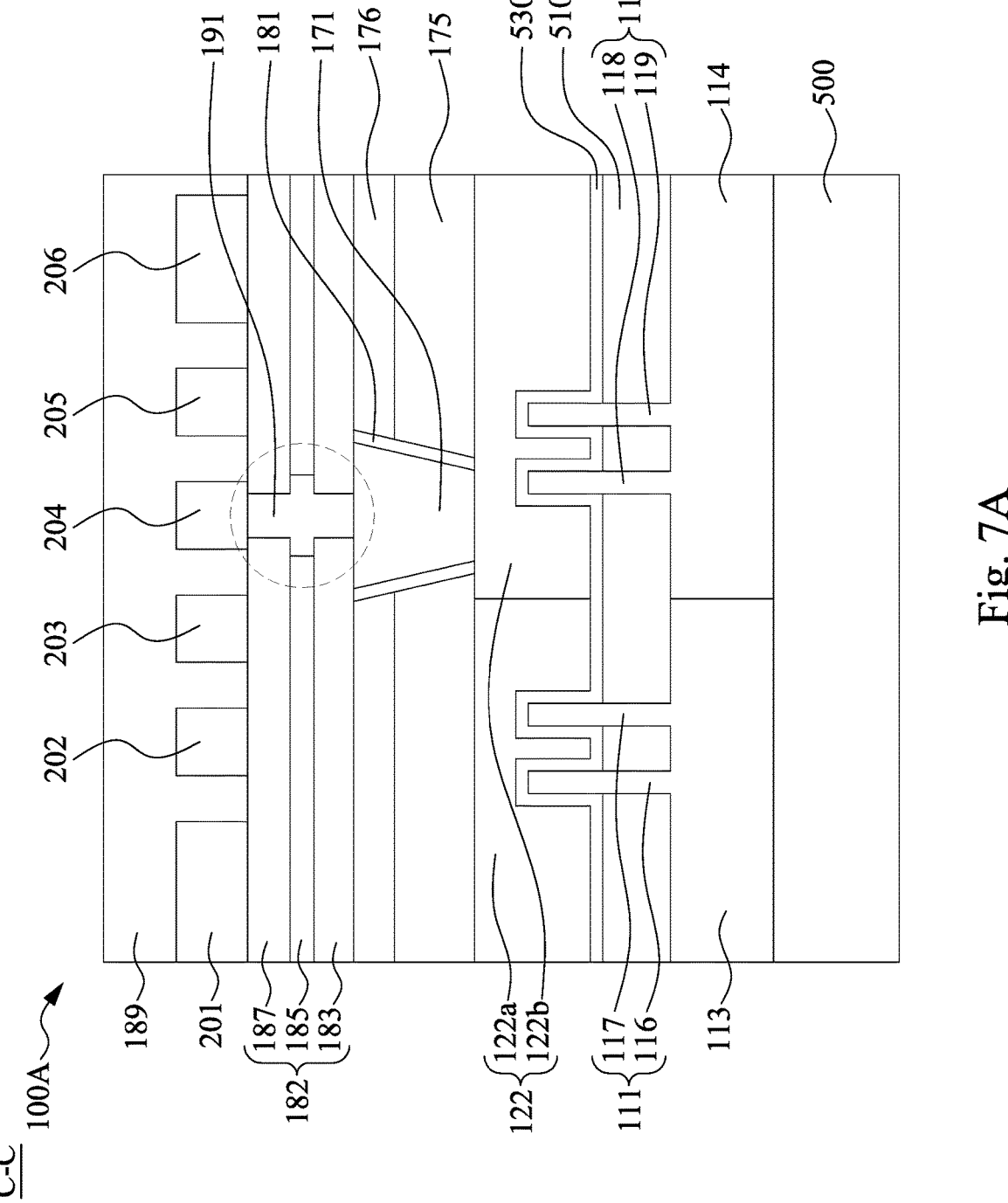
FIG. 7A illustrate a cross-sectional view along line C-C in FIG. 3.
Figure 7B:
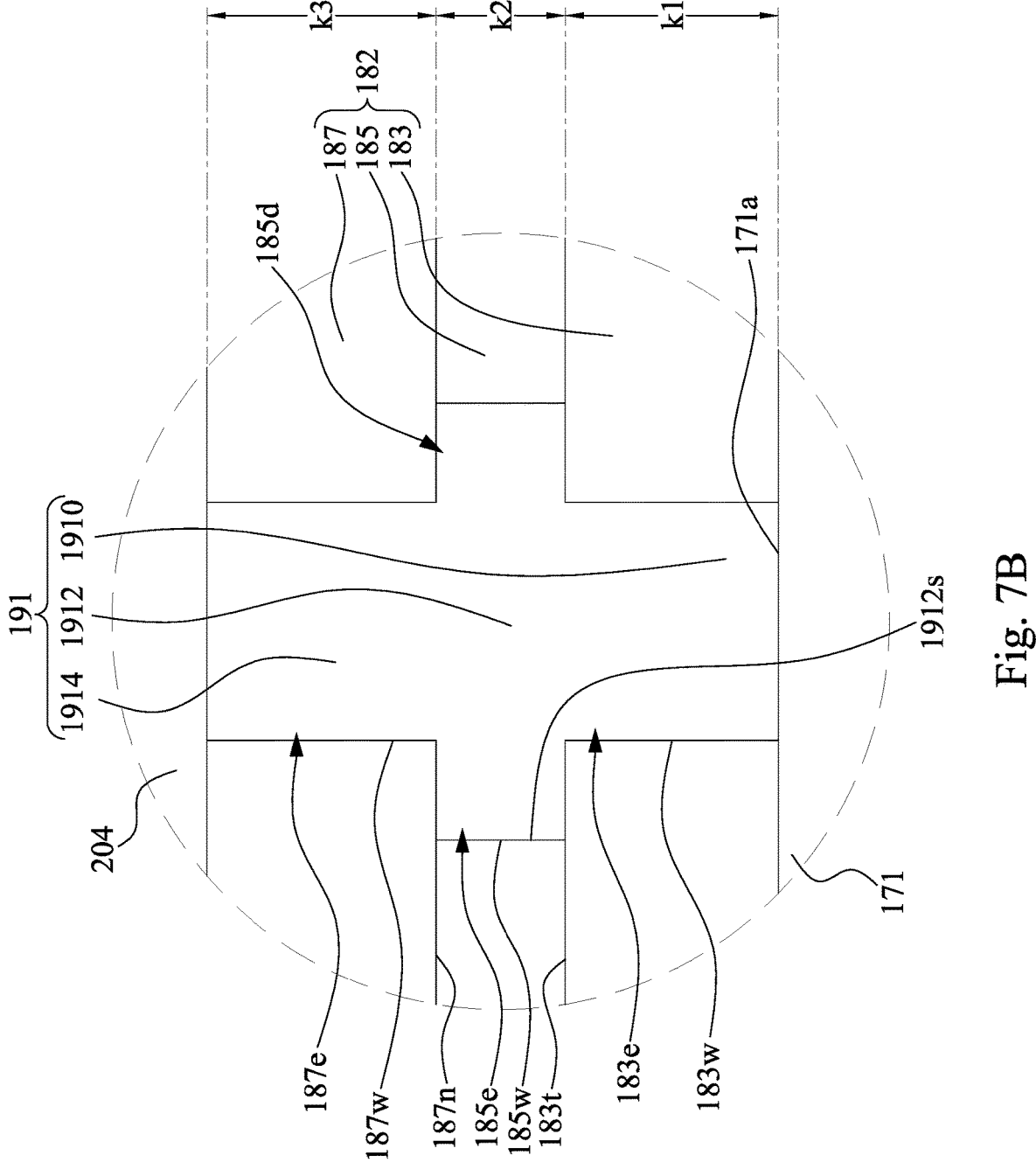
FIG. 7B illustrate a local enlarged view according to FIG. 7A.

Reference is made to FIGS. 5A, 6A, and 7A. FIGS. 5A, 6A, and 7A illustrate different cross-sectional views of a semiconductor device 100A having the layout as illustrated in FIG. 3. The cross-sectional view in FIG. 5A is taken along line A-A shown in FIG. 3, the cross-sectional view in FIG. 6A is taken along line B-B shown in FIG. 3, and the cross-sectional view in FIG. 7A is taken along line C-C shown in FIG. 3. FIGS. 5B, 6B, and 7B are local enlarged views according to FIGS. 5A, 6A, and 7A, respectively. The configuration of the semiconductor device 100A is described herein with respect to FIGS. 5A-7B.

As illustrated in FIGS. 5A, 6A, and 7A, the semiconductor device 100A includes a substrate 500 over which various elements of the semiconductor device 100A are formed. The elements of the semiconductor device 100A include active elements and/or passive elements. In some embodiments, active elements are arranged in a circuit region of the semiconductor device 100A to provide one or more functions and/or operations intended to be performed by the semiconductor device 100A. In some embodiments, the semiconductor device 100A further includes a non-circuit region, e.g., a sealing region, that extends around and protects the circuit region. Examples of active elements include, but are not limited to, transistors and diodes. Examples of transistors are described herein with respect to FIG. 3. Examples of passive elements include, but are not limited to, capacitors, inductors, fuses, and resistors. A plurality of metal layers and via layers are alternatingly formed over the substrate 500 to electrically couple the elements of the semiconductor device 100A with each other and/or with external devices. The substrate 500 includes, in some embodiments, a silicon substrate. The substrate 500 includes, in some embodiments, silicon germanium (SiGe), Gallium arsenic, P-type doped Si, N-type doped Si, or suitable semiconductor materials. For example, semiconductor materials including group III, group IV, and group V elements are within the scope of various embodiments. In some embodiments, the substrate 500 further includes one or more other features, such as various doped regions, a buried layer, and/or an epitaxy (epi) layer. In some embodiments, the substrate 500 includes a semiconductor on insulator, such as silicon on insulator (SOI). In some embodiments, the substrate 500 includes a doped epi layer, a gradient semiconductor layer, and/or a semiconductor layer overlying another semiconductor layer of a different type such as a silicon layer on a silicon germanium layer.

The semiconductor device 100A further includes one or more well regions over the substrate 500. In the example configuration in FIGS. 5A, 6A, and 7A, the N-type well region 113 and P-type well region 114 are over the substrate 500, as described with respect to FIG. 3.

The semiconductor device 100A further includes an isolation structure 510 shown in FIG. 7A over and around the N-type well region 113 and P-type well region 114. The isolation structure 510 electrically isolates various elements of the semiconductor device 100A from each other. For example, the isolation structure 510 electrically isolates the semiconductor fins 116 and 117 in the N-type well region 113 from the semiconductor fins 118 and 119 in the P-type well region 114. In the cross-section in FIG. 7A, the isolation structure 510 has a thickness less than the semiconductor fins (e.g. semiconductor fins 116-119). In some embodiments, the isolation structure 510 includes one or more shallow trench isolation (STI) regions. Example materials of the STI regions include, but are not limited to, silicon oxide, silicon nitride, silicon oxynitride, fluoride-doped silicate, and/or any other low k dielectric materials.

In the example configuration in FIGS. 5A and 7A, the semiconductor device 100A further includes the gate electrode 122, the dielectric dummy gates 121 and 123, and corresponding spacers 521, 522, and 523 over the isolation structure 510 and the N-type well region 113 and the P-type well region 114. Other arrangements are within the scope of various embodiments. For example, in one or more embodiments, the gate electrodes 122 and/or the dielectric dummy gates 121 and 123, and/or one of the corresponding spacers 521, 522, and 523 are partially embedded in the isolation structure 510.

In the N-type well region 113, the gate electrode 122 and the dielectric dummy gates 121 and 123 straddle the semiconductor fins 116 and 117. To electrically isolate the gate electrode 122 from the underlying semiconductor fins 116 and 117, a gate dielectric layer 530 is arranged under and around the gate electrode 122. In the P-type well region 114, the gate electrode 122 and the dielectric dummy gates 121 and 123 straddle the semiconductor fins 118 and 119. To electrically isolate the gate electrode 122 from the corresponding semiconductor fins 118 and 119, the gate dielectric layer 530 are further under and around the gate electrodes 122 in the P-type well region 114. The spacer 522 is on opposite sides of the corresponding gate dielectric layers 530.

Example materials of the gate dielectric layers 530 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In some embodiments, a gate dielectric layer includes multi-layer structure of, for example, $SiO_2$ with a high-k dielectric, or SiON with a high-k dielectric. Example materials of the spacers 521, 522, and 523 include, but are not limited to, silicon oxide, silicon nitride, and silicon oxy-nitride.

In some embodiments, the gate electrodes 122 include one or more conductive layers and/or materials. In the example configuration in FIGS. 5A and 7A, the gate electrode 122 wraps over the semiconductor fins 116-119, and includes a first conductive gate material 122a over the N-type well region 113 and a second conductive gate material 122b over the P-type well region 114. In some embodiments, the conductive gate materials 122a and 122b include the same conductive material. In some embodiments, the conductive gate materials 122a and 122b include different conductive materials. In some embodiments, the conductive material or materials of at least one of the conductive gate materials 122a and 122b is/are selected in accordance with the type of device or transistor. For example, each of the conductive gate materials 122a and 122b includes a conductive work function layer and a contact layer over the conductive work function layer.

In some embodiments, the work function layer is configured to have a work function in a range from 4 eV to 5 eV. In some embodiments, the first conductive gate material 122a includes a P-type work function metal (P-metal) for forming the PMOSFET over the N-type well region 113. Example P-metals include, but are not limited to, TiN, TaN, a carbon-doped metal nitride such as TaCN. In some embodiments, the second conductive gate material 122b includes an N-type work function metal (N-metal) for forming the NMOSFET over the P-type well region 114. Example N-metals include, but are not limited to, Ta, TiAl, and TiAlN. Other work function materials are within the scope of various embodiments. For example, in one or more embodiments, the work function layer includes doped conducting oxide materials, TaAl, TiSi, NiSi, PtSi, suitable Ti containing work function materials, suitable Ta containing work function materials, suitable Al containing work function materials, and suitable W containing work function materials.

In some embodiments, the contact layer over the conductive work function layer is configured to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

In some embodiments, the work function layer, the contact layer and the gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In some embodiments, the gate stack structure includes a Si3N4/metals/high-K dielectric structure in which the metals are selected from the group consisting of Al/refractory metals, W/refractory metals, Cu/refractory metals, silicide, and combinations thereof.

In the example configuration in FIGS. 5A and 7A, the gate electrode 122 extends continuously from the N-type well region 113 into the P-type well region 114, and the first conductive gate material 122a is in contact with the second conductive gate material 122b. Other arrangements are within the scope of various embodiments. For example, in some embodiments, the gate dielectric layer 530 is interposed between and electrically isolates the first conductive gate material 122a and the second conductive gate material 122b. In some embodiments where the conductive gate materials 122a and 122b include the same conductive material.

In the example configuration of FIG. 5A, the spacers 521 and 523 are in contact with opposite sides of the corresponding dielectric dummy gates 121 and 123. The dielectric dummy gates 121 and 123 are in contact with the corresponding semiconductor fins 116-119. For example, the dielectric dummy gate 121 have opposite sidewalls respectively in contact with the semiconductor fins 116-119 and one STI region, and the dielectric dummy gate 123 have opposite sidewalls respectively in contact with the semiconductor fins 116-119 and another STI region. The dielectric dummy gates 121 and 123 have top surfaces substantially flush with the gate electrode 122 due to, e.g., a planarization process during manufacture.

In the semiconductor device 100A, a source 133 shown in FIG. 5A is respectively in contact with the source contact plugs 143, and drains 131 and 132 are respectively in contact with the drain contact plugs 141 and 142. The source 131 and drain 133 are arranged between corresponding adjacent gate electrode 122 and dielectric dummy gates 121 and 123. In one or more embodiments, portions of the semiconductor fins 116-119 between the adjacent spacers are recessed to form source/drain cavities having bottom surfaces lower than the top surface of the semiconductor fins 116-119. After the formation of the source/drain cavities, the source 133 and the drains 131 and 132 are produced by epitaxially growing a strained material in the source/drain cavities. In some embodiments, the lattice constant of the strained material is different from the lattice constant of the semiconductor fins. Thus, channel regions of the transistors are strained or stressed to enhance carrier mobility of the transistors.

For example, for a PMOSFET, the strained material is configured to apply a compressive stress to enhance hole mobility in the at least one source or drain region of the PMOSFET. For an NMOSFET, the strained material is configured to apply a tensile stress to enhance electron mobility in the at least one source or drain region of the PMOSFETs. Examples of the strained material include, but are not limited to, SiGe, SiGeC, SiC, GeSn, SiGeSn, SiP, SiCP and other suitable materials. In some embodiments, the strained material for a PMOS device includes SiGe, SiGeC, Ge, Si, or a combination thereof. In some embodiments, the strained material for an NMOSFET includes SiC, SiP, SiCP, Si, or a combination thereof. In the example configuration in FIGS. 5A-6B, top surfaces of the strained material in the sources and drains extend upward above the top surfaces of the semiconductor fins 116-119. Other arrangements are within the scope of various embodiments. For example, in some embodiments, top surfaces of the strained material in the sources and drains are lower than the top surfaces of the semiconductor fins 116-119.

In some embodiments, the epitaxial growth of the sources and drains is facilitated or improved in a fully dense gate environment. Such an environment is achievable when dielectric dummy gates are arranged alongside gate electrodes so as to promote epitaxial growth of the sources and drains between gate electrodes and adjacent dielectric dummy gates. For example, in the example configuration in FIG. 5A, the presence of the dielectric dummy gate 121 facilitates epitaxial growth of the source 133 between the dielectric dummy gate 121 and the gate electrode 122. As a result, circuit density and/or performance improvements are achievable in one or more embodiments.

In the semiconductor device 100A, for the sake of simplicity, the source/drain contact in the ILD layers 175 and 176 of the semiconductor device 100A are designated by the same reference numerals of the corresponding source/drain contact in the layout 100. The source contacts 143 and 144 and drain contacts 141 and 142 in FIG. 3 can be referred to as contact plugs and are shown in FIGS. 5A and 6A with a label "CO." The contact plugs 141-144 are arranged in between corresponding adjacent spacers 521-523. In the example configuration in FIGS. 5A and 6A, the top surfaces of the contact plugs 141-144 are flush with each other due to, e.g., a planarization process during manufacture. Other arrangements are within the scope of various embodiments. In the semiconductor device 100A, the source/drain contact 141, 142, 143, and 144 are in contact with corresponding source/drains. In some embodiments, example materials of the source/drain contact 141, 142, 143, and 144 include, but are not limited to, tungsten (W), Cobalt (Co), Ruthenium (Ru), or combinations thereof.

In the example configuration in FIG. 5A, the fin 116 includes the source 133 and the drain 131 which are in contact with the corresponding drain contact 141 and source contact 143. In the example configuration in FIGS. 5A and 6A, boundaries of one or more of the drain contacts 141 and 142 and source contact 143 are surrounded by drain contact barrier layers 151 and 152 and a source contact barrier layer 153 respectively and are spaced from boundaries of the gate spacers 521, 522, and 523. In some embodiments, example materials of the source/drain contact barrier layers include, but are not limited to, Ti, TiN, or combinations thereof. In some embodiment, as shown in FIG. 5A, a silicide 331 is disposed between the drain 131 and the drain contact 141, and a silicide 333 is disposed between the source 133 and the source contact 143. In some embodiment, as shown in FIG. 5A, a silicide 332 is disposed between the drain 332 and the source/drain contact 144.

In the semiconductor device 100A, for the sake of simplicity, the gate contact in the ILD layers 175 and 176 of the semiconductor device 100A are designated by the same reference numerals of the corresponding gate contact in the layout 100. The gate contact 171 is arranged in the spaces between adjacent source/drain contacts. In the example configuration in FIG. 7A, the gate contact 171 is in contact with the gate electrode 122. In the example configuration in FIG. 7A, a boundary of the gate contact 171 is surrounded by a gate contact barrier layer 181. In the example configuration in FIG. 7A, the top surfaces of the gate contact 171 is flush with the source/drain contacts 141, 142, 143, and/or 144 due to, e.g., a planarization process during manufacture. Other arrangements are within the scope of various embodiments.

In the example configuration in FIGS. 5A, 6A, and 7A, the semiconductor device 100A further ILD layers 175 and 176 over the isolation structure 510, in which the ILD layer 175 is between the isolation structure 510 and the ILD layer 176. In some embodiments, ILD layer 176 may be able to be omitted, such that an ILD layer 183 is in contact with the ILD layer 175. In some embodiments, example materials of the ILD layer 175 include, but are not limited to, SiNx, SiOx, SiON, SiC, SiBN, SiCBN, or combinations thereof. In some embodiments, example materials of the ILD layer 176 include, but are not limited to, SiNx, SiOx, SiON, SiC, SiBN, SiCBN, or combinations thereof. In some embodiments, the ILD layer 175 includes material that is substantially the same as the ILD layer 176. In some embodiments, the ILD layer 175 includes material that is different from the ILD layer 176. The ILD layer 175 embeds therein the gate electrode 122, the dielectric dummy gates 121 and 123, and/or the gate spacers 521, 522, and 523 (as best seen in FIG. 5A). The ILD layers 175 and 176 further embeds therein the fins 116, 117, 118, and 119 of the active area regions 111 and 112, and the source/drain contacts 141, 142, 143, and 144. The ILD layer 176 embeds therein the source/drain contacts 141, 142, 143, and 144, and the gate contacts 171.

In the example configuration in FIGS. 5A, 6A, and 7A, the semiconductor device 100A further includes a stacking ILD layer 182. In some embodiments, the stacking ILD layer 182 may be a bi-layered structure or a multilayered structure, and any adjacent two of the sublayers in the stacking ILD layer 182 are different from each other. The sublayer of the stacking ILD layer 182 in contact with the source/drain contacts has a dielectric constant higher than that of another sublayer spaced apart from the source/drain contacts. It is noted that the number of sublayers in the stacking ILD layer 182 may vary depending on the actual requirements of the semiconductor device 100A and may not be limited to the aforementioned embodiments.

Specifically, the source/drain vias 161, 162, 163, and 164 and the gate via 191 embed therein the stacking ILD layer 182. For the sake of simplicity, the source/drain vias 161, 162, 163, and 164 and the gate via 191 of the semiconductor device 100A are designated by the same reference numerals of the corresponding source/drain contact in the layout 100. In some embodiments, the stacking ILD layer 182 includes ILD layers 183, 185, and 187 and may be also referred to as a sandwich dielectric layer.

As shown in FIGS. 5A, 6A, and 7A, the ILD layer 183 is over the ILD layers 175 and 176, the source/drain contacts 141, 142, 143, and 144, and the gate contacts 171. In some embodiments, the ILD layer 183 is in contact with portions of top surfaces of the source/drain contacts 141, 142, 143, and 144 and the gate contacts 171. For example, the ILD layer 183 is in contact with a periphery of a top surface 141a of the source/drain contacts 141, and is in contact with a periphery of a top surface 143a of the source/drain contacts 143.

In FIGS. 5B and 6B, the ILD layer 183 has at least an opening therein to receive at least one of the source/drain vias. For example, the ILD layer 183 has a via opening 183a (may be also referred to as a via hole). The via opening 183a of the ILD layer 183 is defined by a sidewall 183s that is in contact with the source/drain via 161. In some embodiments, the ILD layer 183 includes oxide-based material. Example materials of the ILD layer 183 include, but are not limited to, SiOx.

In FIGS. 5B and 6B, the ILD layer 185 is sandwiched between and in contact with the ILD layers 183 and 187. Further, the ILD layer 185 has at least a via opening therein to receive at least one of the source/drain vias. For example, the ILD layer 185 has a via opening 185a (may be also referred to as a via hole). The via opening 185a of the ILD layer 185 is defined by a sidewall 185s that is in contact with the source/drain via 161. The via opening 185a of the ILD layer 185 is communicated with the via opening 183a of the ILD layer 183. A width of the via opening 185a of the ILD layer 185 is wider than that of the via opening 183a of the ILD layer 183 along a direction parallel to the top surface 141a of the source/drain contact 141. A vertical projection of the via openings 185a projected on the top surface 141a of the source/drain contact 141 is spaced apart from an edge of the top surface 141a and has an area smaller than that of the top surface 141a and greater than that of the vertical projection of the via openings 183a on the top surface 141a.

In addition, the sidewall 185s of the via opening 185a is in contact with a top surface 183t of the ILD layer 183 and a bottom surface 187n of the ILD layer 187. On the other hand, the sidewall 185s of the via opening 185a is recessed from the sidewall 183s of the via opening 183a and a sidewall 187s of the via opening 187a of the ILD layer 187 along a direction parallel to the top surface 141a of the source/drain contact 141. The sidewall 185s of the ILD layer 185 is spaced apart from the sidewall 187s of the ILD layer 187. The sidewall 185s of the via opening 185a forms a recess 185r with portions of the bottom surface 187n of the ILD layer 187 and the top surface 183t of the ILD layer 183 that are not covered by the ILD layer 185. In some embodiment, at least a portion of the top surface 183t is free from the overlapping of the ILD layer 185 and forms at least a ring shape to receive a portion of the source/drain via.

In some embodiments, the ILD layer 185 has a thickness t2 less than that of a thickness t1 of the ILD layer 183 and a thickness t3 of the ILD layer 187. In some embodiments, the ILD layer 185 is less than about 100 A. In some embodiments, the ILD layer 185 has a dielectric constant lower than that of the ILD layers 183 and 187 and includes a material different from that of the ILD layers 183 and 187. In some embodiments, the ILD layer 185 includes low-K material. In some embodiments, the ILD layer 185 includes Nitride based material. Example materials of the ILD layer 185 include, but are not limited to, SiOC or SiOCN.

In FIGS. 5B and 6B, the ILD layer 187 is sandwiched between and in contact with the ILD layer 185 and an inter-metal dielectric (IMD) layer 189 shown in FIG. 5A.

Further, the ILD layer 187 has at least a via opening therein to receive at least one of the source/drain vias. For example, the ILD layer 187 has a via opening 187a (may be also referred to as a via hole). The via opening 187a of the ILD layer 187 is defined by a sidewall 187s that is in contact with the source/drain via 161. The via opening 187a of the ILD layer 185 is communicated with the via opening 185a of the ILD layer 185. A width of the via opening 187a of the ILD layer 187 is less than that of the via openings 185a of the ILD layer 185 along a direction parallel to the top surface 141a of the source/drain contact 141. A vertical projection of the via openings 187a projected on the top surface 141a of the source/drain contact 141 is spaced apart from an edge of the vertical projection of the via openings 185a projected on the top surface 141a and has an area smaller than that of the vertical projection of the via openings 185a.

In addition, the sidewall 187s of the via opening 187a is protruded from the sidewall 185s of the via opening 185a along the direction parallel to the top surfaces 141a of the source/drain contact 141. On the other hand, the sidewall 187s of the via opening 187a is spaced apart from the sidewall 185s of the via opening 185a by the bottom surface 187n of the ILD layer 187. In some embodiment, at least a portion of the bottom surface 187n is free from the overlapping of the ILD layer 185 and forms at least a ring shape to receive a portion of the source/drain vias.

In some embodiments, the ILD layer 187 includes material that is substantially the same as the ILD layer 183. In some embodiments, the ILD layer 187 has a dielectric constant that is substantially the same as the ILD layer 183. In some embodiments, the ILD layer 183 includes oxide-based material. Example materials of the ILD layer 183 include, but are not limited to, SiOx.

In some embodiments, the ILD layer 183 further has a via opening 183b, the ILD layer 185 further has a via opening 185b, and the ILD layer 187 further has a via opening 187b. The structure and function of the components and their relationships are substantially the same as the via openings 183a, 185a, and 187a, and the related detailed descriptions may refer to the foregoing paragraphs, and are not described again herein.

In the example configuration in FIGS. 5B and 6B, at least one of the source/drain vias includes a stacking metal layer. For example, the source/drain via 161 includes a first portion 1610, a second portion 1612, and a third portion 1614 connected to each other, in which the second portion 1612 is sandwiched between and in contact with the first and third portions 1610 and 1614. Specifically, the first portion 1610 of the source/drain via 161 is embedded in the ILD layer 183, in contact with the sidewall 183s of the via opening 183a and the top surface 141a of the source/drain contact 141, and free from in contact with the ILD layer 185. In some embodiments, an area of an interface between the first portion 1610 and the source/drain contact 141 is smaller than an area of the top surface 141a. The first portion 1610 shrinks between the source/drain contact 141 and the second portion 1612. In some embodiments, the first portion 1610 is spaced apart from an edge of the top surface 141a, spaced apart from a sidewall 1612s of the second portion 1612 of the of the source/drain via 161, and further spaced apart from the ILD layer 185. In some embodiments, a vertical projection of the first portion 1610 projected on the top surface 141a of the source/drain contact 141 is spaced apart from an edge of the top surface 141a.

In FIGS. 5B and 6B, the second portion 1612 of the source/drain via 161 is embedded in the ILD layer 185 and is in contact with the sidewall 185s of the via opening 185a, the top surface 183*t* of the ILD layer 183, and the bottom surface 187*n* of the ILD layer 187. The second portion 1612 is protruded from the first and third portions 1610 and 1614 of the source/drain via 161 along a direction parallel to the top surface 141*a* of the source/drain contact 141. The second portion 1612 extends into a space between the ILD layers 183 and 187. That is, the second portion 1612 is filled in the recess 185*r*. That is, a width of the second portion 1612 is wider than that of the first and third portions 1610 and 1614 of the source/drain via 161 along a direction parallel to the top surface 141*a* of the source/drain contact 141. In other words, the source/drain via 161 has a center widen-shaped portion that is located in the ILD layer 185 of the stacking ILD layer 182.

In some embodiments, the sidewall 183*s* of the via opening 183*a* of the ILD layer 183 and the sidewall 185*s* of the via opening 185*a* of the ILD layer 185 are overlapped the second portion 1612 of the source/drain via 161. In some embodiment, the second portion 1612 is free from in contact with the sidewalls 183*s* and 187*s* of the via openings 183*a* and 187*a* of the ILD layers 183 and 187. In some embodiments, a vertical projection of the second portion 1612 projected on the top surface 141*a* of the source/drain contact 141 is spaced apart from an edge of the top surface 141*a* and has an area smaller than that of the top surface 141*a* and greater than that of the vertical projection of the first and third portions 1610 and 1614 on the top surface 141*a*.

In some embodiments, the first portion 1610 of the source/drain via 161 has a thickness that is substantially the same as the thickness of the ILD layer 183, the second portion 1612 of the source/drain via 161 has a thickness that is substantially the same as the thickness of the ILD layer 185, the third portion 1614 of the source/drain via 161 has a thickness that is substantially the same as the thickness of the ILD layer 187. In some embodiments, the thickness of the second portion 1612 is less than that of the first and third portions 1610 and 1614 of the source/drain via 161. In some embodiments, the thickness of the second portion 1612 is less than about 100 A.

In FIGS. 5B and 6B, the third portion 1614 of the source/drain via 161 is embedded in the ILD layer 187, in contact with the sidewall 187*s* of the via opening 187*a* and the metal layer 202, and free from in contact with the ILD layer 185. The third portion 1614 shrinks from the second portion 1612 of the source/drain via 161. The third portion 1614 is spaced apart from the sidewall 1612*s* of the second portion 1612 of the source/drain via 161 and further spaced apart from the ILD layer 185. In some embodiments, a vertical projection of the third portion 1614 projected on the top surface 141*a* of the source/drain contact 141 is spaced apart from an edge of the top surface 141*a*. In some embodiments, the width of the third portion 1614 the source/drain via 161 is substantially the same as that of the first portion 1610. In some embodiments, top surfaces of the source/drain vias are coplanar with each other. For example, as shown in FIG. 6A, a top surface 161*t* of the source/drain via 161 is coplanar with a top surface 162*t* of the source/drain via 162. Example materials of the source/drain via 161 include, but are not limited to, tungsten (W) or Ruthenium (Ru).

According to some embodiments, the source/drain via 161 is embedded in the stacking dielectric layer 182 including the stacking first, second, and third ILD layers. The second portion 1612 in the middle of the source/drain via 161 extends into the recess 185*r* between the first and third ILD layers 183 and 187 and is in contact with the bottom surface 187*n* of the ILD layer 187 and the top surface 185*t* of the ILD layer 185, whereby enhancing the adhesion between the source/drain via 161 and the stacking dielectric layer 182 that can be without disposing an additional barrier layer at an interface of the source/drain via 161 and the stacking dielectric layer 182. As such, the Rc/Rs of the source/drain via 161 will be promoted. In some embodiments, the source/drain via 161 will has a lower via resistance than that with a barrier metal layers surrounding thereof. Thus, the reliability of the semiconductor device may be improved to meet the requirements of high density and high speed SOC product.

In addition, the second portion 1612 in the middle of the source/drain via 161 may protect the underlying elements, such as the source/drain 131, in the subsequent process. Specifically, the second portion 1612 of the source/drain via 161 will prevent chemical gas or acid, or solvent associated with processes, such as an etch process, a CMP process, a Lithio process, from penetrating an interface between the source/drain via 161 and the stacking dielectric layer 182 and further damaging the source/drain 131. In other words, the second portion 1612 of the source/drain via 161 will block chemical gas or acid, or solvent from the subsequent process to pass through, and thus the reliability of the semiconductor device may be improved.

Similarly, the source/drain via 162 shown in FIG. 6B includes a first portion 1620, a second portion 1622, and a third portion 1624 connected to each other, in which the second portion 1622 is sandwiched between and in contact with the first and third portions 1620 and 1624. The structure and function of the components and their relationships are substantially the same as the source/drain via 161, and the related detailed descriptions may refer to the foregoing paragraphs, and are not described again herein.

In the example configuration in FIG. 7B, the ILD layer 183 has a via opening 183*e* (may be also referred to as a via hole) defined by a sidewall 183*w* that is in contact with the gate via 191. The ILD layer 185 has a via opening 185*e* (may be also referred to as a via hole) defined by a sidewall 185*w* that is in contact with the gate via 191. The via opening 185*e* of the ILD layer 185 is communicated with the via opening 183*e* of the ILD layer 183. A width of the via opening 185*e* of the ILD layer 185 is wider than that of the via opening 183*e* of the ILD layer 183. A vertical projection of the via openings 185*e* projected on a top surface 171*a* of the gate contact 171 is spaced apart from an edge of the top surface 171*a* and has an area smaller than that of the top surface 171*a* and greater than that of the vertical projection of the via openings 183*e* on the top surface 171*a*.

In addition, the sidewall 185*w* of the via opening 185*e* is in contact with a top surface 183*t* of the ILD layer 183 and a bottom surface 187*n* of the ILD layer 187. On the other hand, the sidewall 185*w* of the via opening 185*e* is recessed from the sidewall 183*w* of the via opening 183*e* and a sidewall 187*w* of the via opening 187*e* of the ILD layer 187 along a direction parallel to the top surface 171*a* of the gate contact 171. The sidewall 185*w* of the via opening 185*e* forms a recess 185*d* with portions of the bottom surface 187*n* of the ILD layer 187 and the top surface 183*t* of the ILD layer 183 that are not covered by the ILD layer 185.

Furthermore, the ILD layer 187 has the via opening 187*e* (may be also referred to as a via hole) defined by a sidewall 187*w* that is in contact with the gate via 191. The opening 187*e* of the ILD layer 187 is communicated with the via openings 185*e* of the ILD layer 183. A width of the via opening 187*e* of the ILD layer 187 is less than that of the via opening 185*e* of the ILD layer 187. A vertical projection of the via openings 187*e* projected on the top surface 171*a* of the gate contact 171 is spaced apart from an edge of the vertical projection of the via opening 185e projected on the top surface 171a and has an area smaller than that of the vertical projection of the via opening 185e. In addition, the sidewall 185w of the via openings 185e is protruded from the sidewalls 183w and 187w of the via openings 183e and 187e along the direction parallel to the top surfaces 171a of the gate contact 171. On the other hand, the sidewall 187w of the via opening 187e is spaced apart from the sidewall 185w of the via opening 185e by the bottom surface 187n of the ILD layer 187.

In FIG. 7B, the gate via 191 includes a stacking metal layer. For example, the gate via 191 includes a first portion 1910, a second portion 1912, and a third portion 1914 connected to each other, in which the second portion 1912 is sandwiched between and in contact with the first and third portions 1910 and 1914.

In some embodiment, the first portion 1910 of the gate via 191 is embedded in the ILD layer 183, in contact with the sidewall 183w of the via opening 183e and the top surface 141a of the gate contact 171, and free from in contact with the ILD layer 185. In some embodiments, an area of an interface between the first portion 1910 and the gate contact 171 is smaller than an area of the top surface 171a. The first portion 1910 shrinks between the gate contact 171 and the second portion 1912. In some embodiments, the first portion 1910 is spaced apart from an edge of the top surface 171a, spaced apart from a sidewall 1912s of the second portion 1912 of the of the gate via 191, and further spaced apart from the ILD layer 185. In some embodiments, a vertical projection of the first portion 1910 projected on the top surface 171a of the gate contact 171 is spaced apart from an edge of the top surface 171a.

Specifically, the second portion 1912 of the gate via 191 is embedded in the ILD layer 185 and is in contact with the sidewall 185w of the via opening 185e, the top surface 183t of the ILD layer 183, and the bottom surface 187n of the ILD layer 187. The second portion 1912 is protruded from the first and third portions 1910 and 1914 of the gate via 191 along a direction parallel to the top surface 171a of the gate contact 171. The second portion 1912 extends into a space between the ILD layers 183 and 187. That is, the second portion 1912 is filled in the recess 185d. That is, a width of the second portion 1912 is wider than that of the first and third portions 1910 and 1914 of the gate via 191.

In some embodiments, the sidewall 183w of the via opening 183e of the ILD layer 183 and the sidewall 185w of the via opening 185e of the ILD layer 185 are overlapped the second portion 1912 of the gate via 191. In some embodiment, the second portion 1912 is free from in contact with the sidewalls 183w and 187w of the via openings 183e and 187e of the ILD layers 183 and 187. In some embodiments, a vertical projection of the second portion 1912 projected on the top surface 171a of the gate contact 171 is spaced apart from an edge of the top surface 171a and has an area smaller than that of the top surface 171a and greater than that of the vertical projection of the first and third portions 1910 and 1914 on the top surface 171a.

In some embodiments, the first portion 1910 of the gate via 191 has a thickness k1 that is substantially the same as the thickness of the ILD layer 183, the second portion 1912 of the gate via 191 has a thickness k2 that is substantially the same as the thickness of the ILD layer 185, and the third portion 1914 of the gate via 191 has a thickness k3 that is substantially the same as the thickness of the ILD layer 187. In some embodiments, the thickness k2 of the second portion 1912 is less than the thickness k1 of the first portion 1910 and the thickness k3 of the third portion 1914 of the gate via 191. In some embodiments, the thickness k2 of the second portion 1912 is less than about 100 A.

The third portion 1914 of the gate via 191 is embedded in the ILD layer 187, in contact with the sidewall 187w of the via opening 187e and the metal layer 204, and free from in contact with the ILD layer 185. The third portion 1914 shrinks from the second portion 1912 of the gate via 191. The third portion 1914 is spaced apart from the sidewall 1912s of the second portion 1912 of the gate via 191 and further spaced apart from the ILD layer 185. In some embodiments, a vertical projection of the third portion 1914 projected on the top surface 171a of the gate contact 171 is spaced apart from an edge of the top surface 171a. In some embodiments, the width of the third portion 1914 the gate via 191 is substantially the same as that of the first portion 1910. Example materials of the gate via 191 include, but are not limited to, tungsten.

According to some embodiments, the gate via 191 is embedded in the stacking dielectric layer 182 including the stacking first, second, and third ILD layers. The second portion 1912 in the middle of the source/drain via 191 extends into the recess 195d between the first and third ILD layers 183 and 187 and is in contact with the bottom surface 187n of the ILD layer 187 and the top surface 185t of the ILD layer 185, whereby enhancing the adhesion between the gate via 191 and the stacking dielectric layer 182 that can be without disposing an additional barrier layer at an interface of the gate via 191 and the stacking dielectric layer 182. As such, the Rc/Rs of the gate via 191 will be promoted. In some embodiments, the gate via 191 will has a lower via resistance than that with a barrier metal layers surrounding thereof. Thus, the reliability of the semiconductor device may be improved to meet the requirements of high density and high speed SOC product.

In addition, the second portion 1912 in the middle of the gate via 191 may protect the underlying elements, such as the gate stacking, in the subsequent process. Specifically, the second portion 1912 of the gate via 191 will prevent chemical gas or acid, or solvent associated with processes, such as an etch process, a CMP process, a Lithio process, from penetrating an interface between the gate via 191 and the stacking dielectric layer 182 and further damaging the gate electrode 122. In other words, the second portion 1912 of the gate via 191 will block chemical gas or acid, or solvent from the subsequent process to pass through, and thus the reliability of the semiconductor device may be improved.

In the example configuration in FIGS. 5A-7B, the semiconductor device 100A includes an inter-metal dielectric (IMD) layer 189 over the ILD layer 187. Example materials of the IMD layer 189 include, but are not limited to, SiNx, SiOx, SiON, SiC, SiBN, SiCBN, or combinations thereof. The IMD layer 189 embeds therein the conductive lines 201, 202, 203, 204, 205, and 206.

As shown in FIGS. 7A and 7B, the gate via 191 overlaps the gate contact 172 and is connected to the conductive line 204. As shown in FIGS. 5A-6B, the source/drain vias 161 and 162 overlap the source/drain contacts 141 and 142 respectively and are connected to the conductive line 202 and 205 respectively. The conductive lines 201, 202, 203, 204, 205, and 206 extend along the Y direction of the layout 100 shown in FIG. 3. In some embodiments, the conductive lines 201, 202, 203, 204, 205, and 206 are in a first interconnection layer of the layout 100, such as a first metal layer. As shown in FIGS. 5A-6B, the conductive lines 202 and 205 overlap and are electrically connected to the source/ drain contacts 141 and 142 through the source/drain vias 161 and 162 respectively. The conductive line 204 overlaps and is electrically connected to the gate contact 171 through the gate via 191 and is between adjacent two of the conductive lines 203 and 205 which are without passing through the gate vias.

FIGS. 8A-20B illustrate various processes at various stages of manufacturing a semiconductor device 100A in accordance with some embodiments of the present disclosure. In FIGS. 8A-20B, the "A" Figures (e.g., FIGS. 8A, 9A, etc.) illustrate a cross-sectional view corresponding to line A-A shown in FIG. 3, and the "B" Figures (e.g., FIGS. 8B, 9B, etc.) illustrate a cross-sectional view corresponding to line B-B shown in FIG. 3. It is understood that additional operations can be provided before, during, and after the processes shown by FIGS. 8A-20B, and some of the operations described below can be replaced or eliminated, for additional embodiments of the method. The order of the operations/processes may be interchangeable. In the example configurations described with respect to FIGS. 8A-20B, the semiconductor device 100A includes FinFET devices. Other arrangements, such as planar MOS devices, are within the scope of various embodiments.

Figure 8A:
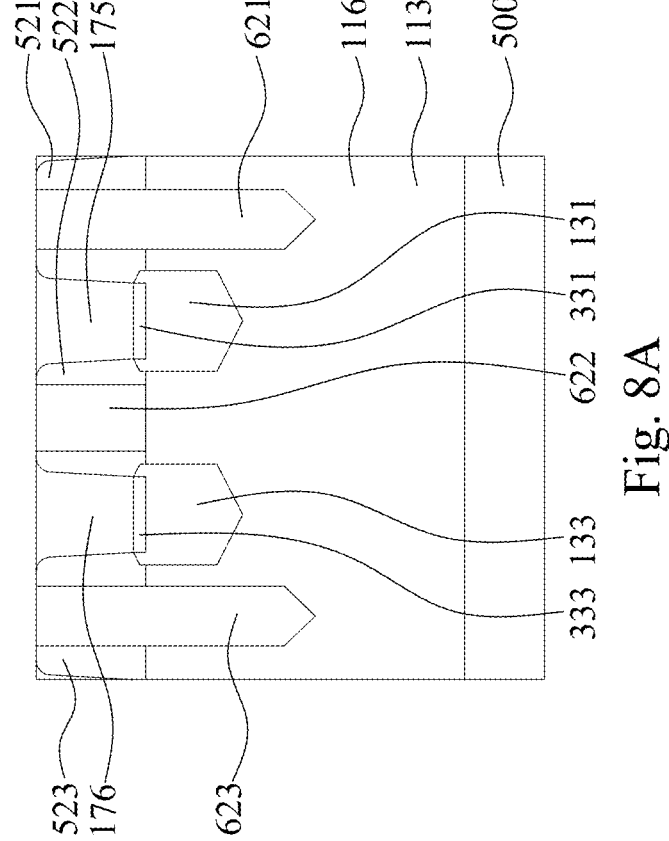
FIGS. 8A, 9A, 10A, 11A, 12A, 13A, 14A, 15A, 16A, 17A, 18A, 19A, and 20A are exemplary cross-sectional views corresponding to the line A-A illustrated in FIG. 3 at various stages of manufacturing a semiconductor device according to some embodiments of the present disclosure.
Figure 8B:
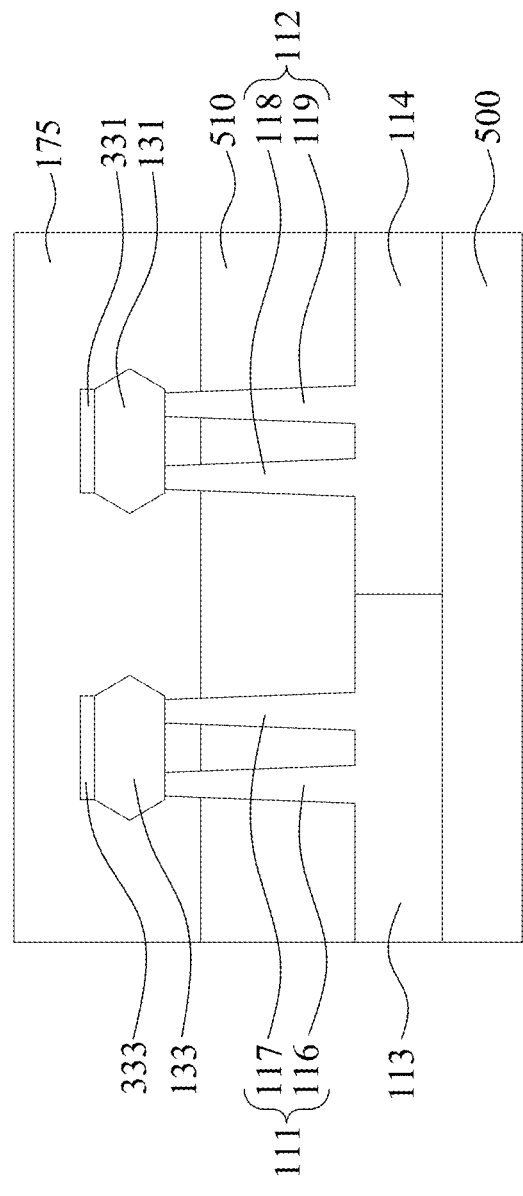
FIGS. 8B, 9B, 10B, 11B, 12B, 13B, 14B, 15B, 16B, 17B, 18B, 19B, and 20B are exemplary cross-sectional views corresponding to the line B-B illustrated in FIG. 3 at various stages of manufacturing a semiconductor device according to some embodiments of the present disclosure.

As illustrated in FIGS. 8A and 8B, an N-type well region 113 and a P-type well region 114 are formed in a substrate 500. In some embodiments, the N-type well region 113 and P-type well region 114 are formed by doping the substrate 500 with corresponding N-type and P-type dopants by ion implantation. Example P-type dopants include, but are not limited to, boron or $BF_2$. Example N-type dopants include, but are not limited to, phosphorus and arsenic.

A plurality of semiconductor fins are formed over the N-type well region 113 and P-type well region 114. As shown in FIGS. 8A and 8B, semiconductor fins 116 and 117 are formed over the N-type well region 113, and semiconductor fins 118 and 119 are formed over the P-type well region 114. Example materials of the semiconductor fins 116-119 include, but are not limited to, silicon, germanium or compound semiconductor. In certain embodiments, the semiconductor fins 116 and 117 are formed of SiGe (for strain effect enhancement), but the semiconductor fins 118 and 119 are formed of a non-germanium-containing material, for example Si.

The semiconductor fins 116-119 are formed by one or more suitable process including, but not limited to, deposition, photolithography, and/or etching processes. In an example, the semiconductor fins are formed by patterning and etching a portion of the silicon substrate 500. In another example, the semiconductor fins are formed by patterning and etching a silicon layer deposited overlying an insulator layer (for example, an upper silicon layer of a silicon-insulator-silicon stack of an SOI substrate).

An isolation structure 510 shown in FIG. 8B is formed over the substrate 500 to define and electrically isolate the semiconductor fins. In some embodiments, the isolation structure 510 includes local oxidation of silicon (LOCOS) and/or shallow trench isolation (STI) regions. Example materials of the isolation structure 510 include, but are not limited to, silicon oxide, silicon nitride, silicon oxynitride, fluoride-doped silicate glass (FSG), a low-K dielectric material, and/or combinations thereof. In an example, the formation of the isolation structure 510 includes filling trenches between the semiconductor fins, for example, by a chemical vapor deposition (CVD) process, with a dielectric material. In some embodiments, the filled trench has a multi-layer structure, such as a thermal oxide liner layer filled with silicon nitride or silicon oxide.

In some embodiments, a p-type species doped process and an n-type species doped process are performed after the formation of the isolation structure 510. The p-type species doped process includes a p-well lithography patterning, a p-well doped formation and a p-type channel doping for n-type devices, such as NMOSFETs. The n-type species doped process includes an n-well lithography pattering, an n-well doped formation and an n-type channel doping for p-type devices, such as PMOSFETs.

A plurality of gates 621, 622, and 623 are formed over the substrate 500, crossing the semiconductor fins. Example materials of the gates include, but are not limited to, poly-silicon, doped poly-silicon with uniform or non-uniform doping or un-doped polysilicon. The gates 621, 622, and 623 are referred to herein as poly gates. In some embodiments, gate dielectric layers are formed under the poly gates. In one or more embodiments, the poly gates are formed by depositing a poly-silicon layer over the substrate 500 with the semiconductor fins and the isolation structure 510 thereon, in a low-pressure chemical vapor deposition (LPCVD) process or a plasma-enhanced chemical vapor deposition (PECVD) process. In some embodiments, a layer of photoresist is formed over the poly-silicon layer by a suitable process, such as, spin-on coating. The layer of photoresist is patterned to form patterned photoresist features by a proper lithography patterning process. The patterned photoresist features are then transferred by a dry etching process to the underlying poly-silicon layer to form the poly gates. The patterned photoresist layer is stripped thereafter.

In some other embodiments, a hard mask layer is formed over the poly-silicon layer, a patterned photoresist layer is formed over the hard mask layer, and the pattern of the photoresist layer is transferred to the first hard mask layer and the poly-silicon layer. As a result, the poly gates and corresponding hard masks over the top surfaces of the poly gates are formed. Example materials of the hard masks include, but are not limited to, silicon oxide, silicon nitride, silicon oxynitride, and/or other suitable dielectric materials. The hard mask layer is formed in one or more embodiments by a method such as chemical vapor deposition (CVD) or physical vapor deposition (PVD).

A plurality of spacers 521, 522, and 523 are formed on sidewalls of the corresponding poly gates 621, 622, and 623. In some embodiments, a dielectric layer is formed over the poly gates 621, 622, and 623 and the substrate 500, and covers sidewalls of the poly gates 621, 622, and 623. Example dielectric materials include, but are not limited to, silicon oxide, silicon nitride, and silicon oxy-nitride. The dielectric layer is formed by CVD, PVD, atomic layer deposition (ALD), or other suitable technique. An anisotropic etching is performed on the dielectric layer to form pairs of spacers on opposite sidewalls of the corresponding poly gates 621, 622, and 623.

Source/drains (SD) 131 and 133 are formed over the semiconductor fins and between the facing spacers of the adjacent poly gates. In one or more embodiments, portions of the semiconductor fins, e.g., the semiconductor fin 116, between the facing spacers of the adjacent poly gates are recessed to form source/drain cavities having bottom surfaces lower than the top surface of the fin 116. For example, a biased etching process is performed to form the source/drain cavities, using the hard masks on top of the poly gates and the spacers as etching masks. After the formation of the source/drain cavities, source/drains 131 and 133 are produced by epi-growing a strained material in the source/drain cavities as described herein. In some embodiments, a pre-cleaning process is performed to clean the source/drain cavities with HF or other suitable solution. Then, the strained material, such as silicon germanium (SiGe) is selectively grown by an LPCVD process to fill the source/drain cavities. Silicides 331 and 333 are formed on the source/drains 131 and 133, respectively.

An interlayer dielectric (ILD) layer 175 is deposited over the substrate 500 having the poly gates, spacers, semiconductor fins and source/drain regions thereon. Example materials of the ILD layer 175 include, but are not limited to, silicon oxide, spin-on glass (SOG), fluorinated silica glass (FSG), carbon doped silicon oxide, other suitable dielectric materials, and/or combinations thereof. In some embodiments, the ILD layer 175 is formed by a high density plasma (HDP) process. In one or more embodiments, the ILD layer 175 is planarized by a chemical mechanical polishing (CMP) process to remove a thickness of the ILD layer 175 and the hard masks on tops of the poly gates, and to expose top surfaces of the poly gates.

Figure 9A:
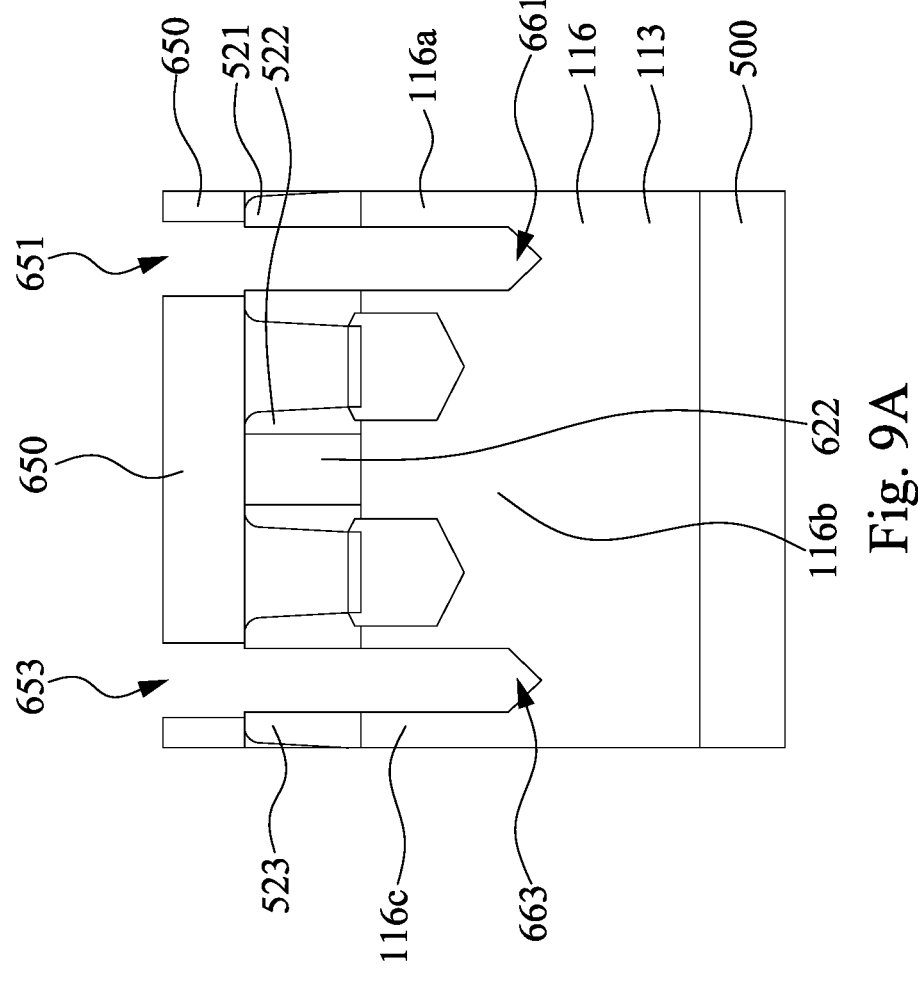
Figure 9B:
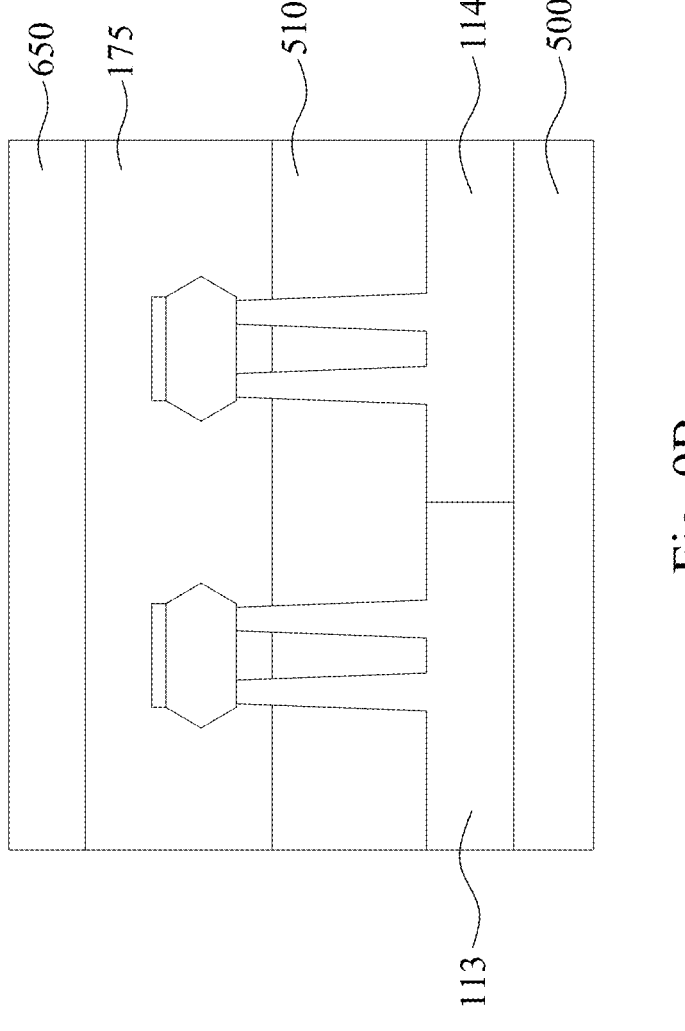

As illustrated in FIGS. 9A and 9B, the poly gates corresponding to dielectric dummy gates in the semiconductor device 100A being manufactured are removed. In some embodiments, a photoresist layer 650 is deposited over the substrate 500 by a suitable process, such as spin-on coating. The photoresist layer 650 is patterned to form openings 651 and 653 to expose first portions of the poly gates 621 and 623 over the N-type well where the dielectric dummy gates are to be formed. The exposed portions of the poly gates 621 and 623 are removed, for example, by a wet etch and/or a dry etching process, to form corresponding openings 661 and 663 between the corresponding pairs of spacers. In the poly gate etching, the photoresist layer 650 and the ILD layer 175 are used as etching masks. In some embodiments, the gate dielectric layers formed under the poly gates 621 and 623 remain in the openings 661 and 663 between the corresponding pairs of spacers. In some embodiments, the gate dielectric layers formed under the poly gates 621 and 623 are removed to expose semiconductor fins 116-119 and the isolation structure 510.

A selective fin etching process is performed in one or more embodiments to break one or more fin into smaller semiconductor fins for different circuits. For example, as illustrated in FIGS. 9A and 9B, a Si etching process is performed to further deepen the openings 661 and 663 and remove at least portions of the semiconductor fin 116. Resulting openings 663 and 663 are obtained and split the semiconductor fin 116 into the semiconductor fins 116a, 116b and 116c. In some embodiments, the fin etching process includes a self-aligned etch using the same etching mask, i.e., the photoresist layer 650 and the ILD layer 175, as the etching mask used in the poly gate etching described with respect to FIGS. 9A and 9B. As a result, an additional mask and associated cost is avoidable in some embodiments. In some embodiments, the described selective fin etching process is omitted.

Figure 10A:
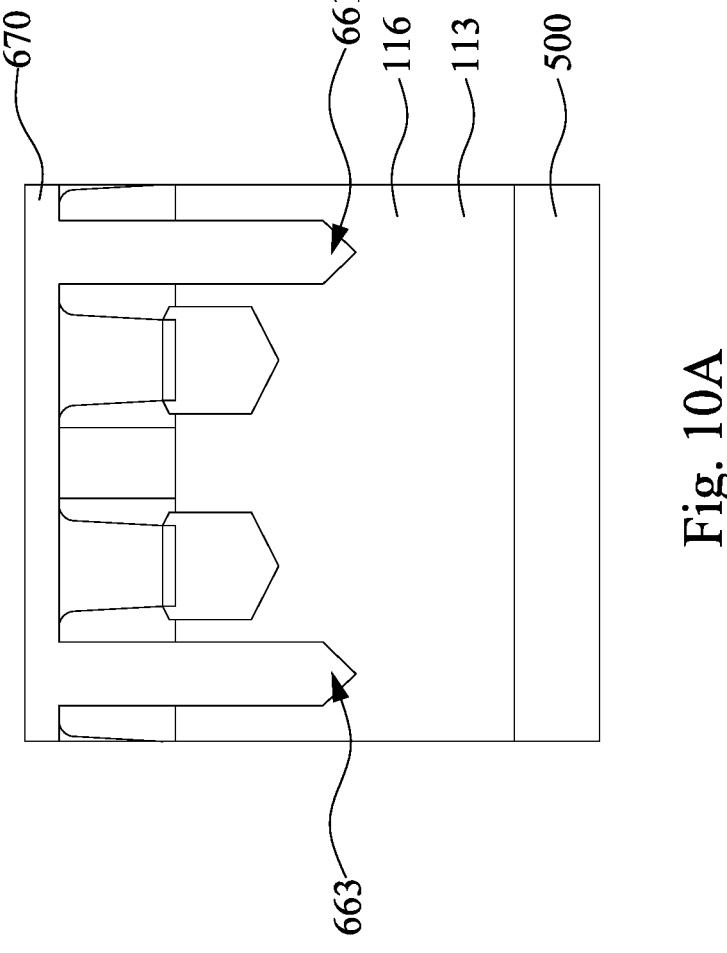
Figure 10B:
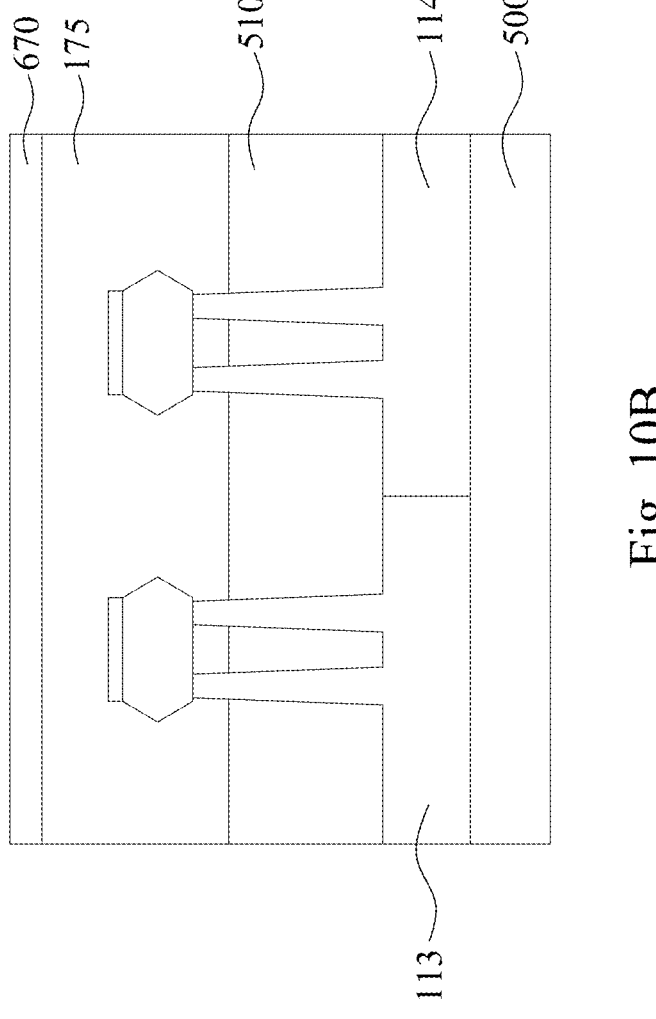
Figure 11A:
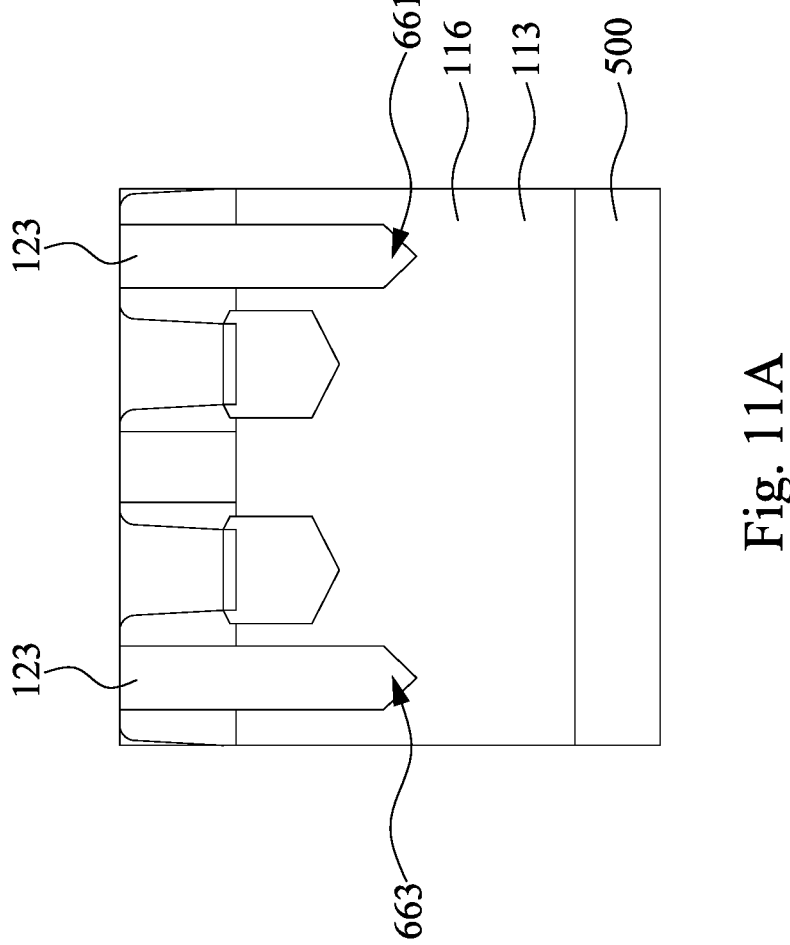
Figure 11B:
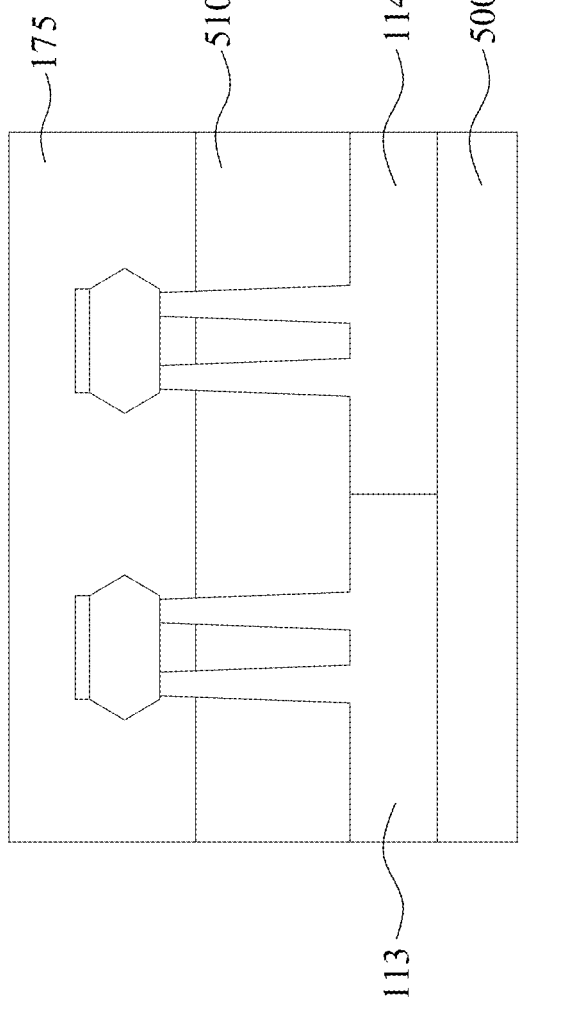

As illustrated in FIGS. 10A and 10B, a dielectric material 670 is formed over the substrate 500 and fills in the openings 661 and 663. Thereafter, a CMP process is performed to planarize the deposited dielectric material 670. The dielectric material remaining in the openings 661 and 663 corresponds to dielectric dummy gates 121 and 123 as described previously. The resulting structure is illustrated in FIGS. 11A and 11B.

Figure 12A:
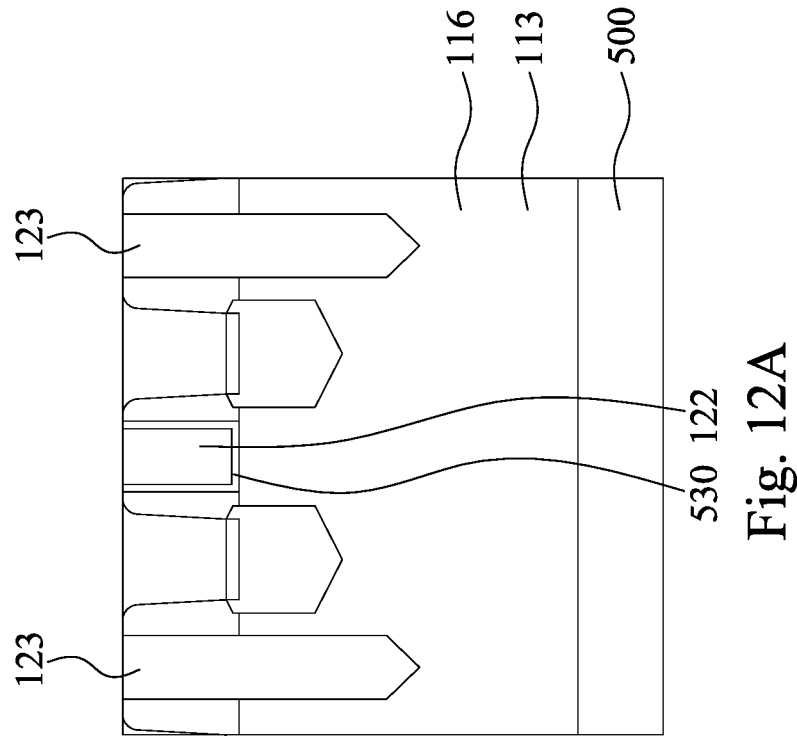
Figure 12B:
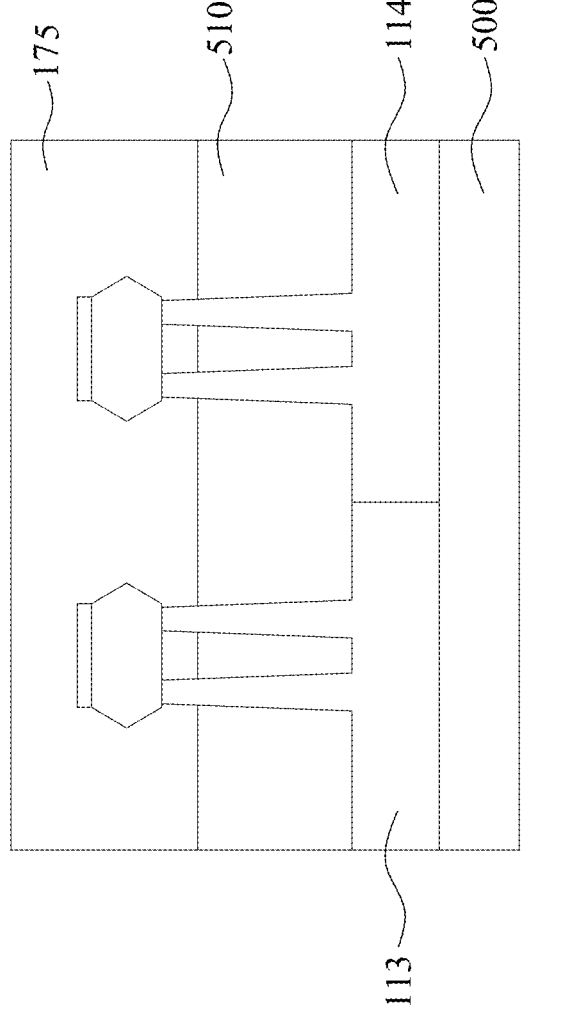

As illustrated in FIGS. 12A and 12B, the remaining poly gate 622 shown in FIGS. 9A-11B are selectively removed to form openings that expose the underlying semiconductor fins. One or more conductive materials of the replacement gate electrode 122 are filled in the openings over the remaining gate dielectric layers previously formed under the poly gates. In some embodiments, the gate dielectric layers formed under the poly gates are also removed and new gate dielectric layers are deposited in the openings between the corresponding pairs of spacers. In some embodiments, the conductive material of the gate electrode 122 includes a work function layer and/or a contact layer as described herein. A planarization process is performed to remove the conductive materials outside the gate electrodes 122. Further processes, such as a gate contact formation process and a source/drain contact formation process, are performed in one or more embodiments.

Figure 13A:
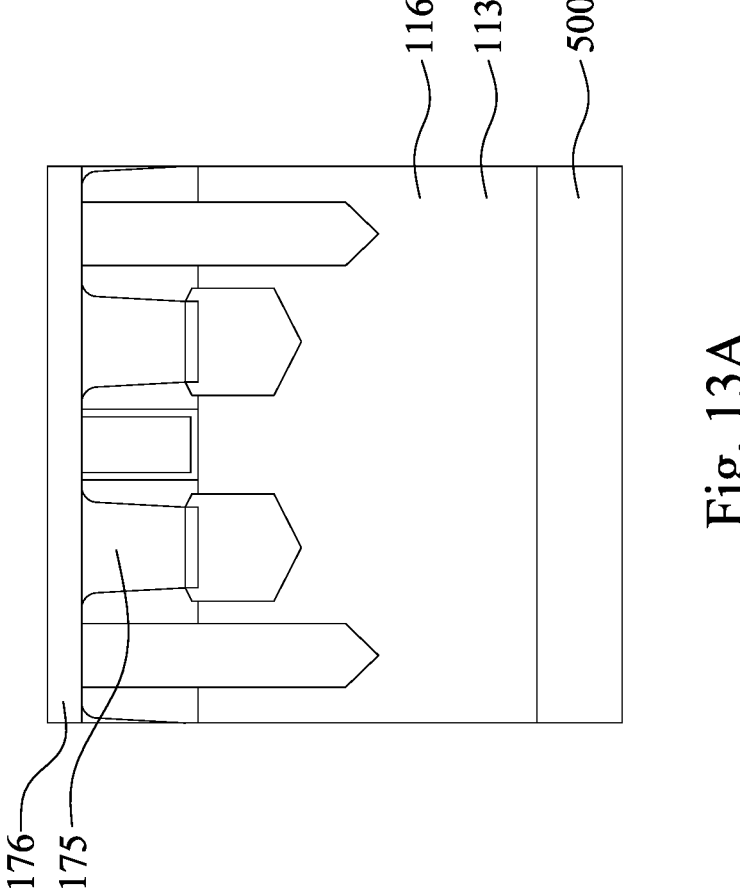
Figure 13B:
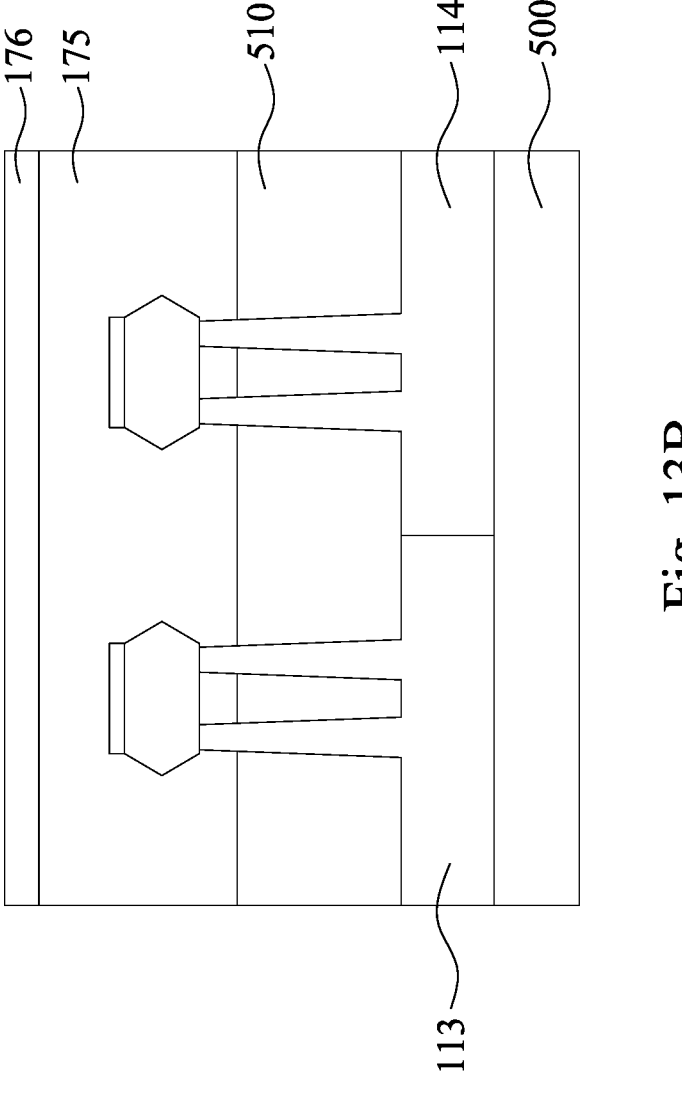

As illustrated in FIGS. 13A and 13B, the semiconductor device 100A further includes an inter-layer dielectric (ILD) layer 176 over the ILD layer 175. In some embodiments, example materials of the ILD layer 176 include, but are not limited to, SiNx, SiOx, SiON, SiC, SiBN, SiCBN, or combinations thereof. In some embodiments, example materials of the ILD layer 176 include, but are not limited to, silicon oxide, spin-on glass (SOG), fluorinated silica glass (FSG), carbon doped silicon oxide, other suitable dielectric materials, and/or combinations thereof. In some embodiments, the ILD layer 176 is formed by a high density plasma (HDP) process.

Figure 14A:
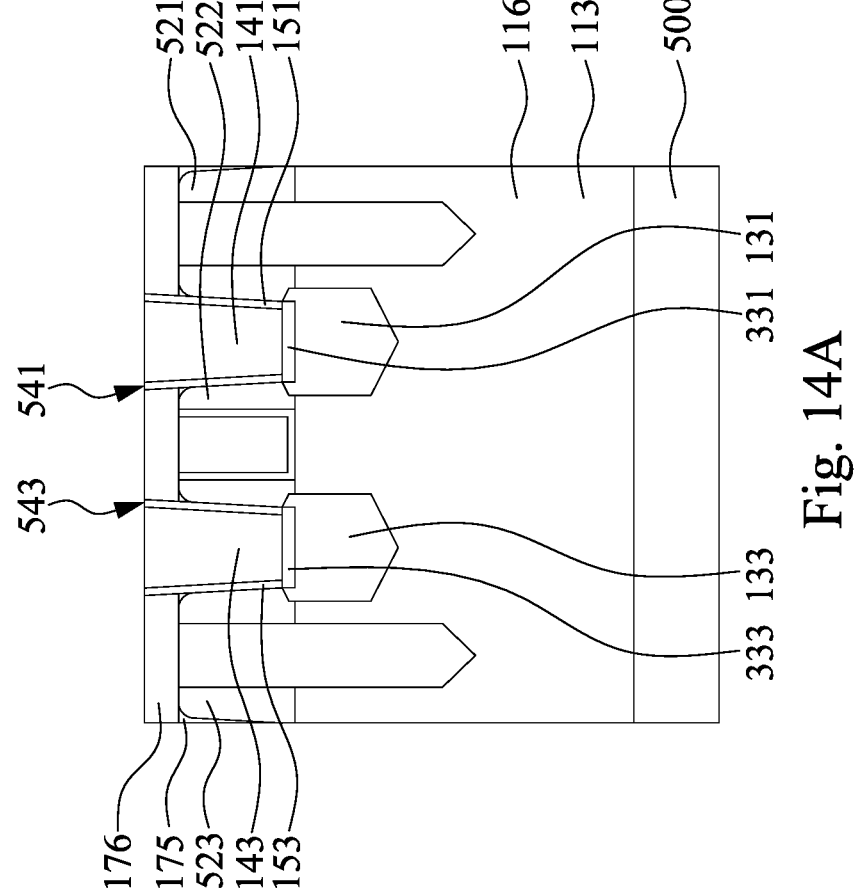
Figure 14B:
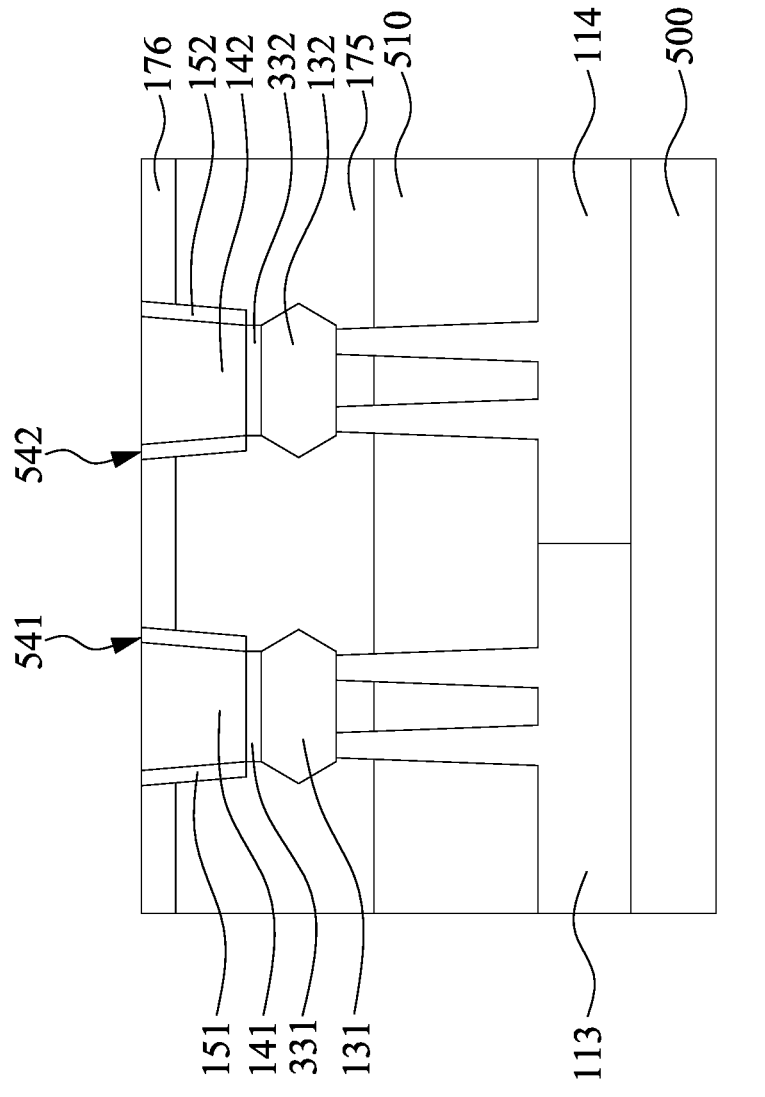

As illustrated in FIGS. 14A and 14B, after the ILD layer 176 is formed, the source/drain contacts 141, 142, and 143 are formed to in contact with the corresponding source/drains through the corresponding silicides. In addition, the source/drain contact barrier layers 151, 152, and 153 are formed to surround the source/drain contacts 141, 142, and 143.

Specifically, the source/drain contact barrier layers 151, 152, and 153 line sidewalls of contact openings 541, 542, and 543 formed in the ILD layers 175 and 176, in which the contact openings 541, 542, and 543 respectively expose the silicides 331, 332, and 333. Portions of the ILD layers 175 and 176 between the spacers 521, 522, and 523 are etched downwardly to form the contact openings 541, 542, and 543 that expose the silicides 331, 332, and 333. The contact openings 541, 542, and 543 can be formed by various methods, including a dry etch, a wet etch, or a combination of dry etch and wet etch. In some embodiment, the source/drain contact barrier layers 151, 152, and 153 is a metal or metal alloy layer.

The source/drain contacts 141, 142, and 143 are disposed in the contact openings 541, 542, and 543 and formed on a top surface of the silicides 331, 332, and 333. Specifically, one or more metal materials can be filled in the contact openings 541, 542, and 543 until the metal materials are over-filled. Subsequently, a chemical mechanical polishing (CMP) is performed to planarize the metal materials and the source/drain contact barrier layers 151, 152, and 153 after filling the contact openings 541, 542, and 543. The CMP removes excessive portions of the metal materials. After planarization, the source/drain contacts 141, 142, and 143 are formed. The source/drain contacts 141, 142, and 143 each goes through the ILD layers 175 and 176 to provide electrical contact to the source/drains 131, 132, and 133. That is, the dielectric layers, i.e., the ILD layers 175 and 176, surround the source/drain contacts 141, 142, and 143. The source/drain contacts 141, 142, and 143 adheres to the source/drain contact barrier layers 151, 152, and 153.

In some embodiments, the source/drain contact barrier layers 151, 152, and 153 may include Co, Ag, Al, Zn, Ca, Au, Mg, W, Mo, Ni, Cr, Ti, TiN, or the like, which may be deposited by using e.g., PVD, CVD, PECVD, LPCVD, or the like. The source/drain contacts 141, 142, and 143 are made of a material, such as, tungsten, aluminum, copper, or other suitable materials. In some embodiments, the source/drain contacts 141, 142, and 143 include TiN, TaN, Ta, Ti, Hf, Zr, Ni, W, Co, Cu, Ru, or Al. In some embodiments, the source/drain contacts 141, 142, and 143 may be formed by CVD, PVD, plating, ALD, or other suitable technique.

Figure 15A:
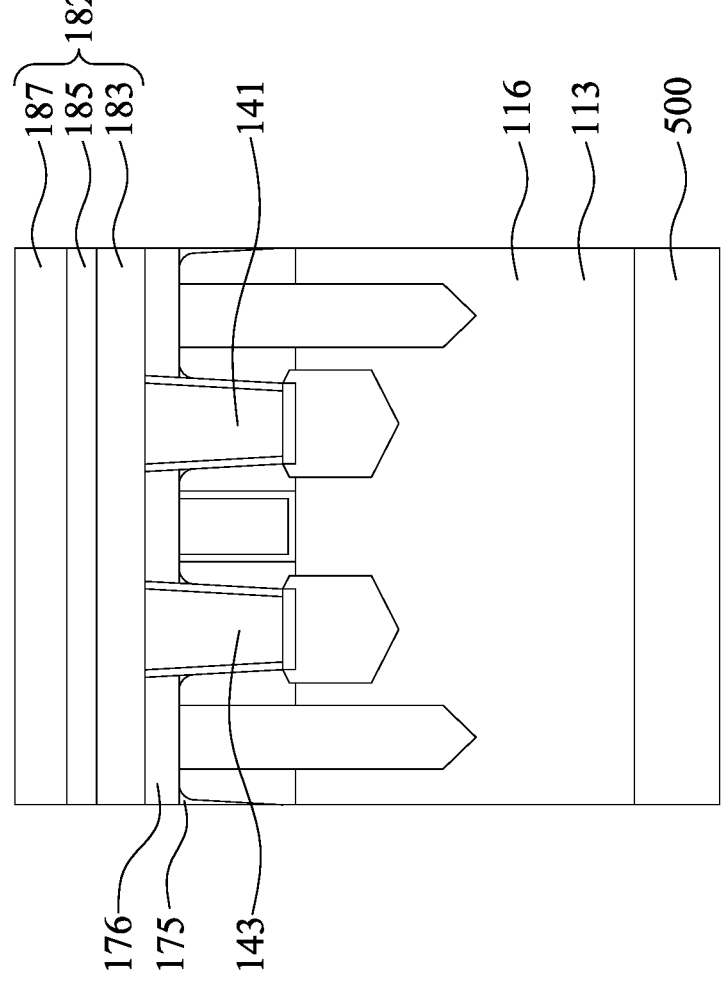
Figure 15B:
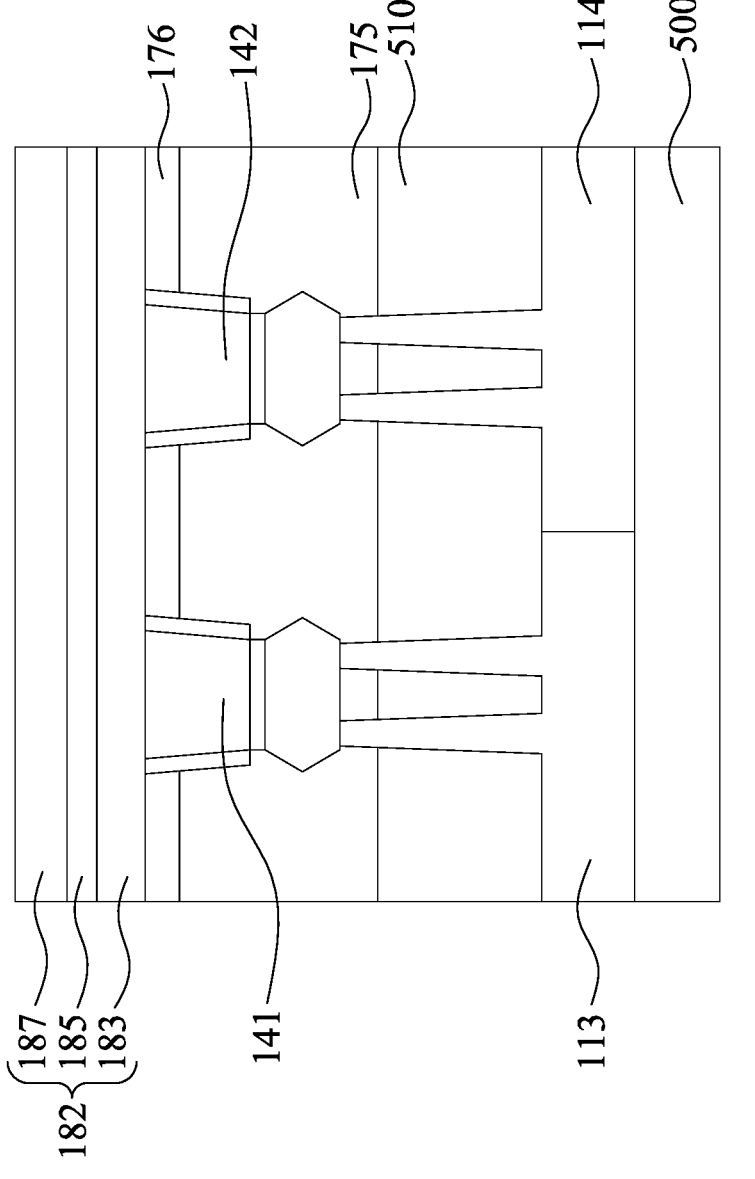

As illustrated in FIGS. 15A and 15B, after the source/drain contacts 141, 142, and 143 and the source/drain contact barrier layers 151, 152, and 153 are formed, a stacking ILD layer 182 is formed on and in contact with the source/drain contacts 141, 142, and 143. In some embodiments, the stacking ILD layer 182 includes the ILD layers 183, 185, and 187 and may be also referred to as a sandwich dielectric layer. Specifically, the ILD layer 183 is formed over and in contact with the source/drain contacts 141, 142, and 143, the source/drain contact barrier layers 151, 152, and 153, and the ILD layer 176. In some embodiments, example materials of the ILD layer 183 include, but are not limited to, SiNx, SiOx, SiON, SiC, SiBN, SiCBN, or combinations thereof. In some embodiments, example materials of the ILD layer 183 include, but are not limited to, silicon oxide, spin-on glass (SOG), fluorinated silica glass (FSG), carbon doped silicon oxide, other suitable dielectric materials, and/or combinations thereof. In some embodiments, the ILD layer 183 is formed by a high density plasma (HDP) process.

After the deposition of the ILD layer 183, the ILD layer 185 is formed over and in contact with the ILD layer 183. In some embodiments, the ILD layer 185 has a dielectric constant lower than that of the ILD layer 183. In some embodiments, the ILD layer 185 includes low-K material. Example materials of the ILD layer 185 include, but are not limited to, SiOC, SiOCN. In some embodiments, the ILD layer 185 is formed by a high density plasma (HDP) process.

After the deposition of the ILD layer 185, the ILD layer 187 is formed over and in contact with the ILD layer 185. In some embodiments, the ILD layer 187 includes oxide-based material. Example materials of the ILD layer 183 include, but are not limited to, SiOx. In some embodiments, example materials of the ILD layer 187 include, but are not limited to, SiNx, SiOx, SiON, SiC, SiBN, SiCBN, or combinations thereof. In some embodiments, example materials of the ILD layer 187 include, but are not limited to, silicon oxide, spin-on glass (SOG), fluorinated silica glass (FSG), carbon doped silicon oxide, other suitable dielectric materials, and/or combinations thereof. In some embodiments, the ILD layer 187 includes material that is substantially the same as the ILD layer 183. In some embodiments, the ILD layer 187 has a dielectric constant that is substantially the same as the ILD layer 183. In some embodiments, the ILD layer 187 is formed by a high density plasma (HDP) process.

Figure 25:
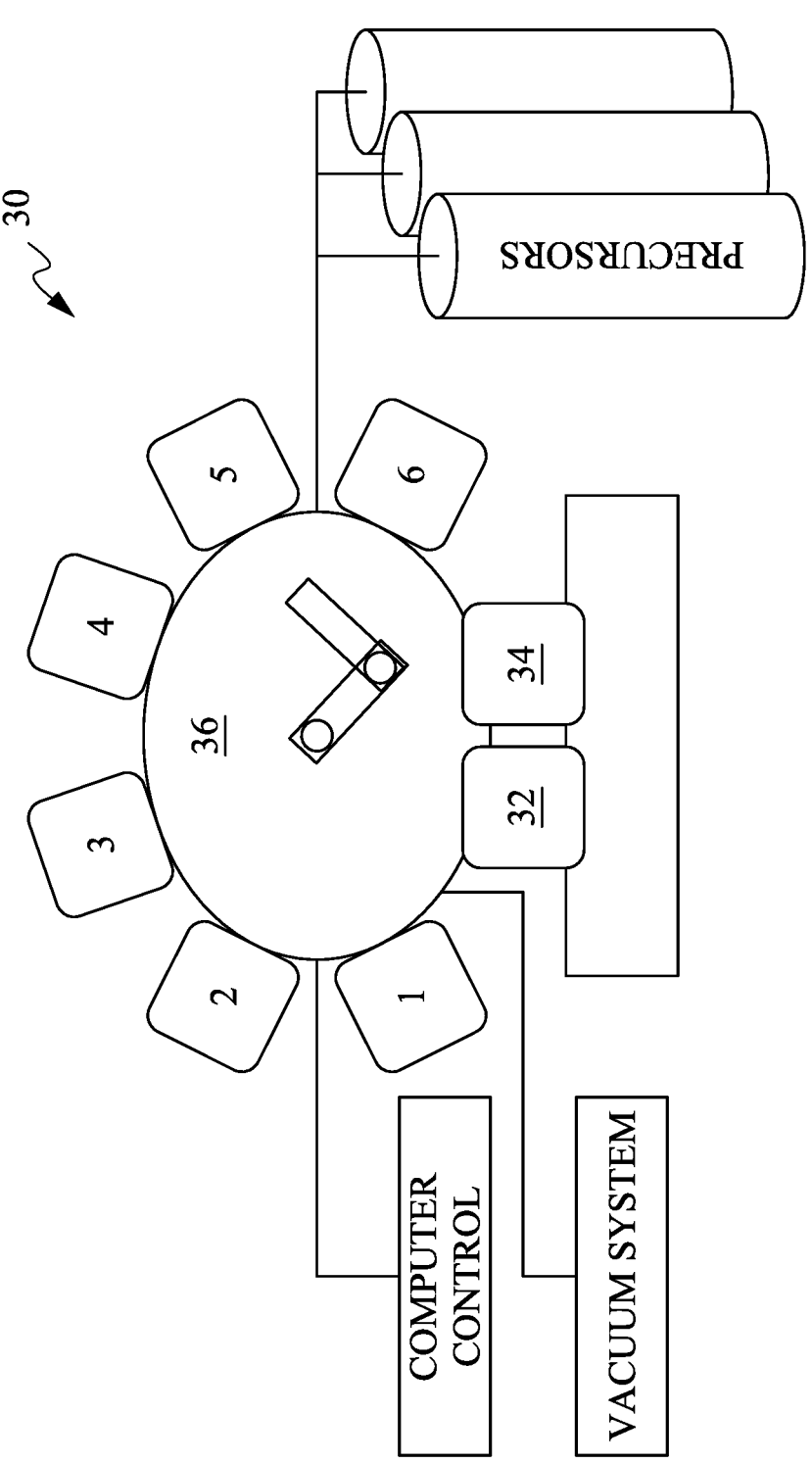
FIG. 25 is a schematic top-view diagram of an exemplary multi-chamber processing system in accordance with some embodiments of the present disclosure.

In some embodiments, at least two of the adjacent sublayers in the stacking ILD layer 182 are in-situ performed in the same process apparatus (i.e. performed in the same chamber). In some embodiments, the sublayers 183, 185, and 187 are ex-situ performed in different process apparatus (i.e. performed in different chambers). In greater detail, Referring now to FIG. 25, illustrated is a schematic top-view diagram of an exemplary multi-chamber processing system 30. In some embodiments, as shown in FIG. 25, the system 30 may be equivalently referred to as a "cluster tool". The system 30 may generally include load lock chambers 32 and 34, a wafer handling chamber 36, and a plurality of processing chambers 1-6. In various embodiments, the load lock chambers 32 and 34 provide for the transfer of substrates into and out of the system 30. In various embodiments, the system 30 is under vacuum, and the load lock chambers 32 and 34 may "pump down" the substrates introduced into the system 30 (e.g., by way of a mechanical pump and/or a turbomolecular pump). In some embodiments, the load lock chambers 32 and 34 may be adapted to receive a single wafer or a plurality of wafers (e.g., loaded into a cassette). By way of example, the load lock chambers 32 and 34 may be separated from the wafer handling chamber 36 by way of a gate valve, allowing the wafer handling chamber 36 to remain under vacuum when one or both of the load lock chambers 32 and 34 are vented.

In various embodiments, the wafer handling chamber 36 is equipped with an automated, robotic arm that may move smoothly along any of a horizontal, vertical, and/or rotational axis so as to transfer substrates between the load lock chambers 32 and 34 and any of the substrate processing chambers 1-6. Each processing chamber 1-6 may be configured to perform a number of substrate processing operations such as atomic layer deposition (ALD), CVD, PVD, etching, pre-treatment/pre-soak, de-gassing, annealing, as well as a number of metrology operations such as XPS analysis, AFM analysis, and/or other suitable processing or metrology operations. In various embodiments, the system 30 may have more or less processing chambers, for example, as necessary for a particular process to be performed by the system 30.

As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also generally be used to refer to processes in which the device or substrate being processed is not exposed to an external environment (e.g., external to the processing system).

Figure 16A:
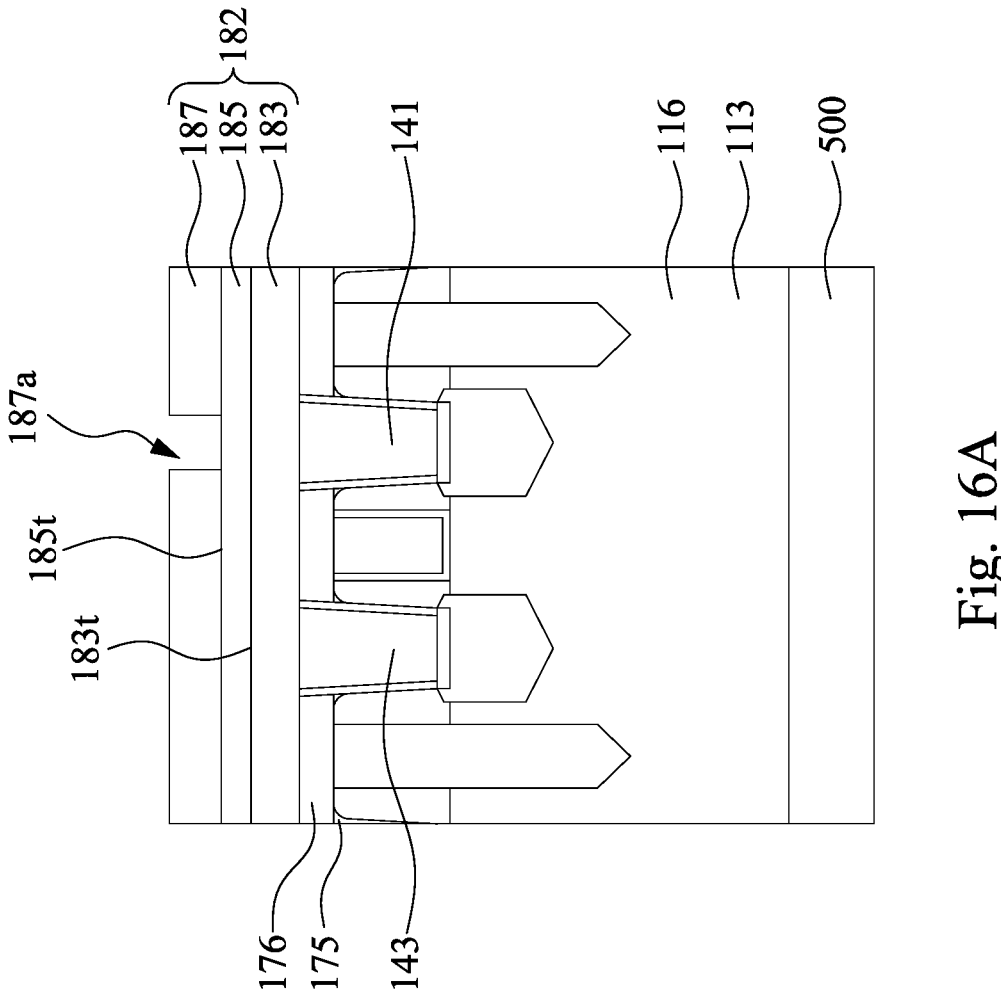
Figure 16B:
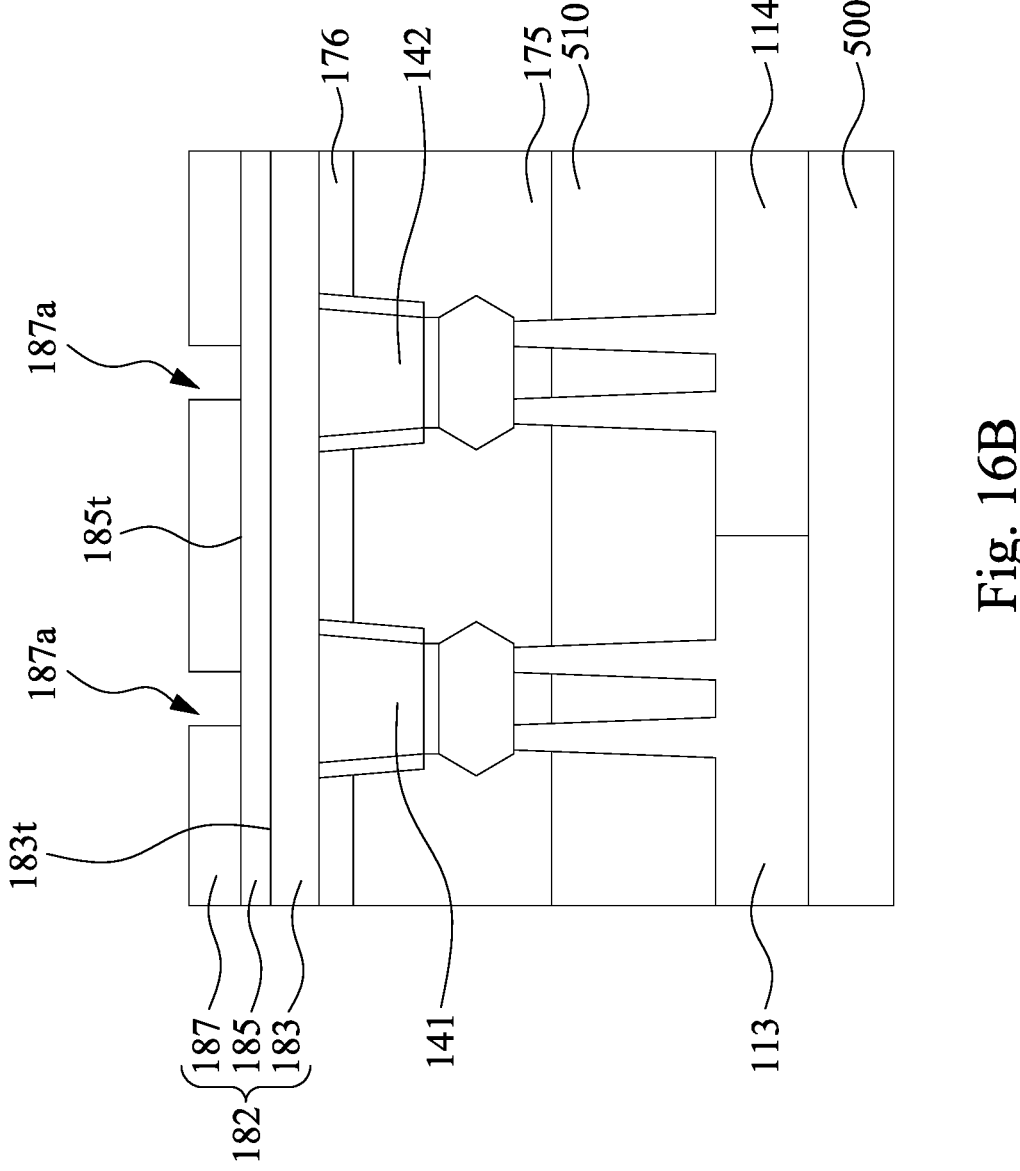

As illustrated in FIGS. 16A and 16B, after the stacking ILD layer 182 is formed, portions of the ILD layer 187 in the stacking ILD layer 182 are removed to expose the top surface 185*t* of the ILD layer 185. In some embodiments, the material of the ILD layers 187 is different from that of the ILD layers 185 to achieve etching selectivity during etching processes. That is, the ILD layer 185 above the source/drain contacts 141, 142, and 143 are remained during the etching processes and the ILD layer 185 may also be referred to as an etch stop layer. In some embodiment, the etching processes are anisotropic. Specifically, a photoresist layer is deposited over the ILD layer 187 by a suitable process, such as spin-on coating. The photoresist layer is patterned to form openings to expose portions of the ILD layer 187 over the source/drain contacts 141, 142, and 143 where the source/drain vias 161, 162, and 163 are to be formed. In some embodiments, the exposed portions of the ILD layers 187 are removed, for example, by a wet etch and/or a dry etching process, to form corresponding via openings 187*a* above the source/drain contacts 141, 142, and 143. The via openings 187*a* overlap the source/drain contacts 141, 142, and 143.

It should be pointed out that operations for forming the via opening 187*b* in the ILD layers 187 shown in FIG. 16B is substantially the same as the operations for forming the via openings 187*a*, and the related detailed descriptions may refer to the foregoing paragraphs and are not discussed again herein.

Figure 17A:
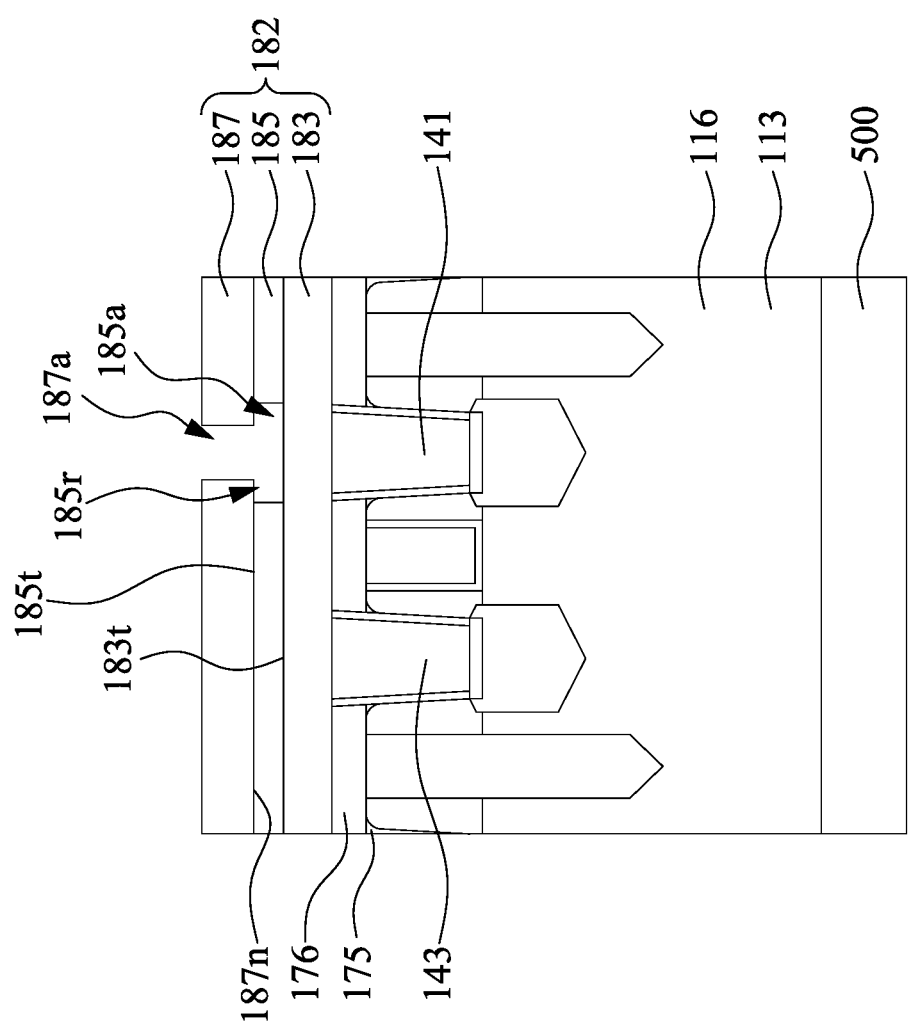
Figure 17B:
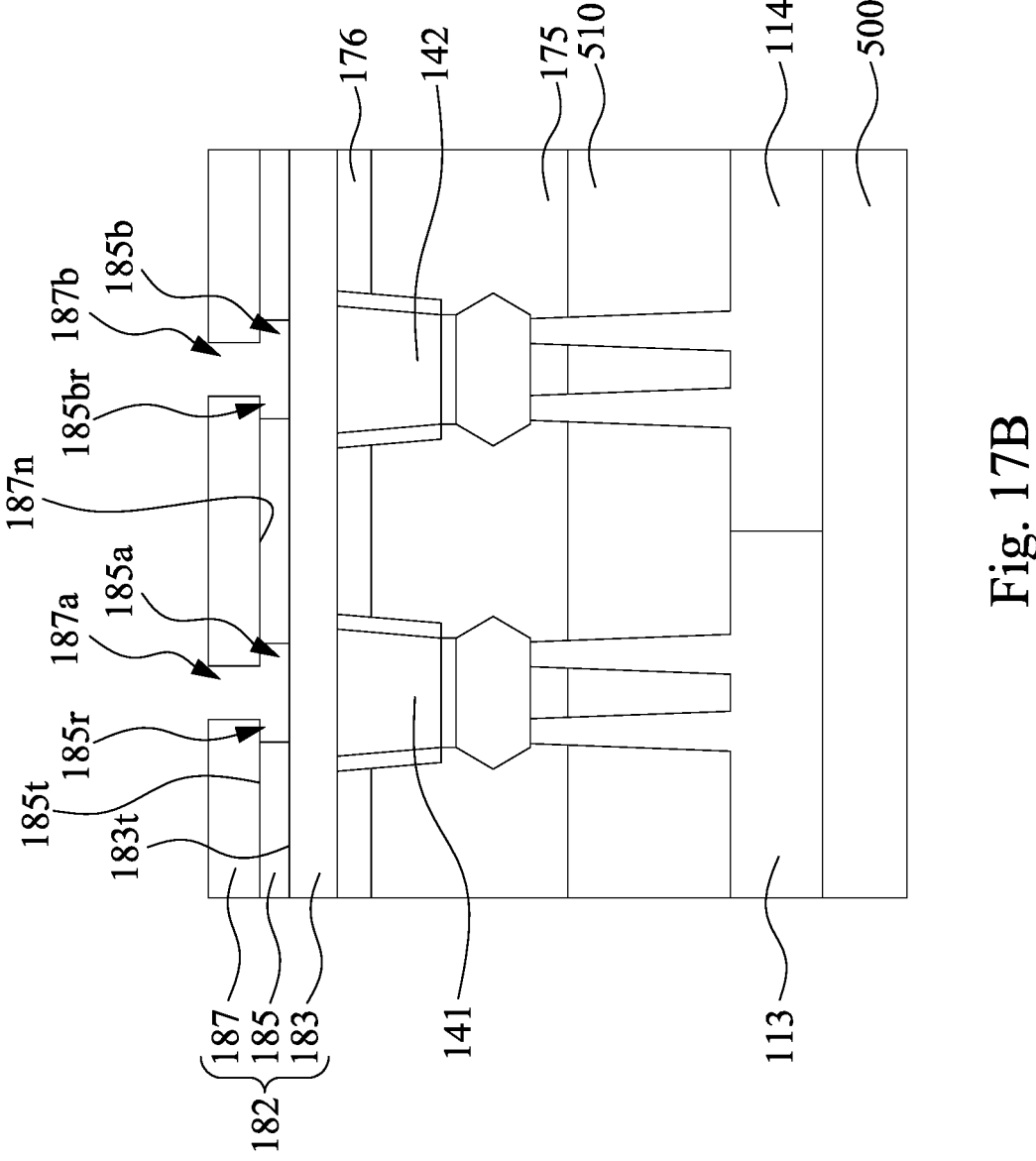

As illustrated in FIGS. 17A and 17B, after the via openings 187*a* of the ILD layer 187 is formed, the ILD layer 185 is etched downwardly to expose the top surface 183*t* of the ILD layer 183 and is further recessed relative to the sidewall of the via opening 187*a* by performing an etching process to form the via opening 185*a*. In some embodiment, the etching process is isotropic. The etching process is performed such that the bottom surface 187*n* of the ILD layer 187 is exposed in the via opening 185*a* of the ILD layer 185. Specifically, the photoresist layer not shown is deposited over the ILD layer 187 and is patterned to form via openings to expose the top surface 185*t* of the ILD layer 185. In some embodiments, the etching process is a selective removal process for different oxide materials, such as, a wet etching process with different etching rates depend on different oxide materials for the ILD layers 185 and 187. For example, when the ILD layer 185 is made of a low-K material, such as, SiOC or SiOCN and the ILD layer 187 is made of a material, such as, SiOx, the etching process may include de-ionized water to recess the sidewall of the via opening 185*a'* and remain the ILD layer 187. The etching process may include, such as, deionized water, ozonated DIW, buffered hydrofluoric acid (BHF), hydrofluoric acid (HF), HF water diluted by ethylene glycol (HFEG), or any combination thereof. As such, after the recessing of the ILD layer 185 relative to the sidewall of the via opening 187*a* along a direction parallel to the top surface 141*a* of the source/drain contacts 141, the recess 185*r* is formed between the bottom surface 187*n* of the ILD layer 187 and the top surface 183*t* of the ILD layer 183. The width of the via opening 185*a* of the ILD layer 185 is greater than that of the via opening 187*a* of the ILD layer 187.

It should be pointed out that operations for forming the via opening 185*b* and the recess 185*br* on the ILD layer 185 shown in FIG. 17B is substantially the same as the operations for forming the via opening 185*a* and the recess 185*r*, and the related detailed descriptions may refer to the foregoing paragraphs and are not discussed again herein.

Figure 18A:
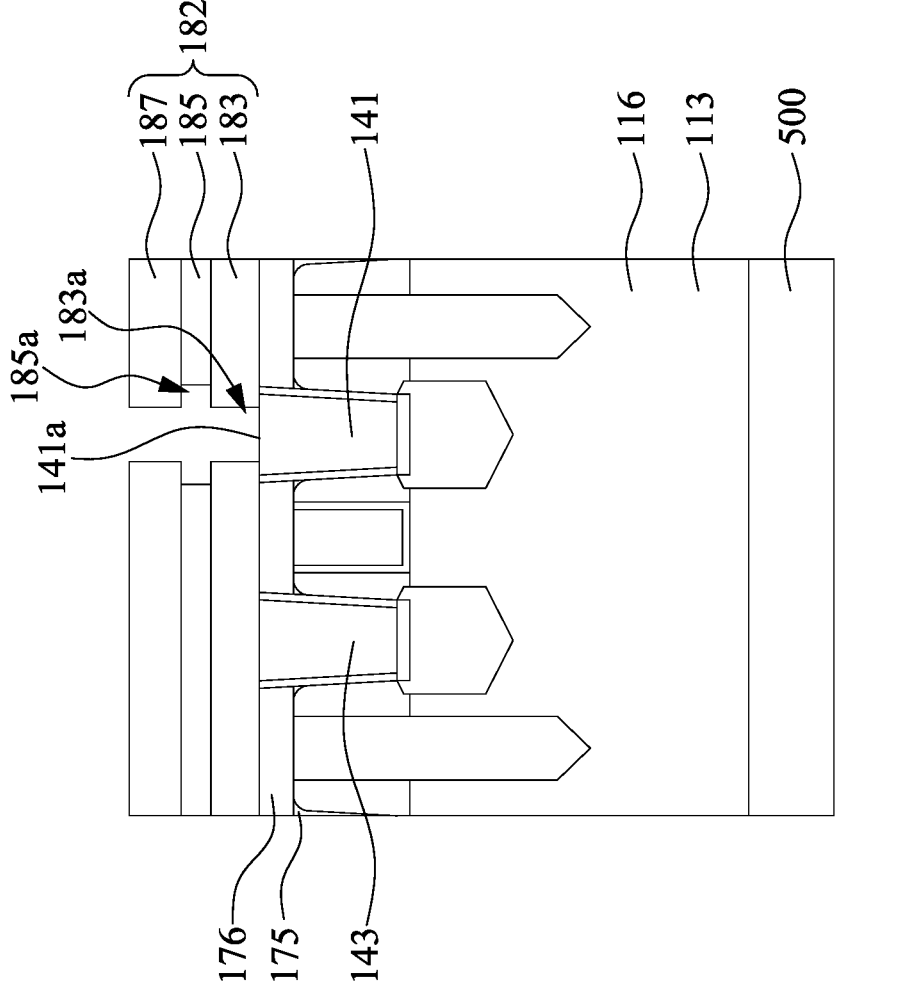
Figure 18B:
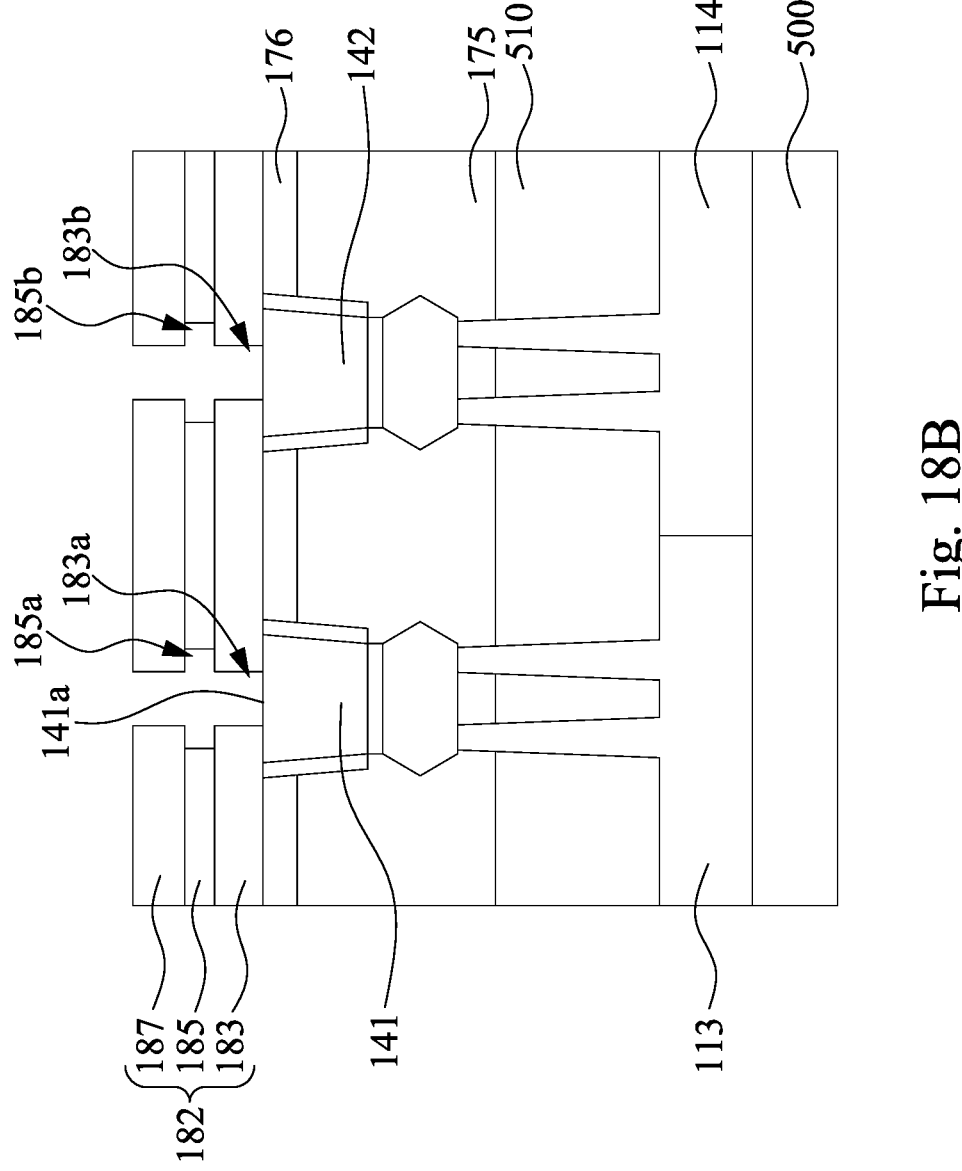

As illustrated in FIGS. 18A and 18B, after the recesses on the ILD layer 185 are formed, portions of the ILD layer 183 in the stacking ILD layer 182 are removed to expose the top surfaces of the source/drain contacts. The photoresist layer not shown is deposited over the ILD layer 187 and is patterned to form via openings to expose the top surface 183*t* of the ILD layer 183. In some embodiments, the exposed portions of the ILD layer 183 are removed, for example, by a wet etch and/or a dry etching process, to form corresponding via opening 183*a* above the source/drain contacts 141. The via opening 183*a* overlaps the source/drain contacts 141. Further, the via opening 183*a* of the ILD layer 183 has a width less than that of the via opening 185*a* of the ILD layer 185. It should be pointed out that operations for forming the via openings 183*b* in the ILD layers 183 shown in FIG. 18B are substantially the same as the operations for forming the via openings 183*a*, and the related detailed descriptions may refer to the foregoing paragraphs and are not discussed again herein.

Figure 19A:
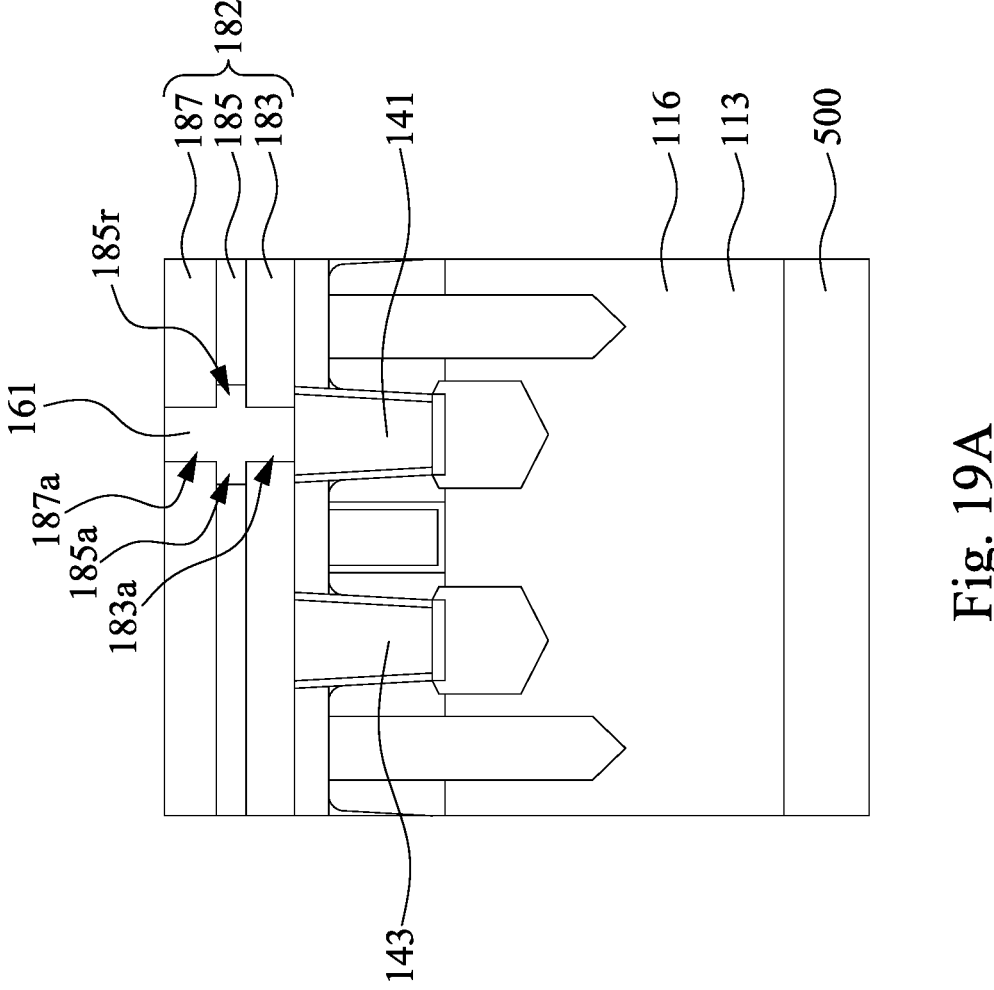
Figure 19B:
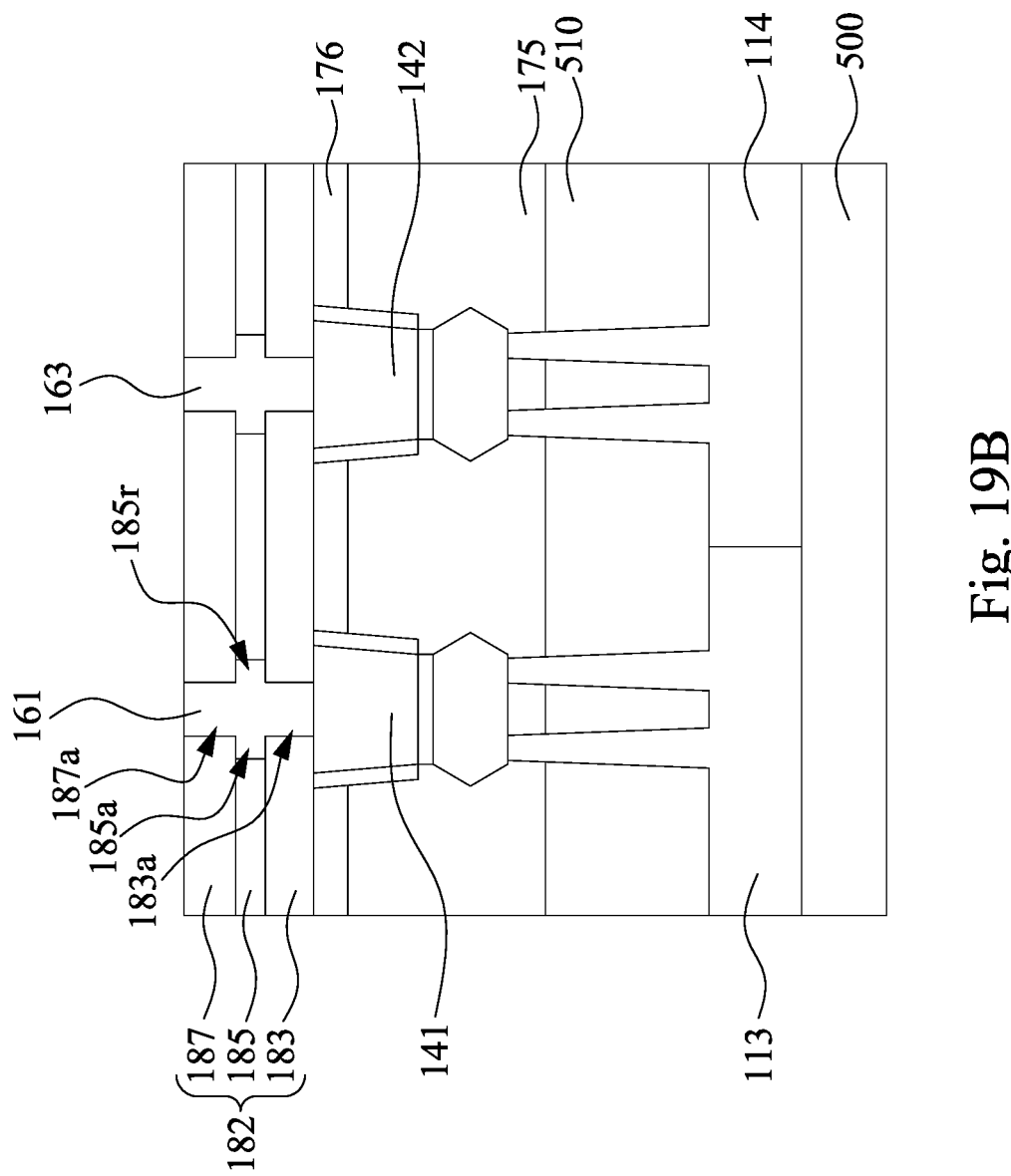

As illustrated in FIGS. 19A and 19B, after the via openings 183*a* of the ILD layer 183 is formed of the stacking ILD layer 182, a materials is filled in the via openings to form the source/drain via. For example, the metal material is filled in the via openings 183*a*, 185*a*, and 187*a* to form the source/drain via 161. In some embodiment, one or more metal materials can be filled in the via openings 183*a*, 185*a*, and 187*a* and the recess 185*r* until the metal materials are over-filled. Subsequently, CMP process is performed to planarize the metal materials after filling the via openings 183*a*, 185*a*, and 187*a*. The CMP removes excessive portions of the metal materials. After planarization, the source/drain via 161 is formed. The source/drain via 161 is disposed in the via openings 183*a*, 185*a*, and 187*a*, in contact with the top surface 141*a* of the source/drain contact 141, and in contact with the ILD layers 183, 185, and 187 without a barrier layer therebetween. The source/drain via 161 goes through the ILD layers 183, 185, and 187 to provide electrical contact to the source/drain contact 141. That is, the dielectric layers, i.e., the ILD layers 183, 185, and 187, surround the source/drain via 161.

It should be pointed out that operations for forming the source/drain via 163 shown in FIG. 19B and the source/drain vias 162 and 164 shown in FIG. 3 are substantially the same as the operations for forming the source/drain via 161, and the related detailed descriptions may refer to the foregoing paragraphs and are not discussed again herein. In some embodiments, the source/drain vias 161-164 include TiN, TaN, Ta, Ti, Hf, Zr, Ni, W, Co, Cu, or Al. In some embodiments, the source/drain vias 161-164 may be formed by CVD, PVD, plating, ALD, or other suitable technique.

Figure 20A:
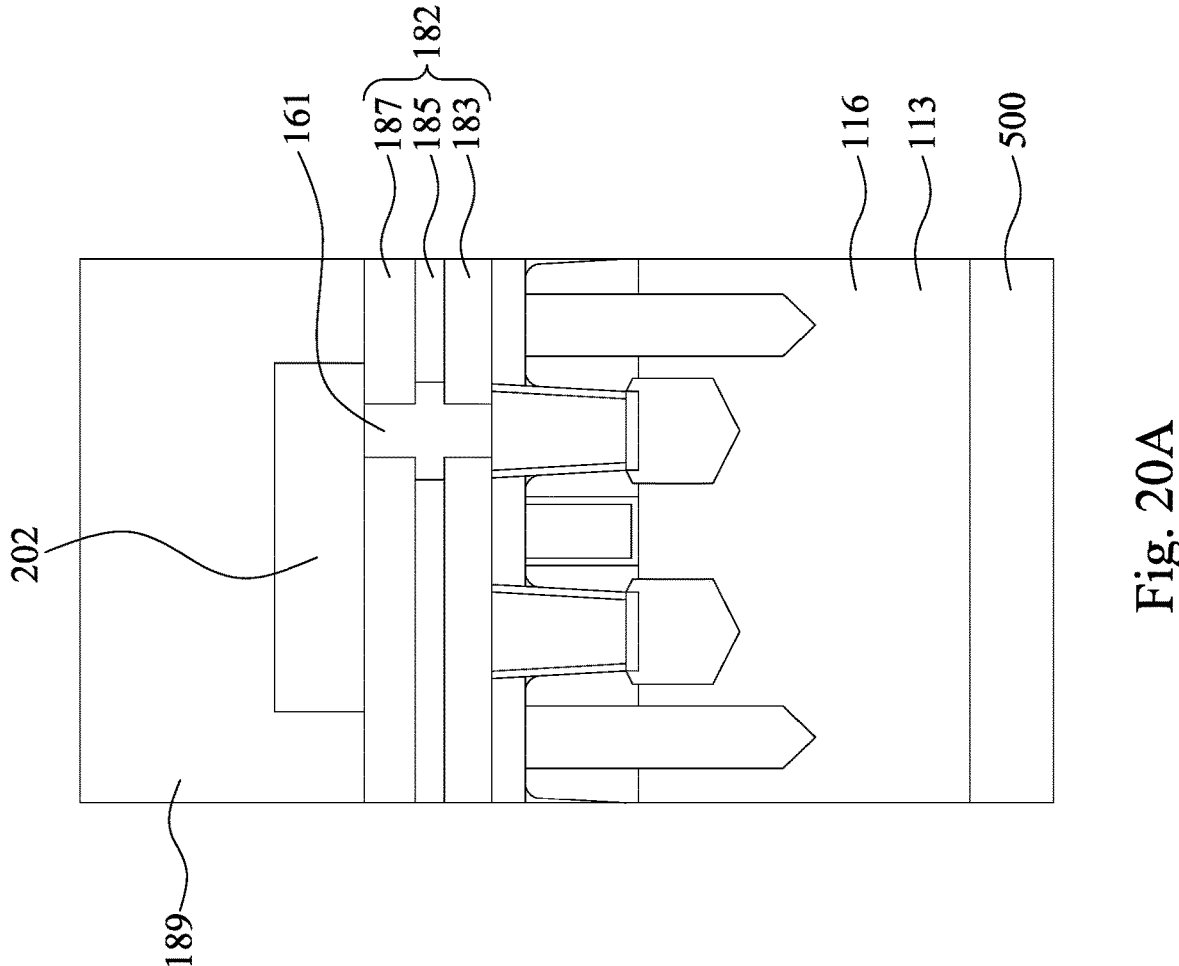
Figure 20B:
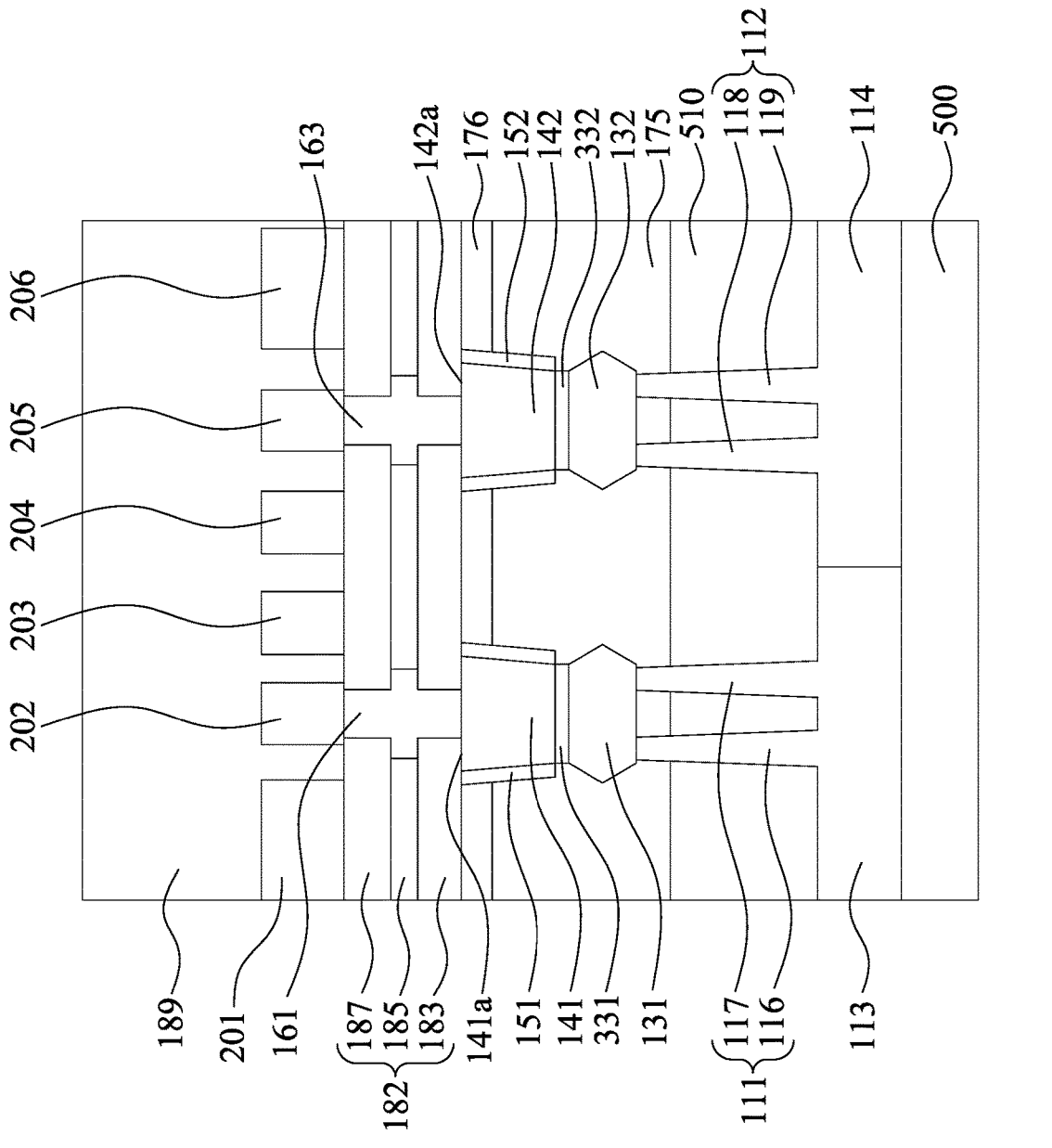

As illustrated in FIGS. 20A and 20B, after the source/drain vias 161-164 are formed, the IMD layer 189 and the conductive lines 201, 202, 203, 204, 205, and 206 embedded in the IMD layer 189 are formed on the stacking ILD layer 182 and the source/drain vias 161-164. The conductive line 202 and 205 shown in FIGS. 20A and 20B are connected to the source/drain vias 161 and 163, respectively. Example materials of the IMD layer 189 include, but are not limited to, SiNx, SiOx, SiON, SiC, SiBN, SiCBN, or combinations thereof.

Figure 21:
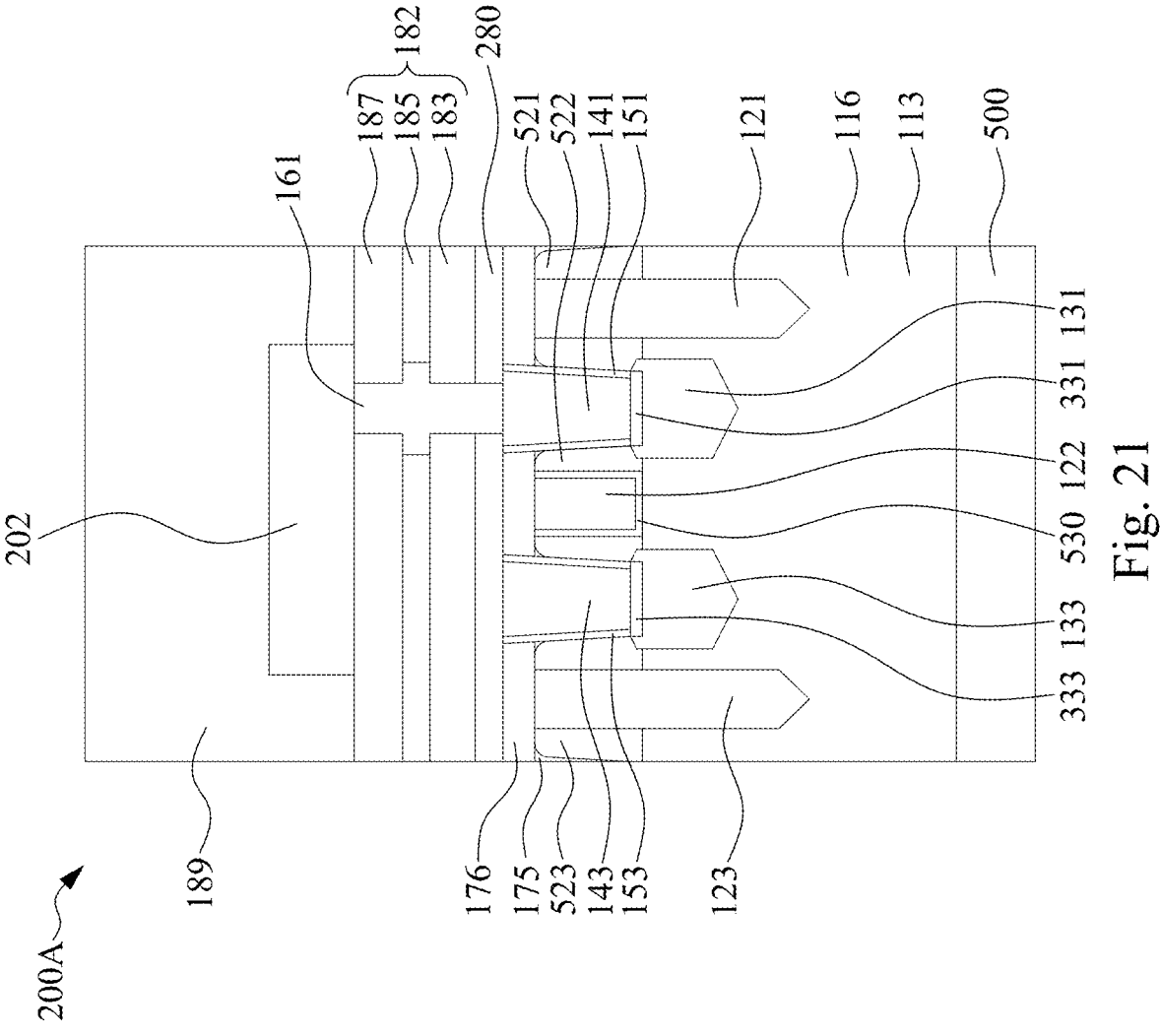
FIGS. 21 and 22 are exemplary cross-sectional views corresponding to the line A-A and the line B-B illustrated in FIG. 3 respectively at various stages of manufacturing another semiconductor device according to some embodiments of the present disclosure.
Figure 22:
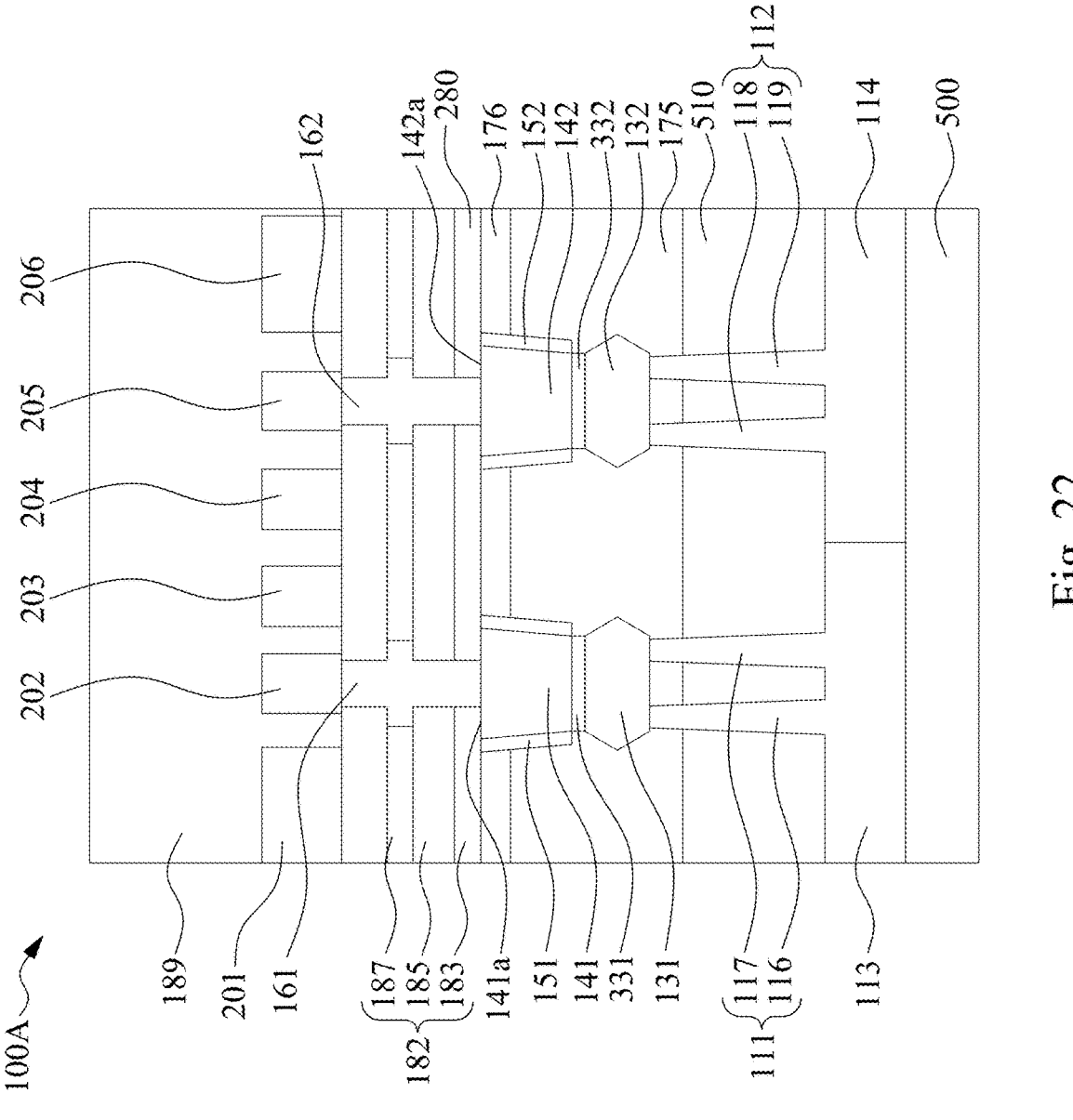

Reference is made to FIGS. 21 and 22. FIGS. 21 and 22 are exemplary cross-sectional views corresponding to the line A-A and the line B-B illustrated in FIG. 3 respectively at various stages of manufacturing a semiconductor device 200A according to some embodiments of the present disclosure. As shown in FIGS. 21 and 22, the structure and function of the components and their relationships in the semiconductor device 200A are substantially the same as the semiconductor device 100A shown in FIGS. 5A to 20B, and the related detailed descriptions may refer to the foregoing paragraphs, and are not described again herein. It is noted that, the difference between the present embodiment and the embodiment in FIGS. 5A to 20B is in that the semiconductor device 200A further includes a via etch stop layer 280 formed over the ILD layers 175 and 176 and between the source/drain contacts and the ILD layer 183.

For example, the via etch stop layer 280 blankets the ILD layers 175 and 176 and the source/drain contacts 141-144 as shown in FIG. 3. The etch stop layer 280 is in contact with portions of the top surface 141*a* of the source/drain contacts 141 and is spaced apart from the gate electrode 122, the dummy gate 121 and 123, and the spacers 521, 522, and 523. In other words, the gate electrode 122, the dummy gate 121 and 123, and the spacers 521, 522, and 523 are under the coverage of the via etch stop layer 280. The first portion 1610 of the source/drain via 161 goes through the via etch stop layer 280 to provide electrical contact to the source/drains 131, 132, and 133. That is, the via etch stop layer 280 surrounds the first portion 1610 of the source/drain via 161. The first portion 1610 of the source/drain via 161 is in contact with the via etch stop layer 280 without a barrier layer therebetween.

Specifically, the via etch stop layer 280 (metal contact etch stop layer) is formed by a deposition process such as, for example, CVD, PECVD, chemical solution deposition, or evaporation. The via etch stop layer 280 includes a material such as, for example, SiO, SiN, SiOC, and SiOCN. In some embodiments, the material of the via etch stop layer 280 is different from that of the spacers 521, 522, and 523 to achieve etching selectivity during etching processes.

Figure 23:
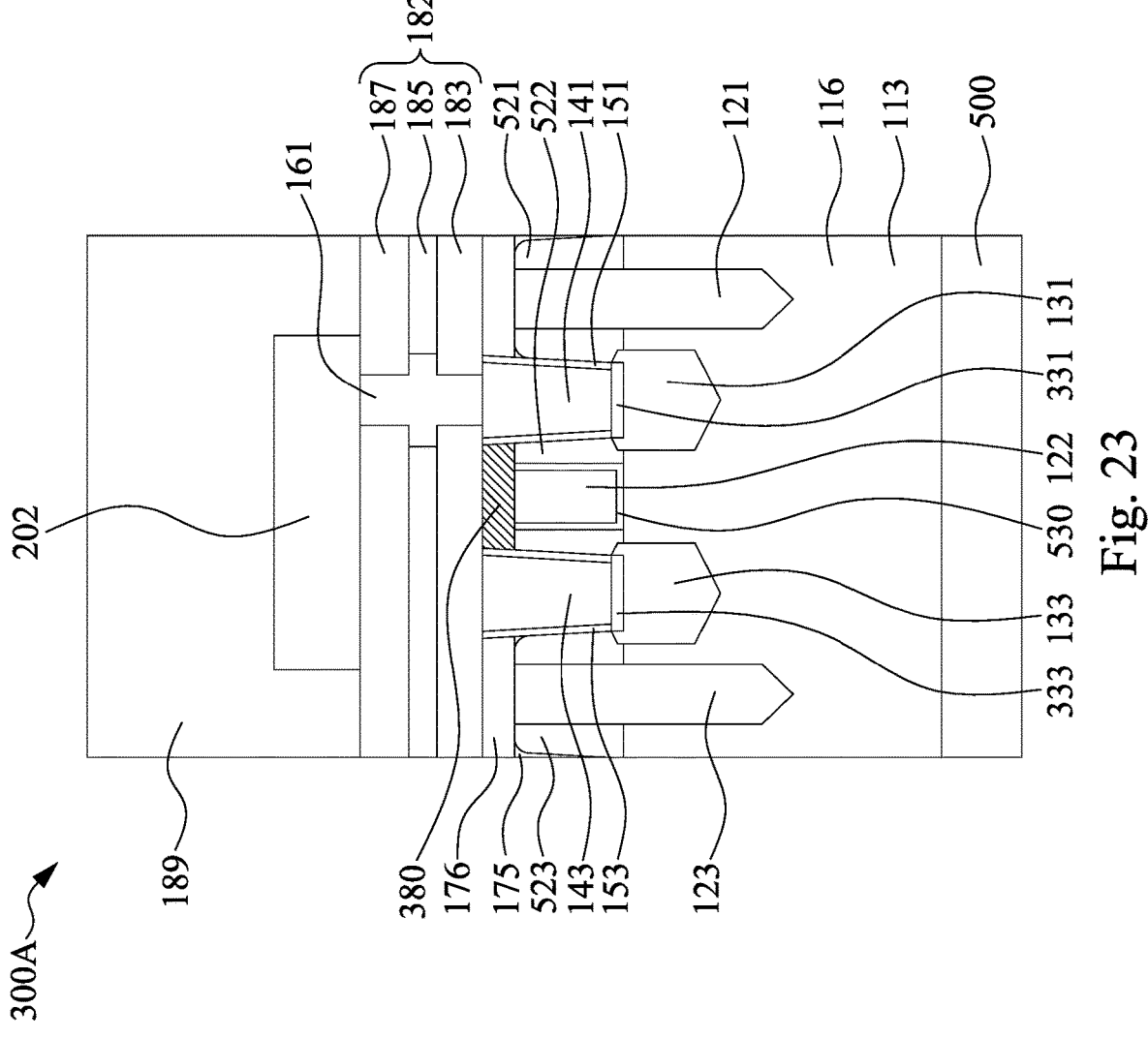
FIGS. 23 and 24 are exemplary cross-sectional views corresponding to the line A-A and the line B-B illustrated in FIG. 3 respectively at various stages of manufacturing another semiconductor device according to some embodiments of the present disclosure.
Figure 24:
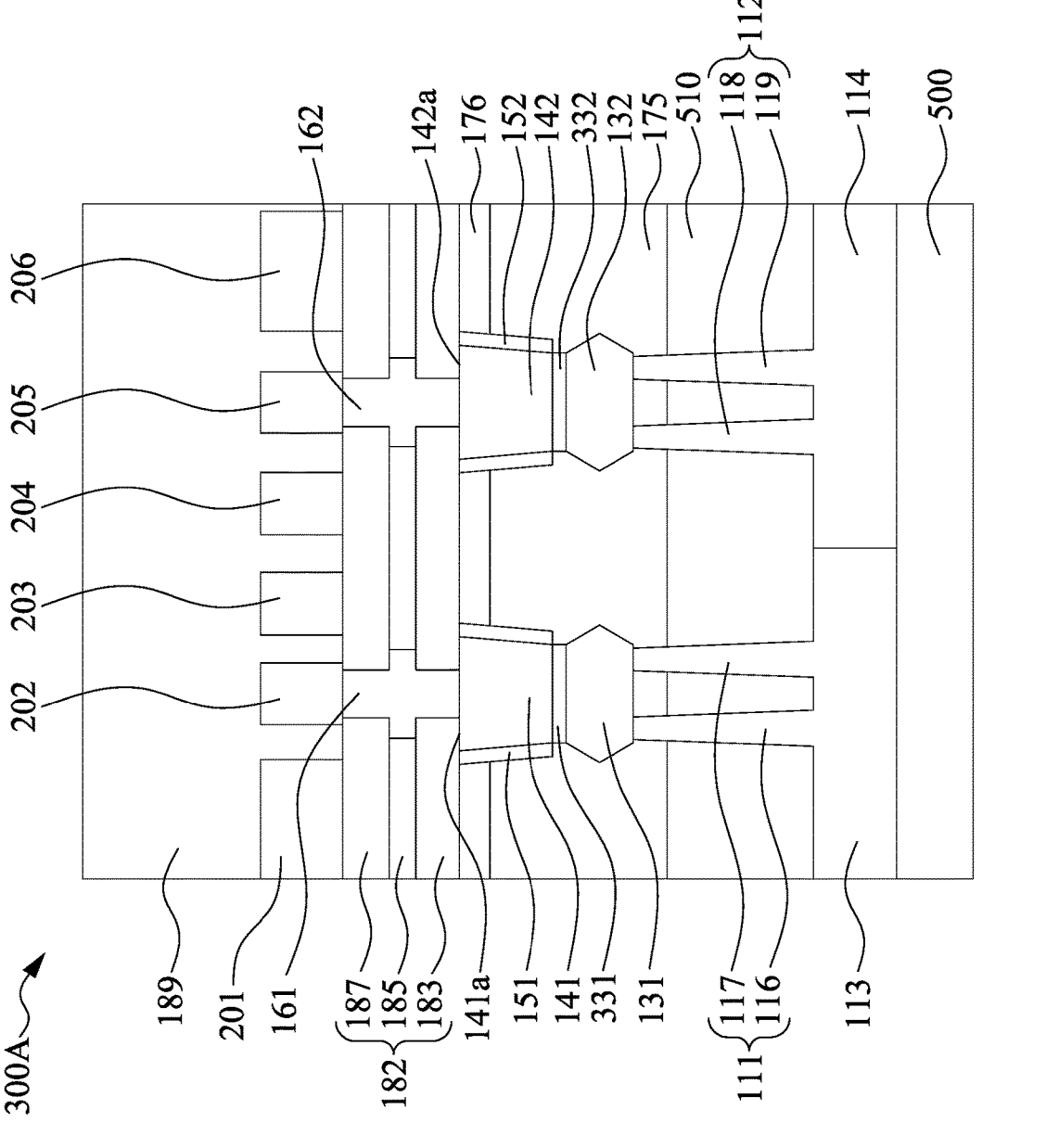

Reference is made to FIGS. 23 and 24. FIGS. 23 and 24 are exemplary cross-sectional views corresponding to the line A-A and the line B-B illustrated in FIG. 3 respectively at various stages of manufacturing another semiconductor device 300A according to some embodiments of the present disclosure. As shown in FIGS. 23 and 24, the structure and function of the components and their relationships in the semiconductor device 300A are substantially the same as the semiconductor device 100A shown in FIGS. 5A to 20B, and the related detailed descriptions may refer to the foregoing paragraphs, and are not described again herein.

It is noted that, the difference between the present embodiment and the embodiment in FIGS. 5A to 20B is in that the semiconductor device 300A further includes a hard mask layer 380 that is replaced the ILD layer 176 over the gate electrode 122, the gate dielectric layers 530, and the spacer 522. The hard mask layer 380 is in contact with top surfaces of the gate electrode 122, the gate dielectric layers 530, and the spacer 522, and further in contact with the source/drain contact barrier layers 151 and 153. In some embodiments, the hard mask layer 380 is adjacent to and between the source/drain contacts 141 and 143. In some embodiments, a top surface of the hard mask layer 380 is flush with the top surfaces of the source/drain contacts 141 and 143.

Specifically, a hard mask material is formed over the substrate 500 and covers the spacers 521, 522, and 523. One or more CMP processes are performed to polish back the hard mask material, such that the top surface of the ILD layer 176 is exposed. In some embodiments, the hard mask layer 380 may include high-k dielectric material. In some embodiments, the hard mask layer 380 may include silicon carbon nitride (SiCN), aluminum oxide (AlO), aluminum oxynitride (AlON), hafnium oxide (HfO), or zirconium (ZrO), Si$_3$N$_4$, or SiON, or HfO$_2$, or ZrO$_2$, Al$_2$O$_3$, TiO, TaO, other suitable materials, or combinations thereof. The hard mask layer 380 may include a material which is different from the spacers 521, 522, and 523 to achieve etching selectivity during etching processes.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the adhesion between the via structure and the dielectric layer can be enhanced. Another advantage is that the Rc/Rs of the via structure will be promoted. In some embodiments, the via structure has a lower via resistance than that with a barrier metal layers surrounding thereof. Yet another advantage is that the via structure will block chemical gas or acid, or solvent from the subsequent process to pass through thereof and damage elements underlying the via structure, and thus the reliability of the semiconductor device may be improved.

In some embodiments, a semiconductor device includes a semiconductor substrate, a metal layer, a dielectric layer, and a via. The metal layer is above the semiconductor substrate. The dielectric layer is between the metal layer and the semiconductor substrate. The via is embedded in the dielectric layer and includes a first portion and a second portion between the first portion and the semiconductor substrate. The first portion has a first width. The second portion has a second width greater than the first width.

In some embodiments, the first portion of the via is in contact with the dielectric layer.

In some embodiments, the second portion of the via is in contact with the dielectric layer.

In some embodiments, the via further comprises a third portion between the second portion and the semiconductor substrate and having a third width less than the second width of the second portion of the via.

In some embodiments, the dielectric layer comprising a first sublayer and second sublayer between the first sublayer and the semiconductor substrate. The first portion of the via is in the first sublayer, and the second portion of the via is in the second sublayer.

In some embodiments, the second sublayer is made of a material different from that of the first sub layer.

In some embodiments, a thickness of the second portion of the via is thinner than that of the first portion.

In some embodiments, a semiconductor device further includes an etch stop layer between the dielectric layer and the semiconductor substrate. The via passes through the etch stop layer.

In some embodiments, a semiconductor device further includes a source/drain contact on the semiconductor substrate and in contact with the via.

In some embodiments, a semiconductor device further includes a hard mask layer adjacent to the source/drain contact. A top surface of the hard mask layer is lower than a bottom of the via.

In some embodiments, a semiconductor device includes a semiconductor substrate, a first dielectric layer, a second dielectric layer, and a via. The first dielectric layer overlies the semiconductor substrate. The second dielectric layer is between the first dielectric layer and the semiconductor substrate. The via passes through the first and second dielectric layers and is in contact with a bottom surface and a sidewall of the first dielectric layer.

In some embodiments, the sidewall of the second dielectric layer is spaced apart from a sidewall of the first dielectric layer that is in contact with the via.

In some embodiments, a thickness of the second dielectric layer is thinner than that of the first dielectric layer.

In some embodiments, the second dielectric layer has a dielectric constant less than that of the first dielectric layer.

In some embodiments, a semiconductor device further includes a third dielectric layer between the second dielectric layer and the semiconductor substrate. The via passes through the third dielectric layer.

In some embodiments, the via is in contact with a top surface of the third dielectric layer.

In some embodiments, a method for manufacturing a semiconductor device includes forming a first dielectric layer on a semiconductor substrate; forming a second dielectric layer on the first dielectric layer; forming a second via hole through the second dielectric layer; forming a first via hole through the first dielectric layer and under the second via hole using an etch process, in which the etch process is performed such that a bottom surface of the second dielectric layer is exposed in the first via hole; and filling the first and second via holes with a conductive material.

In some embodiments, the forming the first via hole through the first dielectric layer includes etching a sidewall of the first dielectric layer to recess away from a sidewall of the second via hole.

In some embodiments, the forming the first and second via holes is performed such that an etching selectivity of the first dielectric layer is different from that of the second dielectric layer.

In some embodiments, the method further includes forming an etch stop layer between the first dielectric layer and the semiconductor substrate.

In some embodiments, a semiconductor device includes a substrate, a semiconductor fin, source region, a gate electrode, a source contact, and a source via. The semiconductor fin has a length extending above the substrate. The source region is on the semiconductor fin. The gate electrode has a length across the semiconductor fin. The source contact is above the source region. The source via lands on the source contact and has a first dimension along a lengthwise direction of the semiconductor fin and has a second dimension along a lengthwise direction of the gate electrode from a top view. A ratio of the second dimension to the first dimension of the source via is greater than about 2.

In some embodiments, the source via has an elliptical profile from the top view.

In some embodiments, the second dimension of the source via is parallel to a longest dimension of the source contact from the top view.

In some embodiments, the semiconductor device further includes a drain region on the first semiconductor fin and a drain contact above the drain region, wherein the second dimension of the source via is parallel to a longest dimension of the drain contact from the top view.

In some embodiments, the semiconductor device further includes a drain region on the first semiconductor fin and a drain contact above the drain region, wherein the drain contact has a third dimension along the lengthwise direction of the gate electrode and less than the second dimension of the source via.

In some embodiments, the semiconductor device further includes a drain region on the first semiconductor fin, a drain contact above the drain region, and a drain via landing on the drain contact, wherein the drain via has a third dimension along the lengthwise direction of the gate electrode and less than the second dimension of the source via.

In some embodiments, the semiconductor device further includes a drain region on the first semiconductor fin, a drain contact above the drain region, and a drain via landing on the drain contact, wherein a top surface of the source via has a greater area than a top surface of the drain via.

In some embodiments, the semiconductor device further includes a drain region on the first semiconductor fin and a drain contact above the drain region, wherein a top surface of the source contact has a greater area than a top surface of the drain contact.

In some embodiments, the semiconductor device further includes a drain region on the first semiconductor fin and a drain contact above the drain region and has a third dimension along the lengthwise direction of the gate electrode, wherein the source contact has a fourth dimension along the lengthwise direction of the gate electrode and greater than the third dimension of the drain contact.

In some embodiments, the semiconductor device further includes a second semiconductor fin having a length extending above the substrate, wherein the source contact is across the first and second semiconductor fins, and the second dimension of the source via is greater than a distance between the first and second semiconductor fins.

In some embodiments, a semiconductor device includes a substrate, a semiconductor fin, a source region, a gate electrode, a source contact, and a source via. The semiconductor fin extends upwardly from the substrate. The source region is on the semiconductor fin. The gate electrode extends across the semiconductor fin. The source contact is above the source region. The source via lands on the source contact and has an elliptical profile with a major axis parallel to a lengthwise direction of the gate electrode from a top view.

In some embodiments, the source via laterally extends beyond a longitudinal end of the gate electrode.

In some embodiments, the major axis of the elliptical profile of the source via is parallel to a longest dimension of the source contact from the top view.

In some embodiments, the semiconductor device further includes a drain region on the first semiconductor fin and a drain contact above the drain region, wherein the major axis of the elliptical profile of the source via is parallel to a longest dimension of the drain contact from the top view.

In some embodiments, the semiconductor device further includes a drain region on the first semiconductor fin and a drain contact above the drain region, wherein a top surface of the source contact has a greater area than a top surface of the drain contact.

In some embodiments, the semiconductor device further includes a metal line in contact with the source via, wherein the major axis of the elliptical profile of the source via is perpendicular to a longitudinal side of the metal line from the top view.

In some embodiments, a method for forming a semiconductor device includes: forming a source region and a drain region on a semiconductor fin that extends upwardly from a substrate; forming a gate electrode extending across the semiconductor fin and laterally between the source region and the drain region; forming a source contact and a drain contact above the source region and the drain region, respectively; forming a source via and a drain via landing on the source contact and the drain contact, respectively; and forming a metal line in contact with the drain via and extending along a lengthwise direction of the semiconductor fin, wherein a greatest dimension of the source via is greater than a width of the metal line that is in contact with the drain via.

In some embodiments, the source via has a first dimension along a lengthwise direction of the semiconductor fin and a second dimension along a lengthwise direction of the gate electrode from a top view, and a ratio of the second dimension to the first dimension of the source via is greater than about 2.

In some embodiments, a longest dimension of the source via is parallel to a longest dimension of the source contact from the top view.

In some embodiments, the source via laterally extends beyond a longitudinal end of the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a semiconductor channel region;
source/drain regions at opposite sides of the semiconductor channel region;
a source/drain contact over one of the source/drain regions;
a first dielectric layer over the source/drain contact;
a second dielectric layer over the first dielectric layer; and a tungsten via extending through the first and second dielectric layers to the source/drain contact, the tungsten via comprising a first portion over the source/drain contact and a second portion over the first portion, wherein the first portion has a first width along a first direction and a second width along a second direction different from the first direction, the second portion has a third width along the first direction and a fourth width along the second direction, the third width is greater than the first width, and the fourth width is greater than the second width, wherein the second portion comprises a tungsten sidewall laterally offset from a tungsten sidewall of the first portion, and wherein the second portion comprises a bottom surface covering a portion of a top surface of the first dielectric layer.

2. The device of claim 1, further comprising:
a third dielectric layer over the second dielectric layer, wherein the tungsten via further extends through the third dielectric layer, and the second portion of the tungsten via further comprises a top surface covering a portion of a bottom surface of the third dielectric layer.

3. The device of claim 1, wherein the tungsten via further comprises a third portion over the second portion, and the tungsten sidewall of the second portion is laterally offset from a tungsten sidewall of the third portion.

4. The device of claim 3, wherein the second portion is a widest portion among the first, second, and third portions of the tungsten via.

5. The device of claim 1, wherein the tungsten via has a circular profile from a top view.

6. The device of claim 5, wherein from the top view, the circular profile of the tungsten via has a diameter less than a length of the source/drain contact.

7. The device of claim 1, wherein the semiconductor channel region is in a protrusion protruding from a substrate.

8. The device of claim 1, wherein the source/drain regions are epitaxial regions.

9. The device of claim 1, further comprising:
a gate electrode between the source/drain regions, the gate electrode having a top surface lower than a bottom surface of the tungsten via.

10. A device, comprising:
a semiconductor fin extending from a substrate;
source and drain regions on the semiconductor fin;
a contact over one of the source and drain regions;
a first dielectric layer over the contact;
a second dielectric layer over the first dielectric layer; and
an integral ruthenium via extending through the first and second dielectric layers to the contact, the ruthenium via comprising a first non-linear sidewall profile comprising a first ruthenium sidewall interfacing the first dielectric layer, a second ruthenium sidewall interfacing the second dielectric layer, and a horizontal surface extending from the first ruthenium sidewall to the second ruthenium, wherein the second ruthenium sidewall is misaligned with the first ruthenium sidewall, wherein, in a cross-sectional view, a shape of the integral ruthenium via resembles a cross.

11. The device of claim 10, wherein the first non-linear sidewall profile further comprises a third ruthenium sidewall over the second ruthenium sidewall, and the third ruthenium sidewall is misaligned with the second ruthenium sidewall.

12. The device of claim 10, wherein the ruthenium via further comprises a second non-linear sidewall profile opposite the first non-linear sidewall profile, the second non-linear sidewall profile comprises a fourth ruthenium sidewall interfacing the first dielectric layer, and a fifth ruthenium sidewall interfacing the second dielectric layer, wherein the fifth ruthenium sidewall is misaligned with the fourth ruthenium sidewall.

13. The device of claim 12, wherein a width between the first ruthenium sidewall and the fourth ruthenium sidewall is less than a width between the second ruthenium sidewall and the fifth ruthenium sidewall.

14. The device of claim 12, further comprising:
a third dielectric layer over the second dielectric layer,
wherein the first non-linear sidewall profile further comprises a third ruthenium sidewall interfacing the third dielectric layer, and the second non-linear sidewall profile further comprises a sixth ruthenium sidewall interfacing the third dielectric layer,
wherein a width between the third ruthenium sidewall and the sixth ruthenium sidewall is less than a width between the second ruthenium sidewall and the fifth ruthenium sidewall.

15. The device of claim 14, wherein the width between the second ruthenium sidewall and the fifth ruthenium sidewall is a maximal width of the ruthenium via.

16. The device of claim 14, wherein the first and third dielectric layers are formed of a first dielectric material, and the second dielectric layer is formed of a second dielectric material different from the first dielectric material.

17. A device, comprising:
a channel region of a transistor;
source and drain regions of the transistor at opposite sides of the channel region of the transistor;
a contact over one of the source and drain regions of the transistor;
a first dielectric layer over the contact;
a second dielectric layer over the first dielectric layer; and
a barrierless and integral via over the contact, an entirety of the via being formed of a same metal material, wherein the via comprises a first portion and a second portion over the first portion, a thickness of the first portion is substantially equal to a thickness of the first dielectric layer, and a thickness of the second portion is substantially equal to a thickness of the second dielectric layer, and wherein a width of the second portion is less than a width of the first portion.

18. The device of claim 17, wherein the via further comprises a third portion disposed under the first dielectric layer.

19. The device of claim 17, wherein the first portion contacts the first dielectric layer at a first interface, the second portion contacts the second dielectric layer at a second interface, the first and second interfaces extend vertically.

20. The device of claim 18, wherein the width of the first portion is greater than a width of the third portion.

* * * * *